US012796181B2

(12) United States Patent
Akimoto

(10) Patent No.: US 12,796,181 B2
(45) Date of Patent: Nov. 10, 2026

(54) IMAGE DISPLAY DEVICE AND METHOD FOR MANUFACTURING IMAGE DISPLAY DEVICE

(71) Applicant: NICHIA CORPORATION, Anan (JP)

(72) Inventor: Hajime Akimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 414 days.

(21) Appl. No.: 18/471,933

(22) Filed: Sep. 21, 2023

(65) Prior Publication Data

US 2024/0014354 A1 Jan. 11, 2024

Related U.S. Application Data

(63) Continuation of application No. PCT/JP2022/010914, filed on Mar. 11, 2022.

(30) Foreign Application Priority Data

Mar. 29, 2021 (JP) ................................ 2021-055840

(51) Int. Cl.
*H10H 20/84* (2025.01)
*H10H 20/01* (2025.01)
(Continued)

(52) U.S. Cl.
CPC ............ *H10H 20/84* (2025.01); *H10H 20/01* (2025.01); *H10H 20/01335* (2025.01);
(Continued)

(58) Field of Classification Search
CPC .. H10H 20/84; H10H 20/01; H10H 20/01335; H10H 20/82; H10H 20/825;
(Continued)

(56) References Cited

U.S. PATENT DOCUMENTS 5,838,707 A 11/1998 Ramdani et al.
10,386,574 B2 * 8/2019 Wang .................. G02B 6/1223
(Continued)

FOREIGN PATENT DOCUMENTS

CN 110010636 A 7/2019
CN 110459557 A 11/2019
(Continued)

OTHER PUBLICATIONS

Hyeryun Kim et al., "Fabrication of full-color GaN-based light-emitting diodes on nearly lattice-matched flexible metal foils", Scientific Reports, 7:2112, May 18, 2017.
(Continued)

*Primary Examiner* — Benjamin Tzu-Hung Liu
(74) *Attorney, Agent, or Firm* — Foley & Lardner LLP

(57) ABSTRACT

A method for manufacturing an image display device includes: forming, on a substrate, a layer including a first part made of a single-crystal metal; forming a semiconductor layer on the first part, the semiconductor layer including a light-emitting layer; forming a light-emitting element including: a light-emitting surface on the first part, and an upper surface opposite the light-emitting surface; forming a first insulating film that covers the substrate, the layer that comprises the first part, and the light-emitting element; forming a circuit element on the first insulating film; forming a light-shielding member between the circuit element and the light-emitting element; forming a second insulating film covering the first insulating film and the circuit element; forming a first via extending through the first and second insulating films; forming a wiring layer on the second insulating film; removing the substrate; and removing a portion of the first part on the light-emitting surface.

9 Claims, 29 Drawing Sheets

(51) Int. Cl.

| | |
|---|---|
| ***H10H 20/82*** | (2025.01) |
| ***H10H 20/825*** | (2025.01) |
| ***H10H 20/851*** | (2025.01) |
| ***H10H 20/857*** | (2025.01) |
| ***H10W 90/00*** | (2026.01) |

(52) U.S. Cl.

CPC .......... *H10H 20/82* (2025.01); *H10H 20/825* (2025.01); *H10H 20/851* (2025.01); *H10H 20/857* (2025.01); *H10W 90/00* (2026.01); *H10H 20/034* (2025.01); *H10H 20/0361* (2025.01); *H10H 20/0364* (2025.01)

(58) Field of Classification Search

CPC .. H10H 20/851; H10H 20/857; H10H 20/034; H10H 20/0361; H10H 20/0364; H01L 25/0753; H01L 25/167; H10W 90/00

See application file for complete search history.

(56) References Cited

U.S. PATENT DOCUMENTS

| | | | | |
|---|---|---|---|---|
| 2003/0039866 | A1 | 2/2003 | Mitamura | |
| 2011/0254135 | A1 | 10/2011 | Toba et al. | |
| 2011/0290378 | A1 | 12/2011 | Okayama et al. | |
| 2012/0222732 | A1 | 9/2012 | Choi | |
| 2018/0294311 | A1 | 10/2018 | Hsiang et al. | |
| 2018/0351035 | A1 | 12/2018 | Chung et al. | |
| 2019/0131343 | A1 | 5/2019 | Templier et al. | |
| 2019/0229097 | A1* | 7/2019 | Takeya ................. | H10H 20/018 |
| 2019/0267357 | A1 | 8/2019 | Iguchi et al. | |
| 2019/0273179 | A1 | 9/2019 | Iguchi et al. | |
| 2019/0355766 | A1 | 11/2019 | Zhang et al. | |
| 2020/0328079 | A1 | 10/2020 | Zhao et al. | |
| 2021/0091279 | A1* | 3/2021 | Kong ..................... | H10H 29/10 |
| 2022/0059518 | A1 | 2/2022 | Akimoto | |

FOREIGN PATENT DOCUMENTS

| | | | |
|---|---|---|---|
| JP | H10-215026 | A | 8/1998 |
| JP | 2001-035805 | A | 2/2001 |
| JP | 2002-141492 | A | 5/2002 |
| JP | 2008-021745 | A | 1/2008 |
| JP | 2008-078274 | A | 4/2008 |
| JP | 2010-171420 | A | 8/2010 |
| JP | 2014-135433 | A | 7/2014 |
| JP | 2018-205741 | A | 12/2018 |
| JP | 2019-522894 | A | 8/2019 |
| JP | 2019-152851 | A | 9/2019 |
| JP | 2019-153783 | A | 9/2019 |
| JP | WO2019168187 | * | 9/2019 |
| JP | 2020-507107 | A | 3/2020 |
| WO | WO-2006/111804 | A1 | 10/2006 |
| WO | WO-2010/055613 | A1 | 5/2010 |
| WO | WO-2019/168187 | A1 | 9/2019 |
| WO | WO-2020/226044 | A1 | 11/2020 |

OTHER PUBLICATIONS

Jeong Woo Shon et al., "Fabrication of full-color InGaN-based light-emitting diodes on amorphous substrates by pulsed sputtering", Scientific Reports, 4:5325, Jun. 23, 2014.

International Search Report with English language translation and Written Opinion of the International Searching Authority issued in the corresponding International Patent Application No. PCT/JP2022/010914, dated May 31, 2022.

* cited by examiner

IMAGE DISPLAY DEVICE AND METHOD FOR MANUFACTURING IMAGE DISPLAY DEVICE

CROSS-REFERENCE TO RELATED APPLICATIONS

The present application is a bypass continuation of PCT Application No. PCT/JP2022/010914, filed Mar. 11, 2022, which claims priority to Japanese Application No. 2021-055840, filed Mar. 29, 2021. The contents of these applications are hereby incorporated by reference in their entireties.

BACKGROUND

Embodiments of the invention relate to a method for manufacturing an image display device and an image display device.

It is desirable to realize an image display device that is thin and has high luminance, a wide viewing angle, high contrast, and low power consumption. To satisfy such market needs, a display device that utilizes a self-luminous element is being developed.

There are expectations for the advent of a display device that uses a micro LED that is a fine light-emitting element as a self-luminous element. A method has been introduced as a method for manufacturing a display device that uses a micro LED in which individually-formed micro LEDs are sequentially transferred to a drive circuit. However, as the number of elements of micro LEDs increases with higher image quality such as full high definition, 4K, 8K, etc., if many micro LEDs are individually formed and sequentially transferred to a substrate in which a drive circuit and the like are formed, an enormous amount of time is necessary for the transfer process. Also, there is a risk that connection defects between the micro LEDs, the drive circuits, etc., may occur, and a reduction of the yield may occur.

In known technology, a semiconductor layer that includes a light-emitting layer is grown on a Si substrate; an electrode is formed at the semiconductor layer; subsequently, bonding is performed to a circuit board in which a drive circuit is formed (e.g., see Japanese Patent Publication No. 2002-141492).

SUMMARY

An embodiment of the invention provides a method for manufacturing an image display device and an image display device in which a transfer process of a light-emitting element is shortened, and the yield is increased.

A method for manufacturing an image display device according to an embodiment of the invention includes a process of forming a layer including a first part of a single-crystal metal on a substrate, a process of forming a semiconductor layer including a light-emitting layer on the first part, a process of forming a light-emitting element that includes a light-emitting surface on the first part and an upper surface at a side opposite to the light-emitting surface by patterning the semiconductor layer, a process of forming a first insulating film covering the substrate, the layer including the first part, and the light-emitting element, a process of forming a circuit element on the first insulating film, a process of forming a light-shielding member between the circuit element and the light-emitting element, a process of forming a second insulating film covering the first insulating film and the circuit element, a process of forming a first via extending through the first and second insulating films, a process of forming a wiring layer on the second insulating film, a process of removing the substrate, and a process of removing at least a portion of the first part on the light-emitting surface. The first via is located between the wiring layer and the upper surface and electrically connects the wiring layer and the upper surface.

An image display device according to an embodiment of the invention includes a light-emitting element including a light-emitting surface and an upper surface at a side opposite to the light-emitting surface, a first insulating film covering the light-emitting element so that the light-emitting surface is exposed, a circuit element located on the first insulating film, a light-shielding member located between the circuit element and the upper surface, a second insulating film covering the first insulating film and the circuit element, a first via extending through the first and second insulating films, and a wiring layer located on the second insulating film. The first via is located between the wiring layer and the upper surface and electrically connects the wiring layer and the upper surface. The first insulating film includes a first surface at the light-emitting surface side. The light-emitting surface is recessed further than the first surface.

An image display device according to an embodiment of the invention includes a first semiconductor layer including a light-emitting surface in which multiple light-emitting regions can be formed, multiple light-emitting layers provided to be separated from each other on the first semiconductor layer, multiple second semiconductor layers that are located respectively on the multiple light-emitting layers, are of a different conductivity type from the first semiconductor layer, and respectively include multiple upper surfaces at a side opposite to a surface at which the multiple light-emitting layers are located, a first insulating film covering the first semiconductor layer, the multiple light-emitting layers, and the multiple second semiconductor layers so that the light-emitting surface is exposed, multiple transistors provided to be separated from each other on the first insulating film, a light-shielding member located between the multiple transistors and the multiple upper surfaces, a second insulating film covering the first insulating film and the multiple transistors, multiple first vias extending through the first and second insulating films, and a wiring layer located on the second insulating film. The multiple second semiconductor layers are separated by the first insulating film. The multiple light-emitting layers are separated by the first insulating film. The multiple first vias are located respectively between the wiring layer and the multiple upper surfaces and electrically connect the wiring layer and the multiple upper surfaces respectively. The first insulating film includes a first surface at the light-emitting surface side. The light-emitting surface is recessed further than the first surface.

An image display device according to an embodiment of the invention includes multiple light-emitting elements that each include a light-emitting surface and an upper surface at a side opposite to the light-emitting surface, a first insulating film covering the multiple light-emitting elements so that the light-emitting surfaces are exposed, a circuit element located on the first insulating film, a light-shielding member located between the circuit element and the upper surface, a second insulating film covering the first insulating film and the circuit element, multiple first vias extending through the first and second insulating films, and a wiring layer located on the second insulating film. The multiple first vias are located between the wiring layer and the multiple upper surfaces and electrically connect the wiring layer and the multiple upper surfaces respectively. The first insulating film includes a first surface at the multiple light-emitting-surface side. The multiple light-emitting surfaces are recessed further than the first surface.

According to certain embodiments of the invention, a method for manufacturing an image display device is realized in which a transfer process of a light-emitting element is shortened, and the yield is increased.

According to certain embodiments of the invention, a high-definition image display device is realized in which a light-emitting element can be reduced in size.

DETAILED DESCRIPTION

Figure 1:
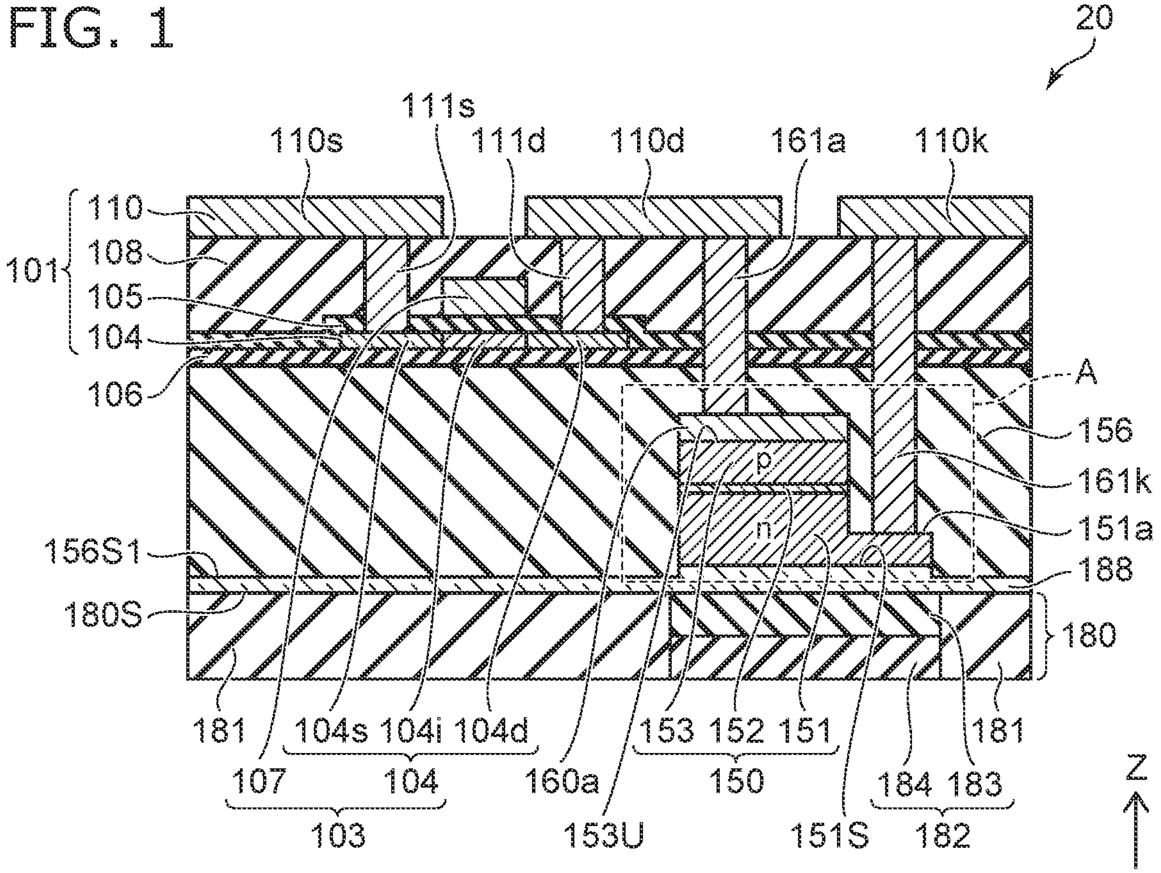
FIG. 1 is a schematic cross-sectional view illustrating a portion of an image display device according to a first embodiment.

Embodiments of the invention will now be described with reference to the drawings.

The drawings are schematic or conceptual, and the relationships between the thickness and width of portions, the proportions of sizes among portions, etc., are not necessarily the same as the actual values. Also, the dimensions and proportions may be illustrated differently among drawings, even when the same portion is illustrated.

In the specification and drawings, components similar to those described previously or illustrated in an antecedent drawing are marked with the same reference numerals, and a detailed description is omitted as appropriate.

First Embodiment

FIG. 1 is a schematic cross-sectional view illustrating a portion of an image display device according to the embodiment.

FIG. 1 schematically shows the configuration of a subpixel 20 of the image display device of the embodiment.

Figure 12:
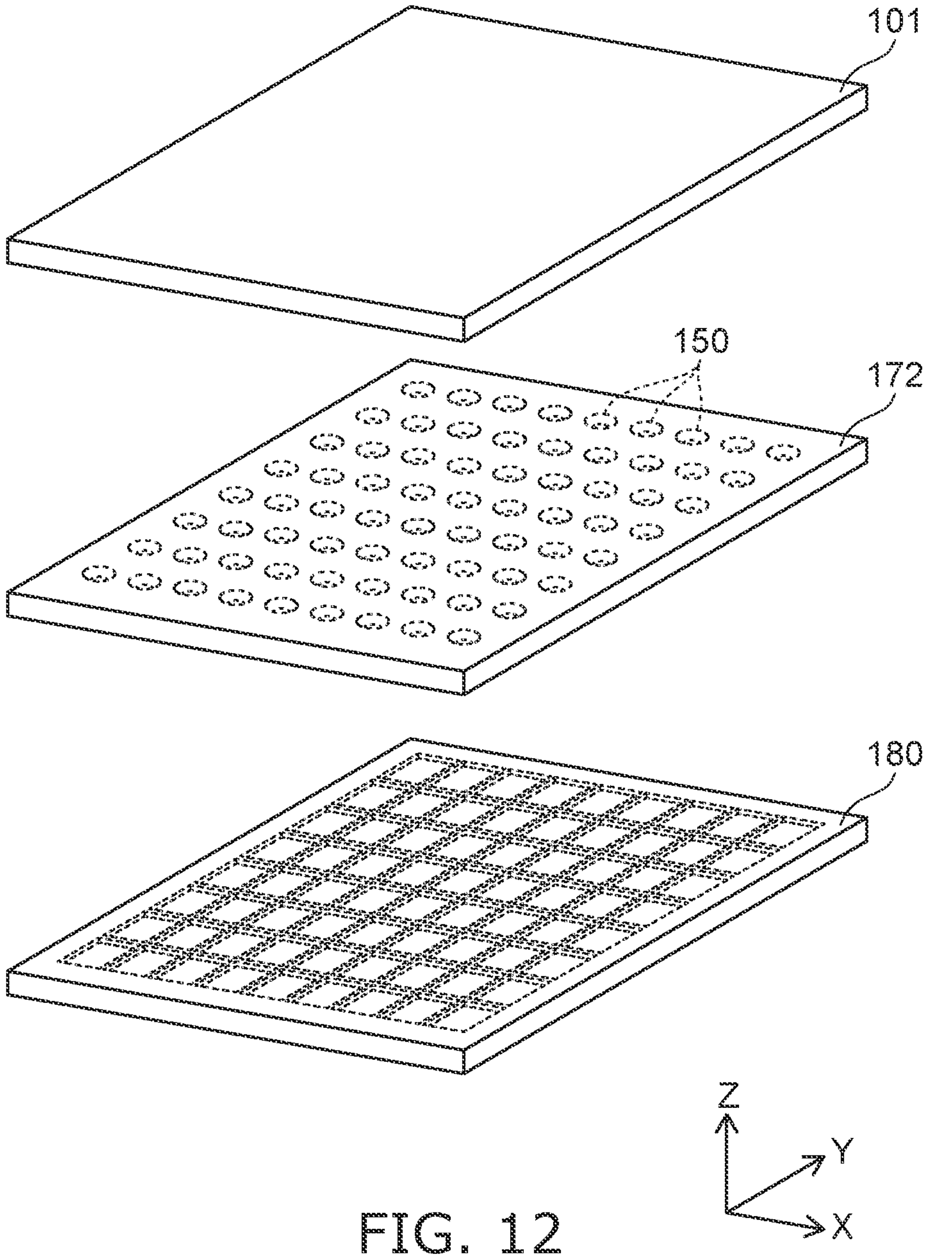
FIG. 12 is a schematic perspective view illustrating the image display device according to the first embodiment.
Figure 13:
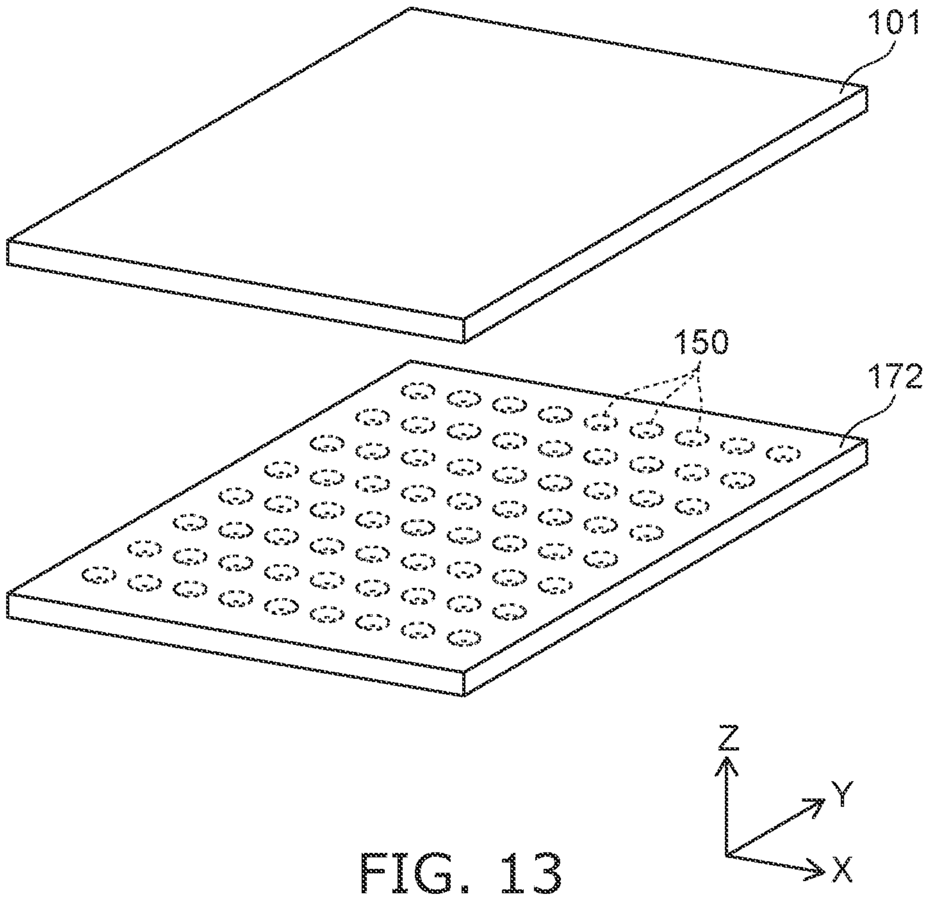
FIG. 13 is a schematic perspective view illustrating the image display device according to the first embodiment.

An XYZ three-dimensional coordinate system may be used in the following description. Light-emitting elements 150 are arranged in a two-dimensional planar configuration as shown in FIGS. 12 and 13 below. The light-emitting element 150 is provided for each subpixel 20. The two-dimensional plane in which the subpixels 20 are arranged is taken as an XY plane. The subpixels 20 are arranged along an X-axis direction and a Y-axis direction. FIG. 1 is an auxiliary cross section along line BB' of FIG. 4 below, and is a cross-sectional view in which cross sections of multiple planes perpendicular to the XY plane are joined in one plane. In FIG. 1, and in other drawings as well, in a cross-sectional view of multiple planes perpendicular to the XY plane, the X-axis and the Y-axis are not illustrated, and the Z-axis perpendicular to the XY plane is shown. That is, in these drawings, the plane perpendicular to the Z-axis is the XY plane.

Although the positive direction of the Z-axis is called “up” or “above” and the negative direction of the Z-axis is called “down” or “below” hereinbelow, the directions along the Z-axis are not always limited to directions in which gravity acts. A length in a direction along the Z-axis may be called a height.

The subpixel 20 includes a light-emitting surface 151S that is substantially parallel to the XY plane. The light-emitting surface 151S is a surface that radiates light mainly in the negative direction of the Z-axis orthogonal to the XY plane. According to the embodiment, its modifications, and all of the embodiments and their modifications described below, the light-emitting surface radiates light mainly in the negative direction of the Z-axis.

As shown in FIG. 1, the subpixel 20 of the image display device includes the light-emitting element 150, a light-shielding electrode (a light-shielding member) 160*a*, a first inter-layer insulating film 156, a transistor (a circuit element) 103, a second inter-layer insulating film 108, a via (a first via) 161*a*, and a wiring layer 110. The subpixel 20 further includes a color filter (a wavelength conversion member) 180.

According to the embodiment, the light-emitting element 150 is located on the color filter 180. The first inter-layer insulating film 156 also is located on the color filter 180. The surface of the light-emitting element 150 on the color filter 180 is the light-emitting surface 151S. The surface of the first inter-layer insulating film 156 on the color filter 180 is a first surface 15651. The light-emitting surface 151S and the first surface 15651 are connected to the color filter 180 via a transparent resin layer 188. The transparent resin layer 188 is provided to planarize the light-emitting surface 151S and the first surface 156S1 and to connect the color filter 180. The light-emitting element 150 radiates light via the light-emitting surface 151S, the transparent resin layer 188, and the color filter 180.

The light-emitting element 150 is driven by the transistor 103 located on the first inter-layer insulating film 156. The transistor 103 is a thin film transistor (TFT).

The configuration of the subpixel 20 will now be described in detail.

The color filter 180 includes a light-shielding part 181 and a color conversion part 182. The color conversion part 182 is provided to correspond to the shape of the light-emitting surface 151S directly under the light-emitting surface 1515 of the light-emitting element 150. The part of the color filter 180 other than the color conversion part 182 is used as the light-shielding part 181. The light-shielding part 181 is a so-called black matrix that reduces blur due to color mixing of the light emitted from the adjacent color conversion parts 182, etc., and makes it possible to display a sharp image.

The color conversion part 182 has one, two, or more layers. FIG. 1 shows a case where the color conversion part 182 has two layers. Whether the color conversion part 182 has one layer or two layers is determined by the color, i.e., the wavelength, of the light emitted by the subpixel 20. When the light emission color of the subpixel 20 is red, it is favorable for the color conversion part 182 to have the two layers of a color conversion layer 183 and a filter layer 184 that transmits red light. When the light emission color of the subpixel 20 is green, it is favorable for the color conversion part 182 to have the two layers of the color conversion layer 183 and the filter layer 184 that transmits green light. When the light emission color of the subpixel 20 is blue, it is favorable to use one layer.

When the color conversion part 182 has two layers, one layer is the color conversion layer 183, and the other layer is the filter layer 184. The color conversion layer 183 is stacked on the filter layer 184, and the color conversion layer 183 is located at a position more proximate to the light-emitting element 150 than the filter layer 184.

The color conversion layer 183 converts the wavelength of the light emitted by the light-emitting element 150 into the desired wavelength. When the subpixel 20 emits red, for example, the light of the wavelength of the light-emitting element 150, i.e., 467 nm±30 nm, is converted into light of a wavelength of about 630 nm±20 nm. When of the subpixel 20 emits green, for example, the light of the wavelength of the light-emitting element 150, i.e., 467 nm±30 nm, is converted into light of a wavelength of about 532 nm±20 nm.

The filter layer 184 shields the wavelength component of the blue light emission that remains without undergoing color conversion by the color conversion layer 183.

When the color of the light emitted by the subpixel 20 is blue, the light may be output via the color conversion layer 183 or may be output as-is without passing through the color conversion layer 183. When the wavelength of the light emitted by the light-emitting element 150 is about 467 nm±30 nm, the light may be output without passing through the color conversion layer 183. When the wavelength of the light emitted by the light-emitting element 150 is 410 nm±30 nm, it is favorable to provide the color conversion layer 183 to convert the wavelength of the output light into about 467 nm±30 nm.

The subpixel 20 may include the filter layer 184 even when the subpixel 20 is blue. By providing the filter layer 184 through which blue light passes in the blue subpixel 20, the occurrence of a micro external light reflection other than blue light at the surface of the light-emitting element 150 is suppressed.

The color filter 180 includes a connection surface 180S. The transparent resin layer 188 is located on the connection surface 180S. The light-emitting element 150 and the first inter-layer insulating film 156 are located on the connection surface 180S with the transparent resin layer 188 interposed.

The light-emitting element 150 includes the light-emitting surface 151S located on the connection surface 180S. The light-emitting element 150 includes an upper surface 153U located at the side opposite to the light-emitting surface 151S. In the example, the outer perimeter shapes of the light-emitting surface 151S and the upper surface 153U are quadrangular or rectangular when projected onto the XY plane, and the light-emitting element 150 is a prismatic element that includes the light-emitting surface 151S on the connection surface 180S. The cross section of the prism may be a polygon having five or more sides. The light-emitting element 150 is not limited to a prismatic element and may be a cylindrical element.

The light-emitting element 150 includes an n-type semiconductor layer 151, a light-emitting layer 152, and a p-type semiconductor layer 153. The n-type semiconductor layer 151, the light-emitting layer 152, and the p-type semiconductor layer 153 are stacked in this order from the light-emitting surface 151S toward the upper surface 153U. The light-emitting surface 151S, i.e., the n-type semiconductor layer 151, is located on the connection surface 180S. Accordingly, the light-emitting element 150 radiates light in the negative direction of the Z-axis via the transparent resin layer 188 and the color conversion part 182 of the color filter 180.

The n-type semiconductor layer 151 includes a connection part 151*a*. The connection part 151*a* is provided to protrude in one direction from the n-type semiconductor layer 151 over the connection surface 180S. The height of the connection part 151*a* from the light-emitting surface 151S is the same as the height from the light-emitting surface 151S to the n-type semiconductor layer 151 or less than the height from the light-emitting surface 151S to the n-type semiconductor layer 151. The n-type semiconductor layer 151 includes the connection part 151*a*, and the connection part 151*a* is a portion of the n-type semiconductor layer 151. The connection part 151*a* is connected to one end of a via 161*k*, and the n-type semiconductor layer 151 is electrically connected to the via 161*k* by the connection part 151*a*.

When the light-emitting element 150 is prismatic, the shape of the light-emitting element 150 when projected onto the XY plane is, for example, substantially square or rectangular. When the shape of the light-emitting element 150 when projected onto the XY plane is polygonal including quadrangular, the corner portions of the light-emitting element 150 may be rounded. When the shape of the light-emitting element 150 when projected onto the XY plane is cylindrical, the shape of the light-emitting element 150 when projected onto the XY plane is not limited to circular and may be, for example, elliptical. The degree of freedom of the wiring layout and the like is increased by appropriately selecting the shape, arrangement, etc., of the light-emitting element when viewed in plan.

For example, the light-emitting element 150 favorably includes a gallium nitride compound semiconductor including a light-emitting layer of $In_XAl_YGa_{1-X-Y}N$ ($0 \leq X$, $0 \leq Y$, and $X+Y<1$), etc. Hereinbelow, the gallium nitride compound semiconductor described above may be called simply gallium nitride (GaN). According to an embodiment of the invention, the light-emitting element 150 is a so-called light-emitting diode. It is sufficient for the wavelength of the light emitted by the light-emitting element 150 to be in the range from the near-ultraviolet region to the visible region, e.g., about 467 nm±30 nm. The wavelength of the light emitted by the light-emitting element 150 may be a bluish-violet light emission of about 410 nm±30 nm. The wavelength of the light emitted by the light-emitting element 150 is not limited to these values and can be set as appropriate.

The light-shielding electrode 160*a* is provided over the upper surface 153U. The light-shielding electrode 160*a* is located between the upper surface 153U and the via 161*a* and electrically connects the upper surface 153U to one end of the via 161*a*. The light-shielding electrode 160*a* is formed of a light-shielding conductive material and is formed thick enough to be light-shielding. The light-shielding electrode 160*a* realizes an ohmic connection with the p-type semiconductor layer 153 and shields the upward radiated light and scattered light of the light-emitting element 150. The light-shielding electrode 160*a* suppresses the light reaching the circuit elements including the transistor 103 located higher than the light-emitting element 150 and prevents malfunction of the circuit elements.

The first inter-layer insulating film (a first insulating film) 156 is located on the transparent resin layer 188 at the first surface 156S1. The first inter-layer insulating film 156 is located on the connection surface 180S of the color filter 180 with the transparent resin layer 188 interposed. The first surface 156S1 of the first inter-layer insulating film 156 is connected to the transparent resin layer 188.

The first inter-layer insulating film (the first insulating film) 156 covers the light-shielding electrode 160*a* and the side surface of the light-emitting element 150. The first inter-layer insulating film 156 electrically isolates the light-emitting elements 150 located adjacent to each other. The first inter-layer insulating film 156 also electrically isolates the light-shielding electrodes 160*a* located in the electrically-separated light-emitting elements 150. The first inter-layer insulating film 156 electrically isolates the light-emitting element 150 and the light-shielding electrode 160*a* from the circuit elements such as the transistor 103, etc. The first inter-layer insulating film 156 provides a flat surface for forming a circuit 101 including the circuit elements such as the transistor 103, etc. By covering the light-emitting element 150, the first inter-layer insulating film 156 protects the light-emitting element 150 from thermal stress when forming the transistor 103, etc.

The first inter-layer insulating film 156 is formed of an organic insulating material. It is favorable for the organic insulating material included in the first inter-layer insulating film 156 to be light-reflective and to be a white resin. By using a white resin as the first inter-layer insulating film 156, the light emitted by the light-emitting element 150 in the lateral direction and returning light caused by the interface between the light-emitting surface 151S and a substrate 102, etc., can be reflected. Therefore, the luminous efficiency of the light-emitting element 150 is substantially improved.

The white resin is formed by dispersing fine scattering particles having a Mie scattering effect in a silicon resin such as SOG (Spin On Glass) or the like, a transparent resin such as a novolak phenolic resin, etc. The fine scattering particles are colorless or white and have a diameter of about 1/10 to about several times the wavelength of the light emitted by the light-emitting element 150. The fine scattering particles that are favorably used have a diameter of about ½ of the light wavelength. For example, $TiO_2$, $Al_2O_3$, ZnO, etc., are examples of such a fine scattering particle.

The white resin also can be formed by utilizing many fine voids or the like dispersed in a transparent resin. When whitening the first inter-layer insulating film 156, for example, a $SiO_2$ film or the like that is formed by ALD (Atomic-Layer-Deposition) or CVD may be used by overlaying with SOG, etc.

The first inter-layer insulating film 156 may be a black resin. By using a black resin as the first inter-layer insulating film 156, the scattering of the light inside the subpixel 20 is suppressed, and stray light is more effectively suppressed. An image display device in which stray light is suppressed can display a sharper image.

A TFT underlying film 106 is formed over the first inter-layer insulating film 156. The TFT underlying film 106 is provided to ensure the flatness when forming the transistor 103, and to protect the TFT channel 104 of the transistor 103 from contamination, etc., in the heat processing. The TFT underlying film 106 is, for example, an insulating film of $SiO_2$, etc.

The transistor 103 is formed on the TFT underlying film 106. In addition to the transistor 103, other circuit elements such as transistors, capacitors, etc., are formed on the TFT underlying film 106, and the circuit 101 is configured using wiring parts, etc. For example, in FIG. 3 below, the transistor 103 corresponds to a drive transistor 26. Also, a select transistor 24, a capacitor 28, etc., are circuit elements in FIG. 3. In the description, the circuit 101 includes the TFT channel 104, an insulating layer 105, the second inter-layer insulating film 108, vias 111*s* and 111*d*, and the first wiring layer 110.

In the example, the transistor 103 is a p-channel TFT. The transistor 103 includes the TFT channel 104 and a gate 107. The TFT channel 104 is favorably formed by a low-temperature polysilicon (LTPS) process. In the LTPS process, the TFT channel 104 is formed by polycrystallizing and activating a region of amorphous Si formed on the TFT underlying film 106. For example, laser annealing with a laser is used to polycrystallize and activate the amorphous Si region. The TFT that is formed by the LTPS process has sufficiently high mobility.

The TFT channel 104 includes regions 104*s*, 104*i*, and 104*d*. The regions 104*s*, 104*i*, and 104*d* each are located on the TFT underlying film 106. The region 104*i* is located between the region 104*s* and the region 104*d*. The regions 104*s* and 104*d* include an impurity such as boron (B), boron fluoride (BF), or the like to form p-type semiconductor regions. The region 104*s* has an ohmic connection with the via 111*s*, and the region 104*d* has an ohmic connection with the via 111*d*.

The gate 107 is located on the TFT channel 104 with the insulating layer 105 interposed. The insulating layer 105 is provided to insulate the TFT channel 104 and the gate 107 and insulate from other adjacent circuit elements. A channel is formed in the region 104*i* when a lower potential than that of the region 104*s* is applied to the gate 107. The current that flows between the regions 104*s* and 104*d* can be controlled by controlling the channel formed in the region 104*i* by the potential of the gate 107.

The insulating layer 105 is, for example, $SiO_2$. The insulating layer 105 may be a multilevel insulating layer that includes $SiO_2$, $Si_3N_4$, etc.

For example, the gate 107 may be formed of polycrystalline Si or may be formed of a refractory metal such as W, Mo, etc. For example, the gate 107 is formed by CVD or the like when the gate 107 is formed of a polycrystalline Si film.

The second inter-layer insulating film 108 is located on the gate 107 and the insulating layer 105. For example, the second inter-layer insulating film 108 is formed of the same material as the first inter-layer insulating film 156. That is, the second inter-layer insulating film 108 is formed of a white resin, an inorganic film of $SiO_2$, etc. The second inter-layer insulating film 108 also functions as a planarization film for forming the wiring layer 110.

The vias 111*s* and 111*d* extend through the second inter-layer insulating film 108 and the insulating layer 105. The wiring layer 110 is formed on the second inter-layer insulating film 108. The wiring layer 110 includes multiple wiring parts that can have different potentials. In the example, the wiring layer 110 includes wiring parts 110*s*, 110*d*, and 110*k*. The wiring parts 110*s*, 110*d*, and 110*k* are formed to be separated from each other.

A portion of the wiring part 110*s* is located above the region 104*s*. For example, another part of the wiring part 110*s* is connected to a power supply line 3 shown in FIG. 3 below. A portion of the wiring part (a first wiring part) 110*d* is located above the region 104*d*. Another part of the wiring part 110*d* is located above the upper surface 153U. A portion of the wiring part (a second wiring part) 110*k* is located above the connection part 151*a*. For example, the wiring part 110*k* is connected to a ground line 4 shown in the circuit of FIG. 3 below.

In FIG. 1 and subsequent cross-sectional views, unless otherwise noted, the reference numeral of a wiring layer is displayed beside one wiring part included in the wiring layer. In the example of FIG. 1, the reference numeral of the wiring layer 110 is displayed beside the wiring part 110*s*.

The via 111*s* is located between the wiring part 110*s* and the region 104*s* and electrically connects the wiring part 110*s* and the region 104*s*. The via 111*d* is located between the wiring part 110*d* and the region 104*d* and electrically connects the wiring part 110*d* and the region 104*d*.

The wiring part 110*s* is connected to the region 104*s* by the via 111*s*. The region 104*s* is a source region of the transistor 103. Accordingly, the source region of the transistor 103 is electrically connected to the power supply line 3 by the via 111*s* and the wiring part 110*s*.

The wiring part 110*d* is connected to the region 104*d* by the via 111*d*. The region 104*d* is a drain region of the transistor 103.

The via (the first via) 161*a* extends through the second inter-layer insulating film 108, the insulating layer 105, the TFT underlying film 106, and the first inter-layer insulating film 156 and reach the light-shielding electrode 160*a*. The via 161*a* is located between the wiring part (the first wiring part) 110*d* and the light-shielding electrode 160*a* and electrically connects the wiring part 110*d* and the light-shielding electrode 160*a*. Accordingly, the p-type semiconductor layer 153 is electrically connected to the drain region of the transistor 103 via the light-shielding electrode 160*a*, the via 161*a*, the wiring part 110*d*, and the via 111*d*.

The via (the second via) 161*k* extends through the second inter-layer insulating film 108, the insulating layer 105, the TFT underlying film 106, and the first inter-layer insulating film 156 and reach the connection part (the first connection part) 151*a*. The via 161*k* is located between the wiring part (the second wiring part) 110*k* and the connection part 151*a* and electrically connects the wiring part 110*k* and the connection part 151*a*. Accordingly, for example, the n-type semiconductor layer 151 is electrically connected to the ground line 4 of the circuit of FIG. 3 via the connection part 151*a*, the via 161*k*, and the wiring part 110*k*.

For example, the wiring layer 110 and the vias 111*s*, 111*d*, 161*a*, and 161*k* are formed of Al, an alloy of Al, a stacked film of Al, Ti, and the like, etc. For example, in a stacked film of Al and Ti, Al is stacked on a thin film of Ti, and then Ti is stacked on the Al.

A protective layer that covers and protects these components from the external environment may be provided over the second inter-layer insulating film 108 and the wiring layer 110.

Figure 2:
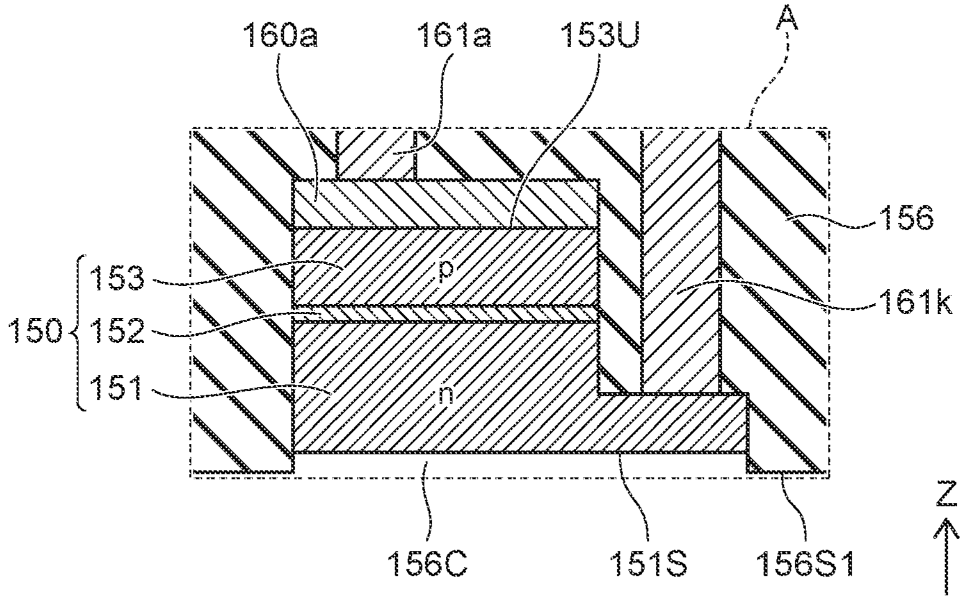
FIG. 2 is an enlarged schematic view of portion Area of FIG. 1.

FIG. 2 is an enlarged schematic view of portion Area of FIG. 1.

FIG. 2 shows details of the Z-axis direction positional relationship of the light-emitting surface 151S and the first surface 156S1 of the first inter-layer insulating film 156. The first surface 156S1 is one surface of the first inter-layer insulating film 156 and is the surface at the surface of the light-emitting surface 151S side.

As shown in FIG. 2, a recess 156C is formed by the first inter-layer insulating film 156 and the light-emitting surface 151S and is recessed from the first surface 156S1 in the positive direction of the Z-axis. The light-emitting surface 151S is substantially parallel with the first surface 156S1 and is shifted to a position further in the positive direction of the Z-axis than the first surface 156S1. In the description of the manufacturing method using FIGS. 5A to 9B below, the shift in the Z-axis direction between the light-emitting surface 151S and the first surface 156S1 is substantially equal to the thickness of the layer of the single-crystal metal for the formation of the light-emitting element 150.

The transparent resin layer 188 shown in FIG. 1 is filled into the recess 156C, and the transparent resin layer 188 somewhat planarizes the first surface 156S1 and the light-emitting surface 151S to make it easy to form the color filter.

Figure 3:
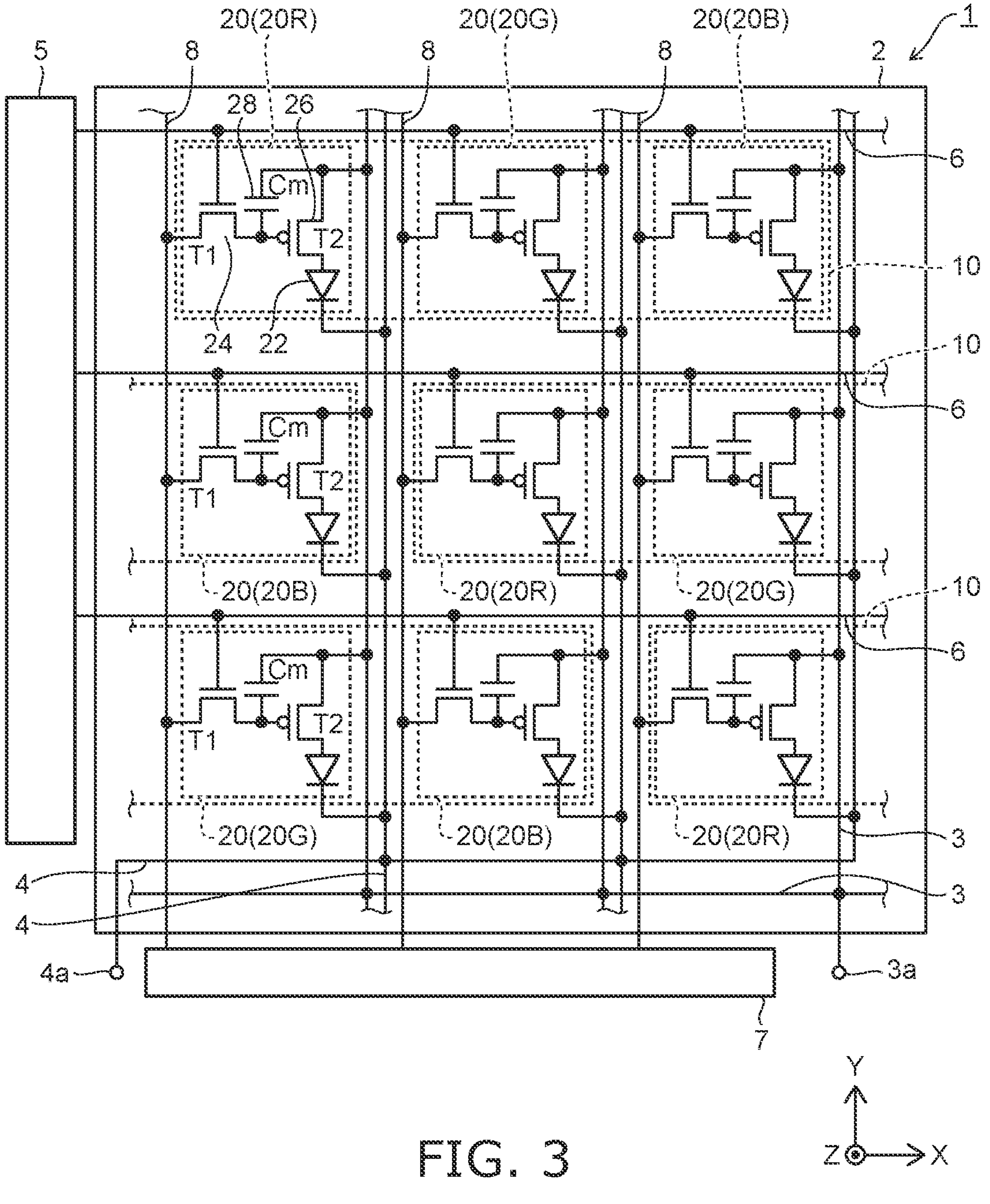
FIG. 3 is a schematic block diagram illustrating the image display device of the first embodiment.

FIG. 3 is a schematic block diagram illustrating the image display device according to the embodiment.

As shown in FIG. 3, the image display device 1 of the embodiment includes a display region 2. The subpixels 20 are arranged in the display region 2. For example, the subpixels 20 are arranged in a lattice shape. For example, n subpixels 20 are arranged along the X-axis, and m subpixels 20 are arranged along the Y-axis.

A pixel 10 includes multiple subpixels 20 that emit light of different colors. A subpixel 20R emits red light. A subpixel 20G emits green light. A subpixel 20B emits blue light. The light emission color and luminance of one pixel 10 are determined by the three types of the subpixels 20R, 20G, and 20B emitting light of the desired luminances.

One pixel 10 includes the three subpixels 20R, 20G, and 20B; for example, the subpixels 20R, 20G, and 20B are arranged in a straight line along the X-axis as shown in FIG. 3. In each pixel 10, subpixels of the same color may be arranged in the same column, or subpixels of different colors may be arranged in each column as in the example.

The image display device 1 further includes the power supply line 3 and the ground line 4. The power supply line 3 and the ground line 4 are wired in a lattice shape along the arrangement of the subpixels 20. The power supply line 3 and the ground line 4 are electrically connected to each subpixel 20, and electrical power is supplied to each subpixel 20 from a DC power supply connected between a power supply terminal 3*a* and the GND terminal 4*a*. The power supply terminal 3*a* and the GND terminal 4*a* are located respectively at end portions of the power supply line 3 and the ground line 4, and are connected to a DC power supply circuit located outside the display region 2. The power supply terminal 3*a* supplies a positive voltage when referenced to the GND terminal 4*a*.

The image display device 1 further includes a scanning line 6 and a signal line 8. The scanning line 6 is wired in a direction parallel to the X-axis. That is, the scanning lines 6 are wired along the arrangement in the row direction of the subpixels 20. The signal line 8 is wired in a direction parallel to the Y-axis. That is, the signal lines 8 are wired along the arrangement in the column direction of the subpixels 20.

The image display device 1 further includes a row selection circuit 5 and a signal voltage output circuit 7. The row selection circuit 5 and the signal voltage output circuit 7 are located along the outer edge of the display region 2. The row selection circuit 5 is located along the outer edge of the display region 2 in the Y-axis direction. The row selection circuit 5 is electrically connected to the subpixel 20 of each column via the scanning line 6, and supplies a select signal to each subpixel 20.

The signal voltage output circuit 7 is located along the outer edge of the display region 2 in the X-axis direction. The signal voltage output circuit 7 is electrically connected to the subpixel 20 of each row via the signal line 8, and supplies a signal voltage to each subpixel 20.

Figure 4:
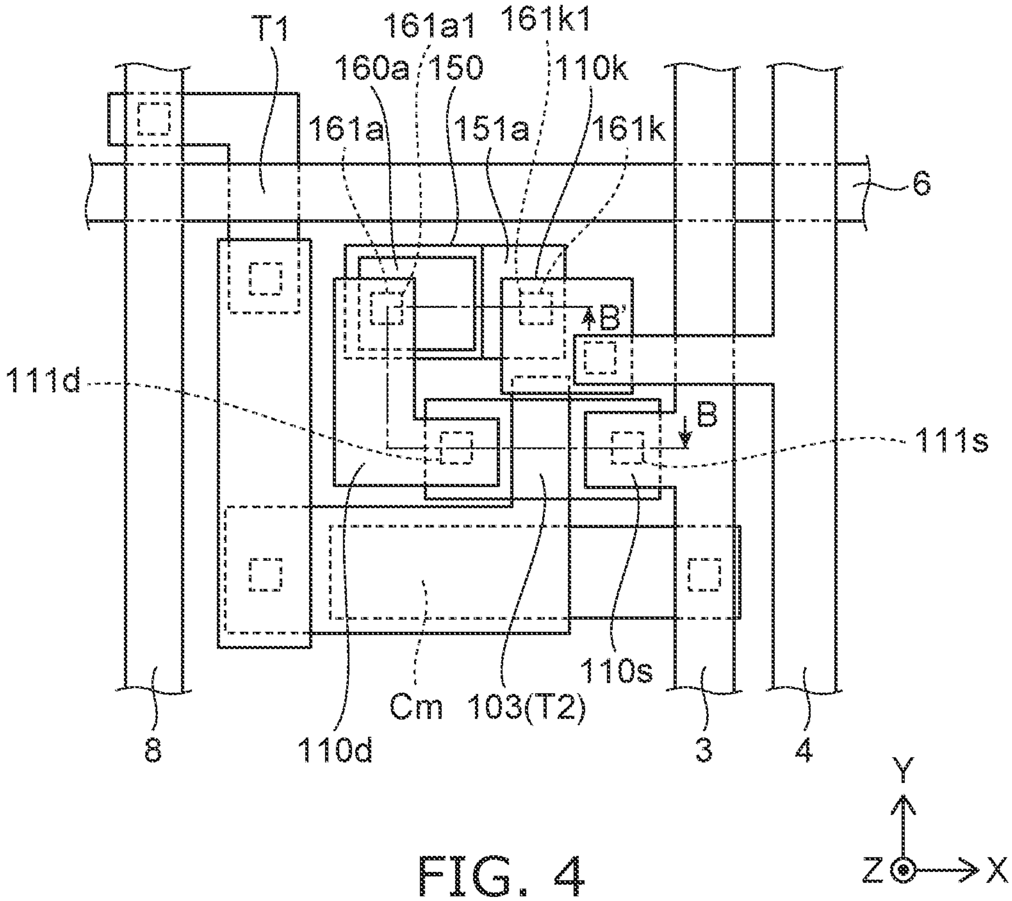
FIG. 4 is a schematic plan view illustrating a portion of the image display device of the first embodiment.

The subpixel 20 includes a light-emitting element 22, the select transistor 24, the drive transistor 26, and the capacitor 28. In FIGS. 3 and 4 below, the select transistor 24 may be displayed as T1, the drive transistor 26 may be displayed as T2, and the capacitor 28 may be displayed as Cm.

The light-emitting element 22 is connected in series with the drive transistor 26. According to the embodiment, the drive transistor 26 is a p-channel TFT, and the anode electrode of the light-emitting element 22 is connected to the drain electrode of the drive transistor 26. The major electrodes of the drive transistor 26 and the select transistor 24 are drain electrodes and source electrodes. The anode electrode of the light-emitting element 22 is connected to the p-type semiconductor layer. The cathode electrode of the light-emitting element 22 is connected to the n-type semiconductor layer. The series circuit of the light-emitting element 22 and the drive transistor 26 is connected between the power supply line 3 and the ground line 4. The drive transistor 26 corresponds to the transistor 103 of FIG. 1, and the light-emitting element 22 corresponds to the light-emitting element 150 of FIG. 1. The current that flows in the light-emitting element 22 is determined by the voltage applied between the gate and source of the drive transistor 26, and the light-emitting element 22 emits light of a luminance corresponding to the current flowing in the light-emitting element 22.

The select transistor 24 is connected between the signal line 8 and the gate electrode of the drive transistor 26 via a major electrode. The gate electrode of the select transistor 24 is connected to the scanning line 6. The capacitor 28 is connected between the power supply line 3 and the gate electrode of the drive transistor 26.

The row selection circuit 5 selects one row from the arrangement of m rows of the subpixels 20 and supplies a select signal to the scanning line 6. The signal voltage output circuit 7 supplies a signal voltage that has an analog voltage value necessary for each subpixel 20 of the selected row. The signal voltage is applied between the gate and source of the drive transistor 26 of the subpixels 20 of the selected row. The signal voltage is maintained by the capacitor 28. The drive transistor 26 allows a current corresponding to the signal voltage to flow in the light-emitting element 22. The light-emitting element 22 emits light of a luminance corresponding to the current that flows.

The row selection circuit 5 sequentially switches the row that is selected, and supplies the select signal. That is, the row selection circuit 5 scans through the rows in which the subpixels 20 are arranged. Light emission is performed by currents that correspond to the signal voltages flowing in the light-emitting elements 22 of the subpixels 20 that are sequentially scanned. The luminance of the subpixel 20 is determined by the current flowing in the light-emitting element 22. The subpixels 20 emit light with gradations based on the determined luminances, and an image is displayed in the display region 2.

FIG. 4 is a schematic plan view illustrating a portion of the image display device of the embodiment.

In FIG. 4, the line along BB' indicates a cutting plane line of the cross-sectional view of FIG. 1, etc. According to the embodiment, the light-emitting element 150 and the drive transistor 103 are stacked in the Z-axis direction with the first inter-layer insulating film 156 interposed. The light-emitting element 150 corresponds to the light-emitting element 22 in FIG. 3. The drive transistor 103 corresponds to the drive transistor 26 in FIG. 3 and is labeled T2 as well.

As shown in FIG. 4, the cathode electrode of the light-emitting element 150 is provided by the connection part 151*a*. The connection part 151*a* is located in a lower layer than the transistor 103 and the wiring layer 110. The connection part 151*a* is electrically connected to the wiring part 110*k* by the via 161*k*. More specifically, one end of the via 161*k* is connected to the connection part 151*a*. The other end of the via 161*k* is connected to the wiring part 110*k* via a contact hole 161*k*1.

The anode electrode of the light-emitting element 150 is provided by the p-type semiconductor layer 153 shown in FIG. 1. The light-shielding electrode 160*a* is located on the upper surface 153U of the p-type semiconductor layer 153. The light-shielding electrode 160*a* is connected to one end of the wiring part 110*d* by the via 161*a*. More specifically, one end of the via 161*a* is connected to the light-shielding electrode 160*a*, and the other end of the via 161*a* is connected to the wiring part 110*d* via a contact hole 161*a*1.

The other end of the wiring part 110*d* is connected to the drain electrode of the transistor 103 by the via 111*d*. The drain electrode of the transistor 103 is the region 104*d* shown in FIG. 1. The source electrode of the transistor 103 is connected to the wiring part 110*s* by the via 111*s*. The source electrode of the transistor 103 is the region 104*s* shown in FIG. 1. In the example, the wiring layer 110 includes the power supply line 3, and the wiring part 110*s* is connected to the power supply line 3.

In the example, the ground line 4 is located in a higher layer than the wiring layer including the wiring part 110*s*. Although not illustrated in FIG. 1, an inter-layer insulating film is located on the wiring layer 110, and the ground line 4 is located on the inter-layer insulating film.

Thus, by using the vias 161*a* and 161*k*, the light-emitting element 150 can be electrically connected to the wiring layer 110 located in a higher layer than the light-emitting element 150.

A method for manufacturing the image display device 1 of the embodiment will now be described.

FIGS. 5A to 9B is schematic cross-sectional views illustrating a portion of the method for manufacturing the image display device of the embodiment.

Figure 5A:
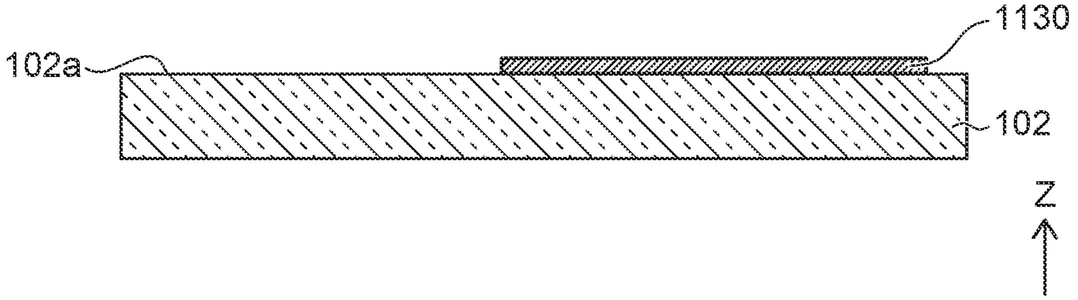
FIG. 5A is a schematic cross-sectional view illustrating a portion of a method for manufacturing the image display device of the first embodiment.

As shown in FIG. 5A, the substrate 102 is prepared according to the method for manufacturing the image display device of the embodiment. The substrate 102 is a light-transmitting substrate and is, for example, a substantially rectangular glass substrate of about 1500 mm×1800 mm. A metal layer 1130 is formed on a substrate surface 102*a*. For example, the metal layer 1130 is formed by forming a layer of a metal material on the entire surface of the substrate surface 102*a* by sputtering, etc., and then patterned so that the location where the light-emitting layer will be formed remains.

Or, the metal layer 1130 may be formed by providing, on the substrate surface 102*a*, a mask having a pattern having an opening at the location where the light-emitting layer will be formed, and then forming the patterned metal layer 1130.

For example, the metal layer 1130 is formed using a metal material such as Cu, Hf, etc. To form the metal layer 1130 at a low temperature, it is favorable to use sputtering, etc.

The patterned metal layer 1130 is monocrystallized by annealing treatment. Favorably, annealing treatment is performed to monocrystallize the entire patterned metal layer 1130. For example, annealing treatment by laser irradiation is favorably used to monocrystallize the metal layer 1130. In pulsed laser annealing, a substrate of glass, an organic resin, etc., can be used as the substrate 102 because the metal layer 1130 can be monocrystallized in a state in which the effects of the temperature on the layers lower than the metal layer 1130 are suppressed at a low temperature of about 400° C. to about 500° C.

Figure 5B:
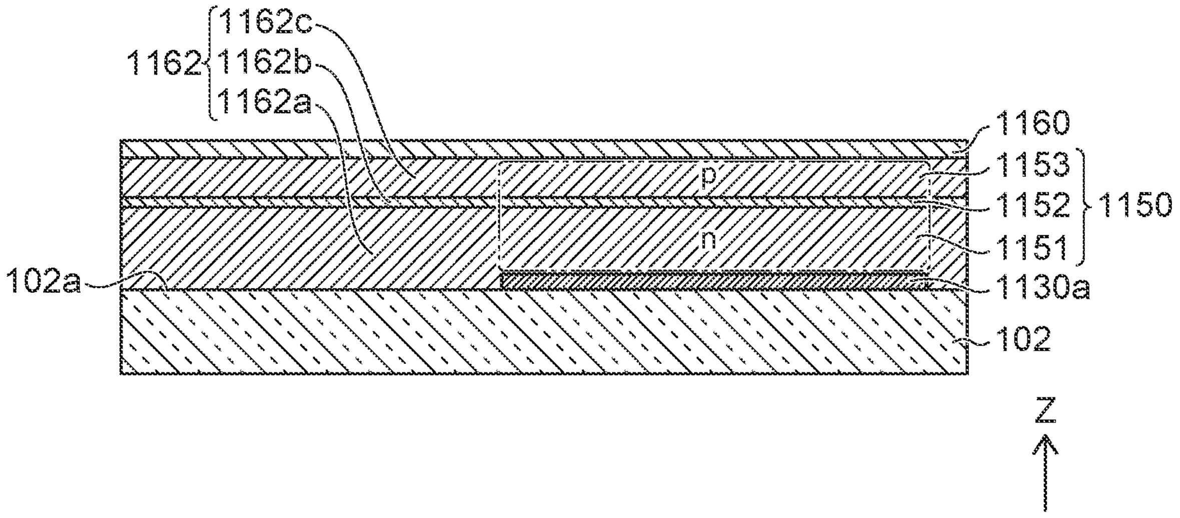
FIG. 5B is a schematic cross-sectional view illustrating a portion of the method for manufacturing the image display device of the first embodiment.

As shown in FIG. 5B, a metal seed layer (a layer including a first part) 1130*a* is formed by monocrystallizing the metal layer 1130 shown in FIG. 5A by annealing treatment. A semiconductor layer 1150 is formed over the metal seed layer 1130*a*. The semiconductor layer 1150 includes an n-type semiconductor layer 1151, a light-emitting layer 1152, and a p-type semiconductor layer 1153 formed in this order from the metal seed layer 1130*a* in the positive direction of the Z-axis.

To form the semiconductor layer 1150, physical vapor deposition such as vapor deposition, ion beam deposition, molecular beam epitaxy (MBE), sputtering, or the like is used, and it is favorable to use low-temperature sputtering. Low-temperature sputtering is favorable because a lower temperature when forming is possible by assisting with light and/or plasma. There are cases where 1000° C. is exceeded in epitaxial growth by MOCVD. In contrast, it is known that a GaN crystal including a light-emitting layer can be epitaxially grown on the single-crystal metal layer in low-temperature sputtering at a low temperature of about 400° C. to about 700° C. (see Non-Patent Literature 1 and 2, etc.). Such low-temperature sputtering is self-aligning when forming the semiconductor layer 1150 on a circuit board including TFT, etc., formed by a LTPS process.

The semiconductor layer 1150 includes, for example, GaN, and more specifically, includes $In_XAl_YGa_{1-X-Y}N$ ($0 \leq X$, $0 \leq Y$, and $X+Y<1$), etc.

There are cases where crystal defects caused by the crystal lattice constant mismatch occur in the initial stage of crystal growth, and crystals in which crystal defects occur are of the n-type. Therefore, as in the example, it is advantageous to form the semiconductor layer 1150 on the substrate 102 from the n-type semiconductor layer 1151 because the yield is easily increased by the large production process margin.

By using appropriate film formation technology, the GaN semiconductor layer 1150 is grown on the metal seed layer 1130*a* that is monocrystallized over the entire surface, and the semiconductor layer 1150 that is monocrystallized and includes the light-emitting layer 1152 is thereby formed on the metal seed layer 1130*a*. The semiconductor layer 1150 is formed inside the region shown by the double dot-dash line of FIG. 5B.

There are also cases where an amorphous deposit 1162 that includes materials of the growth species such as Ga is deposited on the substrate surface 102*a* at which the metal seed layer 1130*a* does not exist in the growth process of the semiconductor layer 1150. In the example, the deposit 1162 includes deposits 1162*a*, 1162*b*, and 1162*c* stacked in this order from the substrate surface 102*a* in the positive direction of the Z-axis. The deposit 1162*a* is deposited when forming the n-type semiconductor layer 1151; the deposit 1162*b* is deposited when forming the light-emitting layer 1152, and the deposit 1162*c* is deposited when forming the p-type semiconductor layer 1153; however, the configuration is not limited thereto.

A metal layer 1160 is formed on the semiconductor layer 1150. In the example, the metal layer 1160 also is formed on the deposit 1162. More specifically, the metal layer 1160 is formed on the p-type semiconductor layer 1153 and on the deposit 1162*c*.

The relationship between the region in which the metal seed layer is monocrystallized and the region in which the semiconductor layer 1150 is grown will now be described.

Figure 6A:
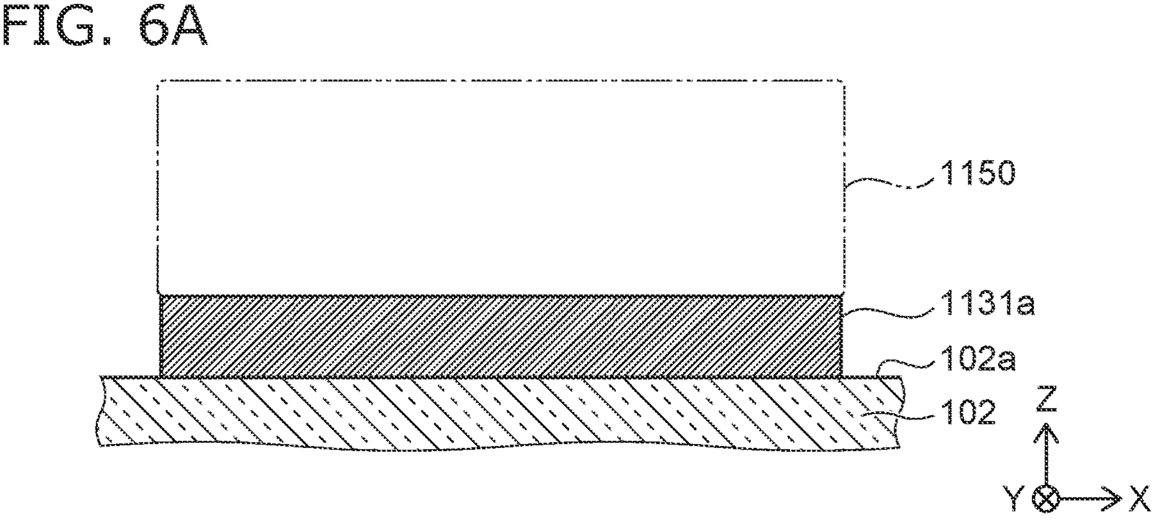
FIG. 6A is a schematic cross-sectional view illustrating a portion of the method for manufacturing the image display device of the first embodiment.
Figure 6B:
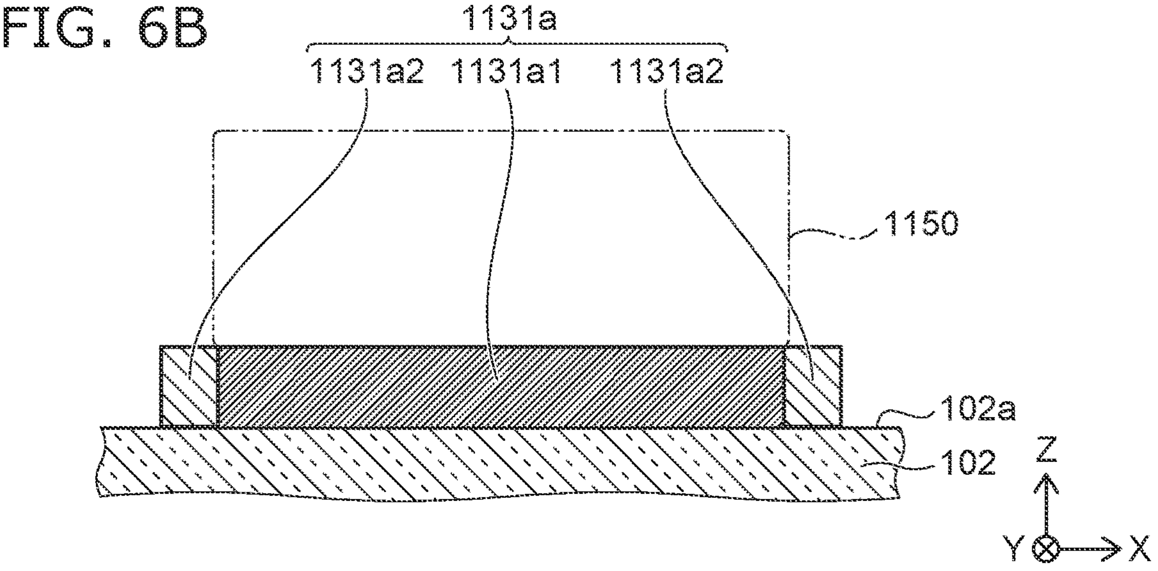
FIG. 6B is a schematic cross-sectional view illustrating a portion of the method for manufacturing the image display device of the first embodiment.
Figure 6C:
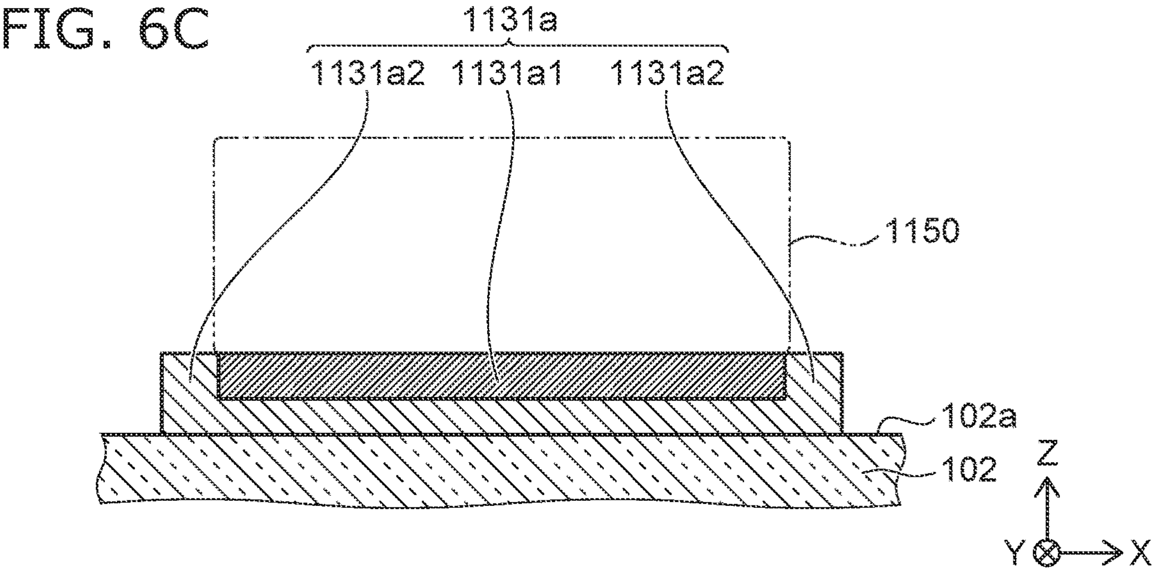
FIG. 6C is a schematic cross-sectional view illustrating a portion of the method for manufacturing the image display device of the first embodiment.

FIGS. 6A to 6C are cross-sectional views of three types of patterned parts 1131*a*. The patterned part 1131*a* is a part formed by patterning the metal seed layer 1130*a* shown in FIG. 5B.

FIG. 6A shows a state in which the entire patterned part 1131*a* is monocrystallized.

As shown in FIG. 6A, the entire patterned part (the first part) 1131*a* is monocrystallized. More specifically, the patterned part 1131*a* is monocrystallized over the XY plane and is monocrystallized in the Z-axis direction from the surface of the patterned part 1131*a* to the substrate surface 102*a*. The semiconductor layer 1150 is formed over the patterned part 1131*a* as shown by the double dot-dash line of FIG. 6A.

FIGS. 6B and 6C show states in which portions of the patterned parts 1131*a* are monocrystallized.

As shown in FIG. 6B, the patterned part 1131*a* includes a monocrystallized part (a first part) 1131*a*1 and a part 1131*a*2 that is not monocrystallized. The monocrystallized part 1131*a*1 is formed in the Z-axis direction from the surface of the patterned part 1131*a* to the substrate surface 102*a*. Although the non-monocrystallized part 1131*a*2 is formed to surround the periphery of the monocrystallized part 1131*a*1 in the example, the non-monocrystallized part 1131*a*2 is formed to contact at least a portion of the outer perimeter of the monocrystallized part 1131*a*1. As shown by the double dot-dash line of FIG. 6B, the semiconductor layer 1150 is formed over the monocrystallized part 1131*a*1 of the patterned part 1131*a*. For example, amorphous deposits that include materials of the growth species such as Ga are deposited on the substrate surface 102*a* and on the non-monocrystallized part 1131*a*2.

As shown in FIG. 6C, the patterned part 1131*a* includes the monocrystallized part (the first part) 1131*a*1 and the non-monocrystallized part 1131*a*2. The monocrystallized part 1131*a*1 is formed at the surface vicinity of the patterned part 1131*a* in the Z-axis direction and does not reach the substrate surface 102*a*. Similarly to when FIG. 6B, the non-monocrystallized part 1131*a*2 is formed at the periphery of the monocrystallized part 1131*a*1. As shown by the double dot-dash line of FIG. 6C, the semiconductor layer 1150 is formed over the monocrystallized part 1131*a*1 of the patterned part 1131*a*. For example, amorphous deposits that include materials of the growth species such as Ga are deposited on the substrate surface 102*a* and on the non-monocrystallized part 1131*a*2.

Thus, the semiconductor layer 1150 is formed on the monocrystallized part of the patterned part 1131*a*. Therefore, the area of the monocrystallized part (the first part) of the patterned part 1131*a* when projected onto the XY plane is sufficiently greater than the area of the bottom surface of the light-emitting element, and the outer perimeter of the monocrystallized part is set to include the outer perimeter of the light-emitting element when projected onto the XY plane. That is, the outer perimeter of the light-emitting element 150 is located within the outer perimeter of the monocrystallized part when projected onto the XY plane.

The metal material that is used to form the metal layer 1130 shown in FIG. 5A is, for example, Cu, Hf, etc. The metal material that is included in the metal layer 1130 is not limited to Cu or Hf as long as the metal material can be monocrystallized by annealing treatment. From the perspective of reducing the thermal stress on a circuit board 100, it is favorable to use a metal material that can be monocrystallized by annealing treatment at a lower temperature.

According to the embodiment, the crystal formation of GaN is promoted by using the metal seed layer 1130*a* of the single-crystal metal as a seed. When forming the semiconductor layer 1150 on the metal seed layer 1130*a*, a conductive buffer layer may be provided on the metal seed layer 1130*a*, and a semiconductor layer may be grown on the buffer layer by the low-temperature sputtering described above, etc. Any type of buffer layer can be used as long as the material promoting the crystal formation of GaN. A graphene sheet may be used as the buffer layer.

Figure 7A:
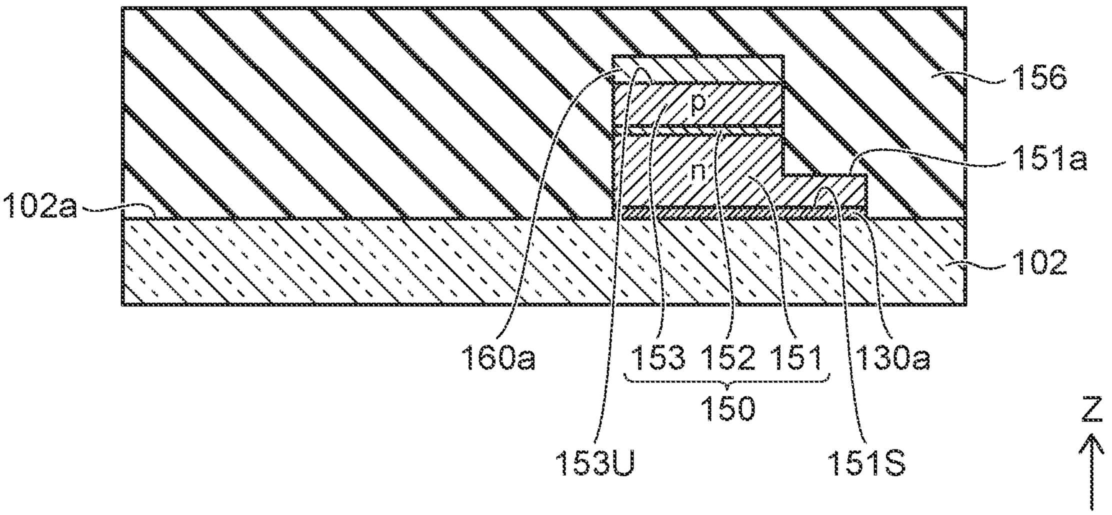
FIG. 7A is a schematic cross-sectional view illustrating a portion of the method for manufacturing the image display device of the first embodiment.

As shown in FIG. 7A, the metal layer 1160 and the semiconductor layer 1150 shown in FIG. 5B are patterned into the desired shape by etching, and the light-shielding electrode (the light-shielding member) 160*a* and the light-emitting element 150 are formed.

In the formation process of the light-emitting element 150, the connection part 151*a* is formed, and then the light-shielding electrode (the light-shielding member) 160*a* is formed on the other part and the upper surface 153U by further etching. The light-emitting element 150 that includes the connection part 151*a* protruding from the n-type semiconductor layer 151 over the substrate surface 102*a* in the positive direction of the X-axis can be formed thereby. To form the light-emitting element 150, for example, a dry etching process is used, and it is favorable to use anisotropic plasma etching (Reactive Ion Etching (RIE)).

The metal seed layer 1130*a* shown in FIG. 5B is etched to shape a seed plate (a first part) 130*a*. In the example, the outer perimeter of the seed plate 130*a* is formed to substantially match the outer perimeter of the light-emitting surface 151S of the light-emitting element 150 when projected onto the XY plane. It is sufficient for the outer perimeter of the seed plate 130*a* to be formed to include the outer perimeter of a bottom surface 151B when projected onto the XY plane. That is, it is sufficient for the outer perimeter of the bottom surface 151B to be located within the outer perimeter of the seed plate 130*a* when projected onto the XY plane.

The first inter-layer insulating film (the first insulating film) 156 is formed to cover the substrate surface 102*a*, the light-emitting element 150, and the light-shielding electrode 160*a*.

Figure 7B:
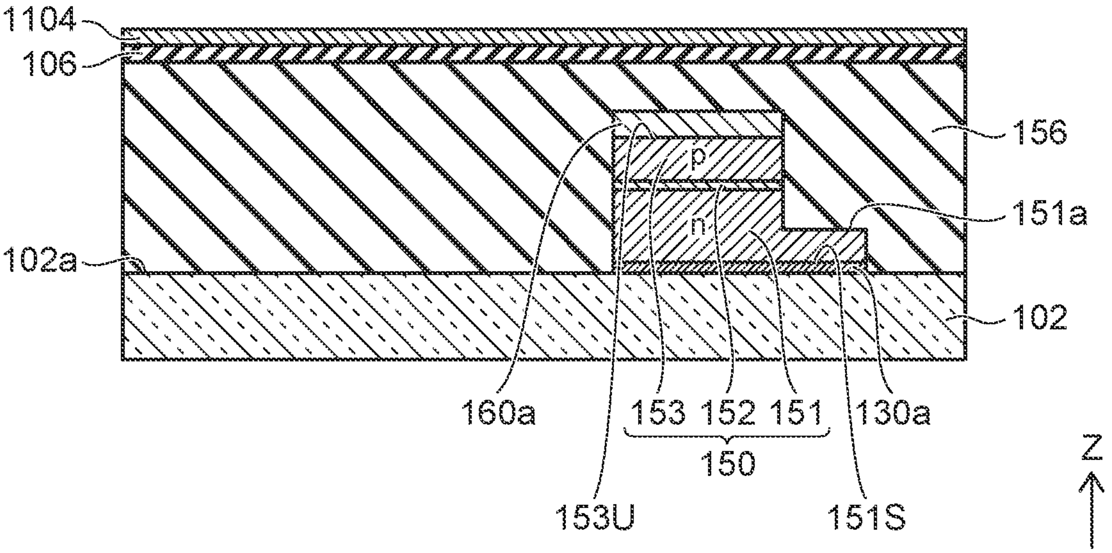
FIG. 7B is a schematic cross-sectional view illustrating a portion of the method for manufacturing the image display device of the first embodiment.

As shown in FIG. 7B, for example, the TFT underlying film 106 is formed on the first inter-layer insulating film 156 by CVD, etc. A Si layer 1104 is formed on the TFT underlying film 106 that is formed. When formed, the Si layer 1104 is a layer of amorphous Si, and after forming, the polycrystallized Si layer 1104 is formed by, for example, scanning an excimer laser pulse multiple times.

Figure 8A:
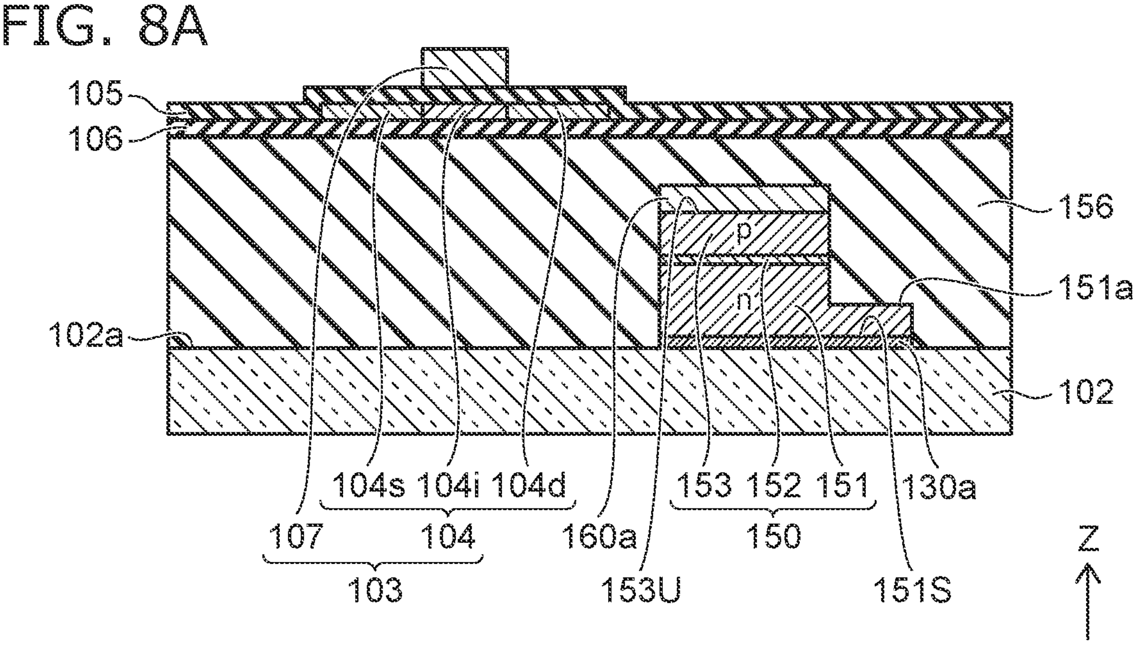
FIG. 8A is a schematic cross-sectional view illustrating a portion of the method for manufacturing the image display device of the first embodiment.

As shown in FIG. 8A, the polycrystallized Si layer 1104 shown in FIG. 7B is patterned into an island configuration to form the TFT channel 104. The insulating layer 105 is formed to cover the TFT underlying film 106 and the TFT channel 104. The insulating layer 105 functions as a gate insulating film. The gate 107 is formed on the TFT channel 104 with the insulating layer 105 interposed. An impurity such as B or the like is selectively doped into the gate 107, and the transistor (the circuit element) 103 is formed by thermal activation. The regions 104*s* and 104*d* become p-type active regions and respectively function as the source region and drain region of the transistor 103. The region 104*i* becomes an n-type active region and functions as the channel.

Thus, when a LTPS process is used, the transistor 103 is formed at the desired position on the TFT underlying film 106.

Figure 8B:
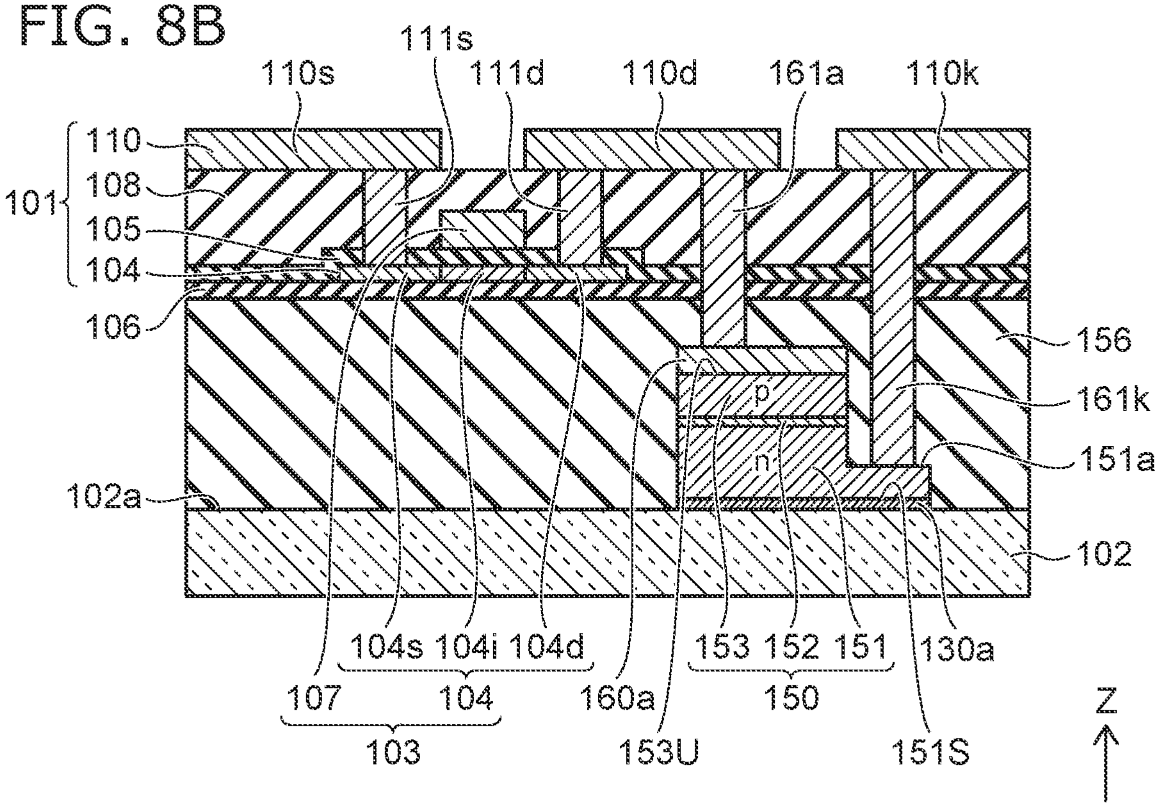
FIG. 8B is a schematic cross-sectional view illustrating a portion of the method for manufacturing the image display device of the first embodiment.

As shown in FIG. 8B, the second inter-layer insulating film (the second insulating film) 108 is provided to cover the insulating layer 105 and the gate 107. To form the second inter-layer insulating film 108, an appropriate formation method according to the material of the second inter-layer insulating film 108 is applied. For example, technology such as ALD, CVD, or the like is used when the second inter-layer insulating film 108 is formed of $SiO_2$.

It is sufficient for the second inter-layer insulating film 108 to be flat enough to form the wiring layer 110, and a planarizing process may not always be performed. The number of processes can be reduced when a planarizing process of the second inter-layer insulating film 108 is not performed. For example, when there are locations at the periphery of the light-emitting element 150 at which the thickness of the second inter-layer insulating film 108 is thin, the depths of the via holes for the vias 161*a* and 161*k* can be shallow, and sufficient opening diameters can therefore be ensured. It is therefore easier to ensure the electrical connections by vias, and the reduction of the yield due to defects of the electrical characteristics can be suppressed.

The vias 161*a* and 161*k* that extend through the second inter-layer insulating film 108, the insulating layer 105, the TFT underlying film 106, and the first inter-layer insulating film 156 are formed. A via hole that is formed to reach the light-shielding electrode 160*a* is filled with a conductive material to form the via (the first via) 161*a*, and the via (the first via) 161*a* is electrically connected to the light-shielding electrode 160*a*. A via hole that is formed to reach the connection part (the first connection part) 151*a* is filled with a conductive material to form the via (the second via) 161*k*, and the via (the second via) 161*k* is electrically connected to the connection part 151*a*.

The vias 111*s* and 111*d* are formed to extend through the second inter-layer insulating film 108 and the insulating layer 105. The via 111*s* is formed to reach the region 104*s*. The via 111*d* is formed to reach the region 104*d*. For example, RIE or the like is used to form the via hole for forming the vias 161*a*, 161*k*, 111*s*, and 111*d*.

The wiring layer 110 is formed on the second inter-layer insulating film 108. The wiring parts 110*k*, 110*d*, and 110*s* are formed. The wiring part 110*k* is connected to one end of the via 161*k*. The wiring part 110*d* is connected to one end of the via 161*a* and one end of the via 111*d*. The wiring part 110*s* is connected to one end of the via 111*s*. The wiring parts 110*k*, 110*d*, and 110*s* may be formed simultaneously with the formation of the vias 161*k*, 111*d*, and 111*s* in the formation of the wiring layer 110.

Figure 9A:
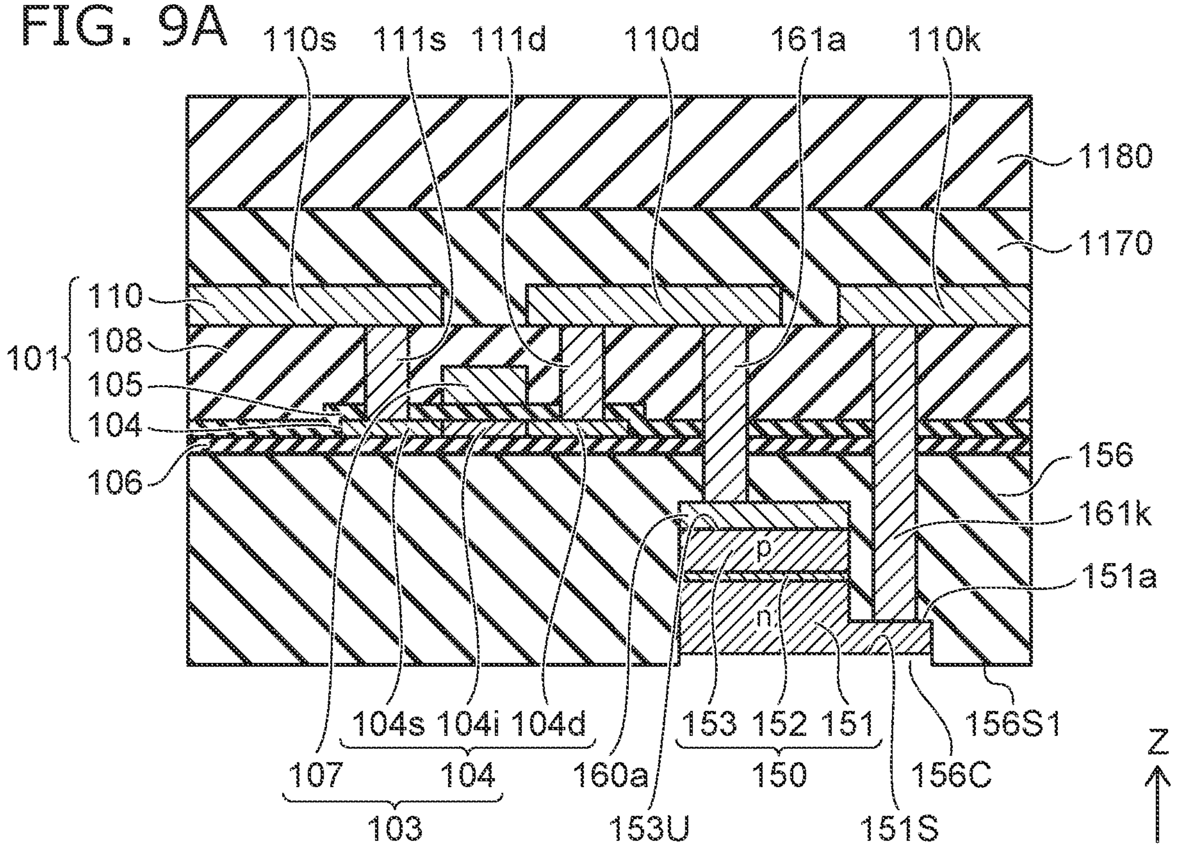
FIG. 9A is a schematic cross-sectional view illustrating a portion of the method for manufacturing the image display device of the first embodiment.

As shown in FIG. 9A, an adhesive layer 1170 is formed on the second inter-layer insulating film 108 and the wiring layer 110, and a reinforcing substrate 1180 is bonded to the adhesive layer 1170. The reinforcing substrate 1180 is provided so that the structural component after the substrate 102 shown in FIG. 8B is removed maintains sufficient strength for the processing, movement, etc., in the subsequent processes.

The substrate 102 is removed after the reinforcing substrate 1180 is provided. The seed plate 130*a* shown in FIG. 8B also is removed simultaneously with the removal of the substrate 102. The seed plate 130*a* may be removed after removing the substrate 102. Wet etching, laser lift-off, or the like is used to remove the substrate 102 and the seed plate 130*a*. The first surface 156S1 of the first inter-layer insulating film 156 and the light-emitting surface 151S are exposed by removing the substrate 102 and the seed plate 130*a*.

Figure 9B:
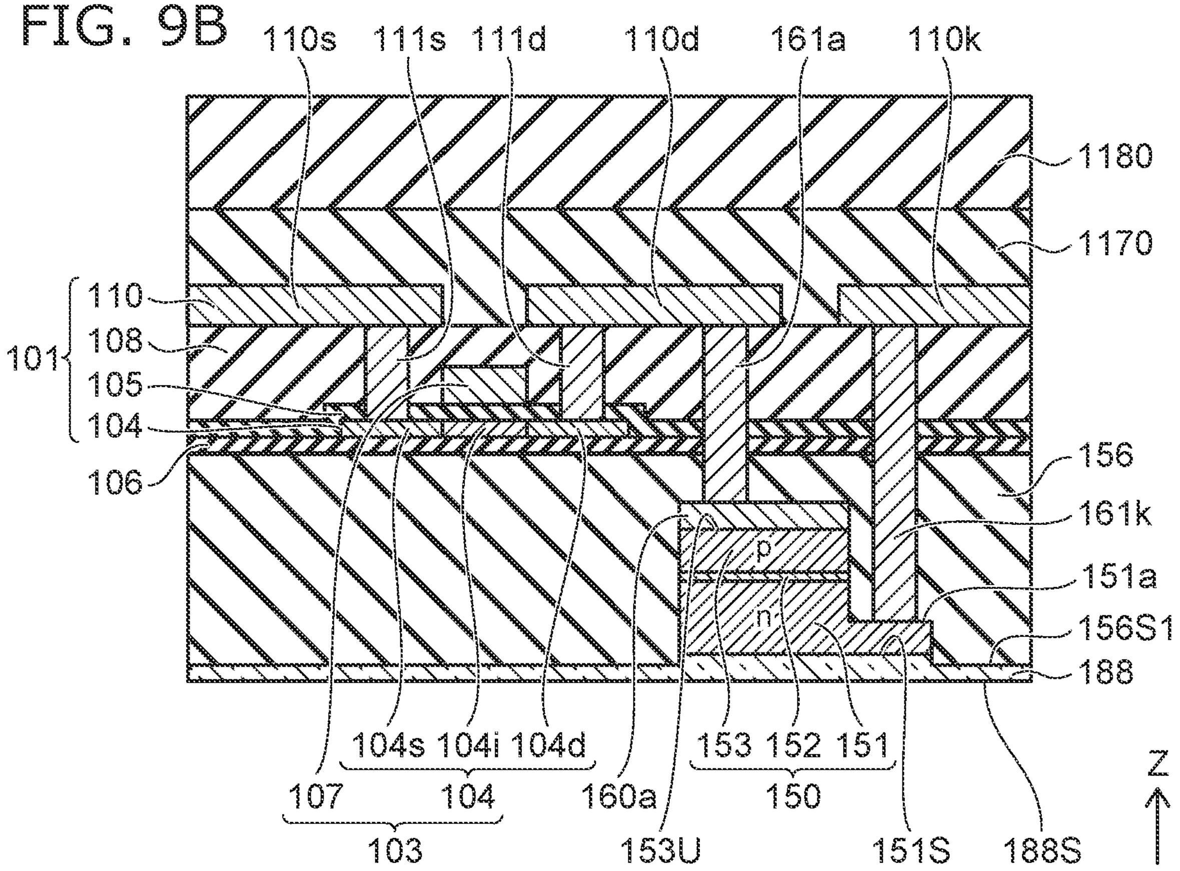
FIG. 9B is a schematic cross-sectional view illustrating a portion of the method for manufacturing the image display device of the first embodiment.

As shown in FIG. 9B, the transparent resin layer 188 is formed on the first surface 156S1 and the light-emitting surface 151S. A CF formation surface 188S for forming a color filter is formed by forming the transparent resin layer 188 to fill the recess 156C of the first inter-layer insulating film 156 shown in FIG. 2.

FIGS. 10A to 10D are schematic cross-sectional views illustrating portions of a method for manufacturing the image display device of the embodiment.

FIGS. 10A to 10D show a method of forming the color filter by inkjet printing.

Figure 10A:
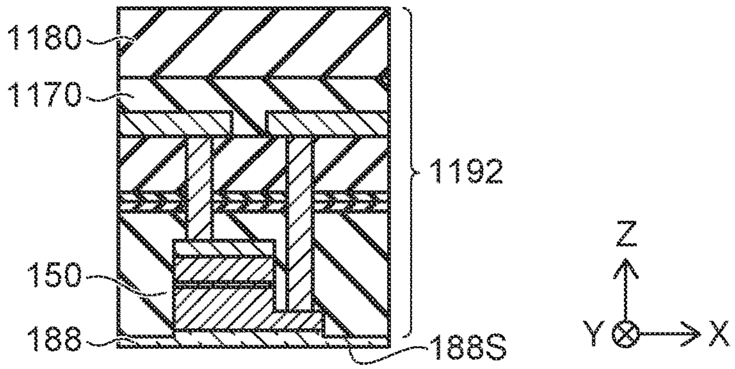
FIG. 10A is a schematic cross-sectional view illustrating a portion of the method for manufacturing the image display device of the first embodiment.

A structure body 1192 in which the CF formation surface 188S of the transparent resin layer 188 is exposed is prepared as shown in FIG. 10A. In addition to the transparent resin layer 188 and the light-emitting element 150, the adhesive layer 1170, and the reinforcing substrate 1180 on the transparent resin layer 188, the structure body 1192 includes the first inter-layer insulating film 156, the light-shielding electrode 160*a*, the TFT underlying film 106, the TFT channel, the insulating layer 105, the gate 107, the vias 111*s*, 111*d*, 161*a*, and 161*k*, the wiring layer 110, etc., shown in FIG. 9B.

Figure 10B:
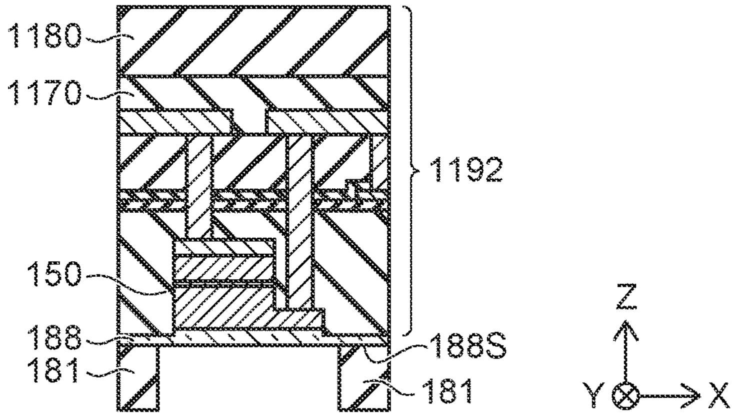
FIG. 10B is a schematic cross-sectional view illustrating a portion of the method for manufacturing the image display device of the first embodiment.

As shown in FIG. 10B, the light-shielding part 181 is formed in the region on the CF formation surface 188S where the light-emitting surface 151S is not provided. For example, the light-shielding part 181 is formed using screen printing, photolithography technology, etc.

Figure 10C:
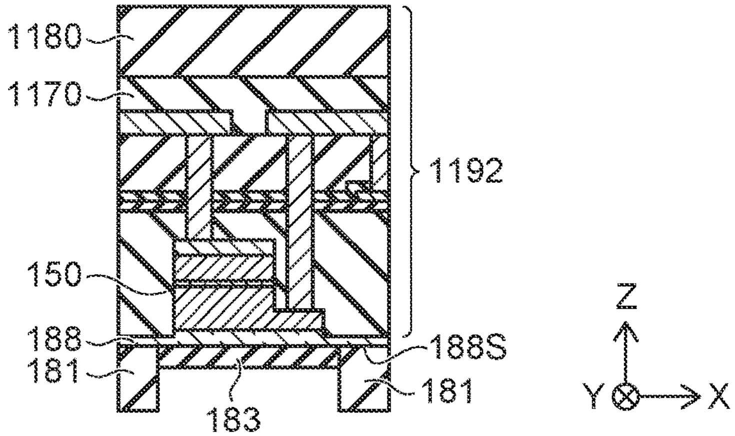
FIG. 10C is a schematic cross-sectional view illustrating a portion of the method for manufacturing the image display device of the first embodiment.

As shown in FIG. 10C, the color conversion layer 183 is formed by dispensing a fluorescer that corresponds to the light emission color from an inkjet nozzle. The fluorescer colors the region on the CF formation surface 188S in which the light-shielding part 181 is not formed. The fluorescer includes, for example, a fluorescent coating that uses a general fluorescer material, a perovskite fluorescer material, and a quantum dot fluorescer material. It is favorable to use a perovskite fluorescer material or a quantum dot fluorescer material because the light emission colors can be realized with high monochromaticity and high color reproducibility. After printing with the inkjet nozzle, drying processing is performed using an appropriate temperature and time. The thickness of the coating when coloring is set to be less than the thickness of the light-shielding part 181.

As described above, the color conversion layer 183 is not formed in the subpixel of blue light emission when the color conversion part is not formed. Also, when a blue color conversion layer is formed in the subpixel of blue light emission, and when the color conversion part may have one layer, the thickness of the coating of the blue fluorescer is the thickness of the filter layer 184 stacked on the color conversion layer 183, and is favorably about equal to the thickness of the light-shielding part 181.

Figure 10D:
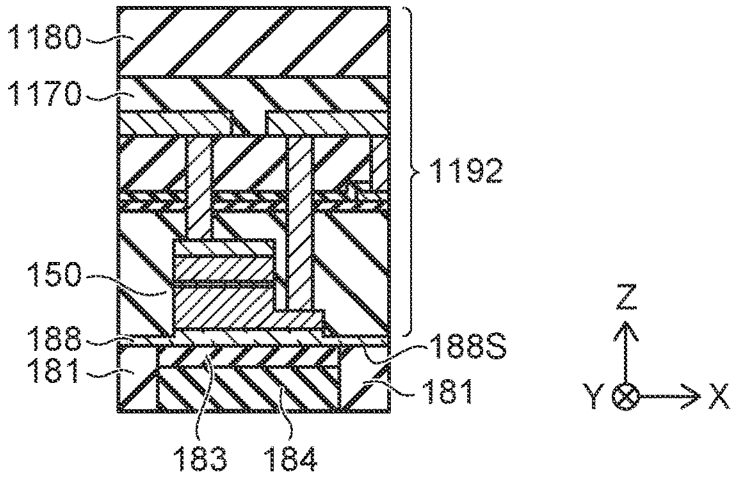
FIG. 10D is a schematic cross-sectional view illustrating a portion of the method for manufacturing the image display device of the first embodiment.

As shown in FIG. 10D, the coating for the filter layer 184 is dispensed from the inkjet nozzle. The coating is applied to overlap the coating of the fluorescer. The total thickness of the fluorescer and the coating is set to be about equal to the thickness of the light-shielding part 181.

Instead of a formation process of a color filter by inkjet printing, a process of forming a film-type color filter 180*a* will now be described.

Figure 11:
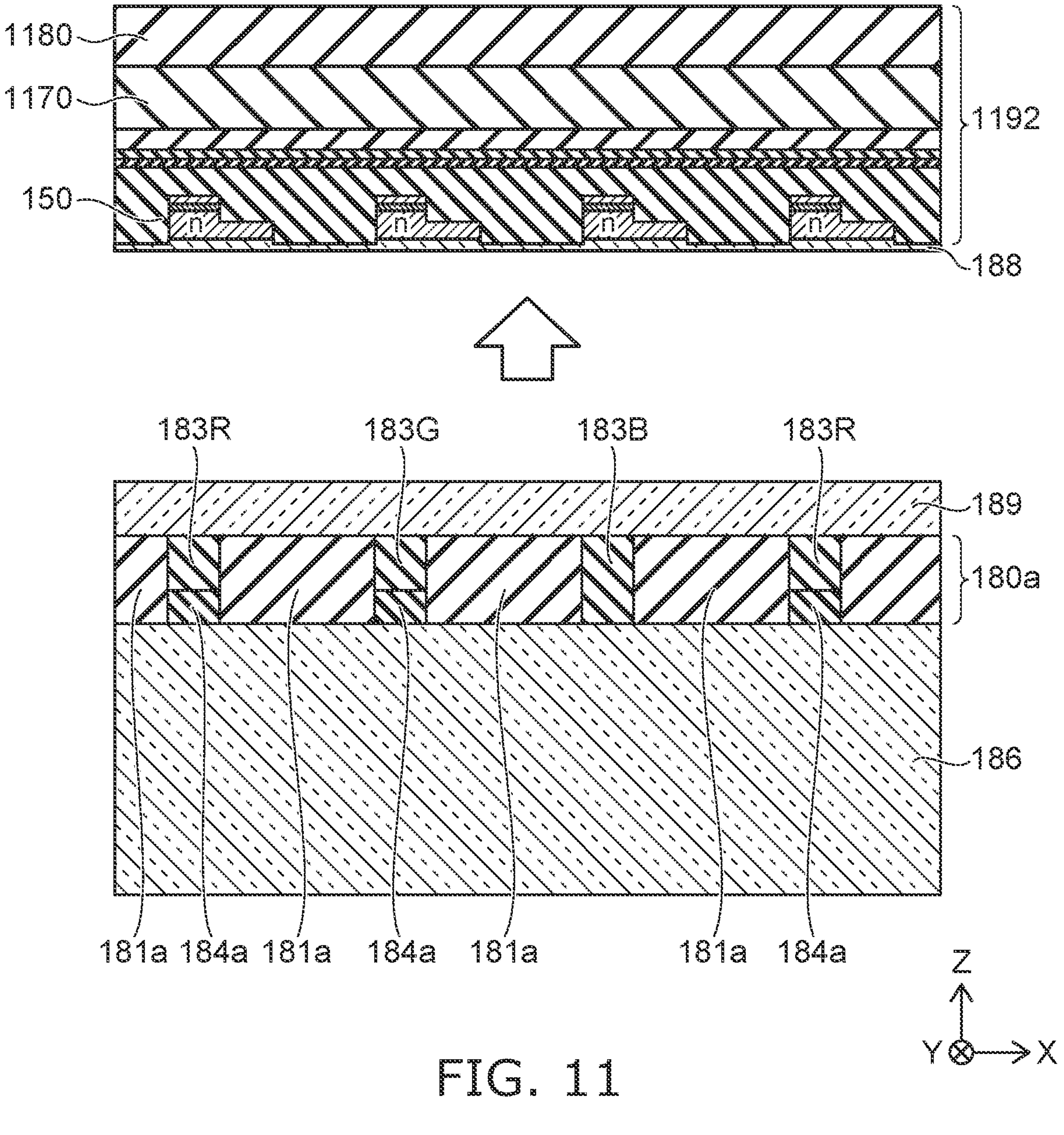
FIG. 11 is a schematic cross-sectional view illustrating a portion of a modification of the method for manufacturing the image display device of the first embodiment.

FIG. 11 is a schematic cross-sectional view illustrating a portion of a modification of the method for manufacturing the image display device of the embodiment.

The drawing above the arrow in FIG. 11 is the structure body 1192. The structure body 1192 includes the transparent resin layer 188, the light-emitting element 150, the adhesive layer 1170, the reinforcing substrate 1180, etc., shown in FIG. 9B. The drawing below the arrow shows a glass substrate 186, the color filter 180*a* bonded to the glass substrate 186, and a transparent thin film adhesive layer 189 that bonds the color filter 180*a* to the structure body 1192. The arrow illustrates how the color filter 180*a* is adhered, together with the glass substrate 186 and the transparent thin film adhesive layer 189, to the structure body 1192.

To avoid complexity in FIG. 11, the components and/or their reference numerals are not illustrated for some of the components of the structure body 1192. The components inside the structure body 1192 that are not illustrated are the first inter-layer insulating film 156, the circuit 101, and the vias 161*a* and 161*k* shown in FIG. 9B.

As shown in FIG. 11, the color filter (the wavelength conversion member) 180*a* includes a light-shielding part 181*a*, the color conversion layers 183R, 183G, and 183B, and a filter layer 184*a*. The light-shielding part 181*a* has a function similar to when an inkjet technique is used. The color conversion layers 183R, 183G, and 183B are formed to have functions and materials similar to when an inkjet technique is used. The filter layer 184*a* also has a function similar to when an inkjet technique is used.

The color filter 180*a* is bonded to the structure body 1192 at one surface. The other surface of the color filter 180*a* is bonded to the glass substrate 186. The transparent thin film adhesive layer 189 is located at the one surface of the color filter 180*a*, and the one surface of the color filter 180*a* is bonded to the exposed surface of the transparent resin layer 188 of the structure body 1192 via the transparent thin film adhesive layer 189.

In the color filter 180*a* of the example, color conversion parts are arranged in the positive direction of the X-axis in the order of red, green, and blue. For the red color conversion part, a red color conversion layer 183R is located in the layer at the transparent thin film adhesive layer 189 side. For the green color conversion part, the green color conversion layer 183G is located in the layer at the transparent thin film adhesive layer 189 side. For the red color conversion part and the green color conversion part, the filter layers 184*a* are located in the layer at the glass substrate 186 side. For the blue color conversion part in the example, the single-layer color conversion layer 183B is located from the glass substrate 186 side to the transparent thin film adhesive layer 189 side. The configuration is not limited thereto; the filter layer 184*a* may be provided at the glass substrate 186 side similarly to the other colors. The frequency characteristic of the filter layer 184 may be the same characteristic for all of the colors of the color conversion parts and may be a different characteristic for each color of the color conversion parts. The light-shielding part 181*a* is located between the color conversion parts.

As shown by the arrow of FIG. 11, the color filter 180*a* is adhered to the structure body 1192 via the transparent thin film adhesive layer 189 by aligning the positions of the color conversion layers 183R, 183G, and 183B of the colors with the positions of the light-emitting elements 150.

Subsequently, the reinforcing substrate 1180 is removed together with the adhesive layer 1170; however, the image display device may be made without removing the reinforcing substrate 1180 and the adhesive layer 1170.

Thus, the color filters 180 and 180*a* are formed in the structure body 1192 including the light-emitting element 150 and the circuit 101, and the subpixels are formed. An appropriate technique for the color filter is selected among inkjet techniques, film techniques, and other techniques that can form an equivalent color filter. By forming the color filter 180 by inkjet printing, the film adhesion process, etc., can be omitted, and the image display device 1 shown in FIG. 3 can be manufactured more inexpensively.

It is desirable to make the color conversion layer 183 as thick as possible to increase the color conversion efficiency for both the color filter 180 formed by inkjet printing and the film-type color filter 180*a*. On the other hand, when the color conversion layer 183 is too thick, the light emitted by the color conversion approximates Lambertian, but the blue light that is not color-converted has an emission angle limited by the light-shielding part 181. Therefore, a problem undesirably occurs in that the display color of the display image has viewing angle dependence. To match the light distribution of the light of the subpixels in which the color conversion layer 183 is provided with the light distribution of the blue light that is not color-converted, it is desirable to set the thickness of the color conversion layer 183 to be about half of the opening size of the light-shielding part 181.

For example, in the case of a high-definition image display device of about 250 ppi (pitch per inch), the pitch of the subpixels 20 is about 30 μm, and so it is desirable for the thickness of the color conversion layer 183 to be about 15 μm. Here, when the color conversion material is made of spherical fluorescer particles, it is favorable to stack in a close-packed structure to suppress light leakage from the light-emitting element 150. It is therefore necessary to use at least three layers of particles. Accordingly, it is favorable for the particle size of the fluorescer material included in the color conversion layer 183 to be, for example, not more than about 5 μm, and more favorably not more than about 3 μm.

After the color filters 180 and 180*a* are formed, the structure body 1192 shown in FIG. 10D, etc., is diced together with the color filters 180 and 180*a* to form the image display device. The formation process of the color filters 180 and 180*a* may be performed after dicing the structure body 1192.

FIG. 12 is a schematic perspective view illustrating the image display device according to the embodiment.

In the image display device of the embodiment as shown in FIG. 12, a light-emitting circuit part 172 that includes many light-emitting elements 150 is located on the color filter 180. In addition to the light-emitting element 150, the light-emitting circuit part 172 includes the light-shielding electrode 160*a* and the first inter-layer insulating film 156. The circuit 101 that includes circuit elements including the transistor 103, etc., is located on the light-emitting circuit part 172 with the TFT underlying film 106 shown in FIG. 1 interposed. The circuit 101 and the light-emitting circuit part 172 are electrically connected by the vias 161*a* and 161*k* shown in FIG. 1.

Modification

FIG. 13 is a schematic perspective view illustrating an image display device according to a modification of the embodiment.

The image display device of the first embodiment described above includes the color filter 180, but may be a monochromatic light-emitting image display device without providing a color filter as shown in FIG. 13.

Effects of the image display device 1 of the embodiment will now be described.

According to the method for manufacturing the image display device 1 of the embodiment, the light-emitting element 150 is formed by performing crystal growth of the semiconductor layer 1150 on the substrate 102 and by etching the semiconductor layer 1150. Subsequently, the light-emitting element 150 is covered with the first inter-layer insulating film 156, and the circuit 101 that includes the circuit elements such as the transistor 103, etc., driving the light-emitting element 150 is made on the first inter-layer insulating film 156. Therefore, the manufacturing processes are markedly reduced compared to when singulated light-emitting elements are individually transferred to the substrate 102.

According to the method for manufacturing the image display device 1 of the embodiment, the metal seed layer 1130*a* can be formed by monocrystallizing the metal layer 1130 formed on the substrate 102, and can be used as the seed for performing crystal growth of the semiconductor layer 1150. For example, sufficiently high productivity can be realized because the monocrystallization of the metal layer 1130 can be performed by laser annealing treatment.

For example, in an image display device having 4K image quality, the number of subpixels is greater than 24 million, and in the case of an image display device having 8K image quality, the number of subpixels is greater than 99 million. When individually forming and mounting such a large quantity of light-emitting elements to a circuit board, an enormous amount of time is necessary. It is therefore difficult to realize an image display device that uses micro LEDs at a realistic cost. Also, when individually mounting a large quantity of light-emitting elements, the yield decreases due to connection defects when mounting, etc., and an even higher cost is unavoidable; however, the method for manufacturing the image display device of the embodiment provides the following effects.

According to the method for manufacturing the image display device 1 of the embodiment, the transfer process of the light-emitting elements 150 can be reduced because the light-emitting elements 150 are formed after forming the entire semiconductor layer 1150 on the metal seed layer 1130*a* formed on the substrate 102. Therefore, according to the method for manufacturing the image display device 1 of the embodiment, compared to a conventional manufacturing method, the time of the transfer process can be reduced, and the number of processes can be reduced.

Because the semiconductor layer 1150 that has a uniform crystal structure is grown on the metal seed layer 1130*a* of the single-crystal metal, the light-emitting element 150 can be provided with self-alignment by appropriately patterning the metal seed layer 1130*a*. This is favorable for a higher-definition display because alignment of the light-emitting elements on the substrate 102 is unnecessary, and it is easy to downsize the light-emitting element 150.

After the light-emitting element is formed directly on the substrate 102 by etching, etc., the light-emitting element 150 and the circuit element formed in a higher layer than the light-emitting element 150 are electrically connected by via formation; therefore, a uniform connection structure can be realized, and the reduction of the yield can be suppressed.

According to the embodiment, for example, the light-emitting element 150 on a glass substrate formed as described above can be covered with the first inter-layer insulating film 156, and a drive circuit, a scanning circuit, and the like including TFTs, etc., can be formed on a planarized surface by using a LTPS process, etc. A LTPS process is advantageous in that existing manufacturing processes and plants of flat panel displays can be utilized, the thermal stress on the light-emitting element 150 of the lower layer, etc., can be reduced, and the yield can be increased.

According to the embodiment, the light-emitting element 150 that is formed in a lower layer than the transistor 103, etc., can be electrically connected to a power supply line, a ground line, a drive transistor, etc., formed in an upper layer by forming vias extending through the first inter-layer insulating film 156, the TFT underlying film 106, the insulating layer 105, and the second inter-layer insulating film 108. Thus, a uniform connection structure can be easily realized using the technically-established multilevel wiring technology, and the yield can be increased. Accordingly, the reduction of the yield due to connection defects of the light-emitting elements, etc., is suppressed.

Although the transistor 103 is formed above the light-emitting element 150 in the image display device 1 of the embodiment, the light-shielding electrode 160*a* is formed over the upper surface 153U of the light-emitting element 150. Therefore, the scattered light and the like radiated upward from the light-emitting element 150 is prevented from reaching the transistor 103 by the light-shielding electrode 160*a*. Therefore, malfunction of the transistor 103 is prevented.

The light-shielding electrode 160*a* can have high light reflectivity by appropriately selecting a conductive material. By providing a light-reflective light-shielding electrode 160*a*, the upward-scattered light and the like can be reflected toward the light-emitting surface 151S side, and the substantial luminous efficiency can be increased.

Second Embodiment

Figure 14:
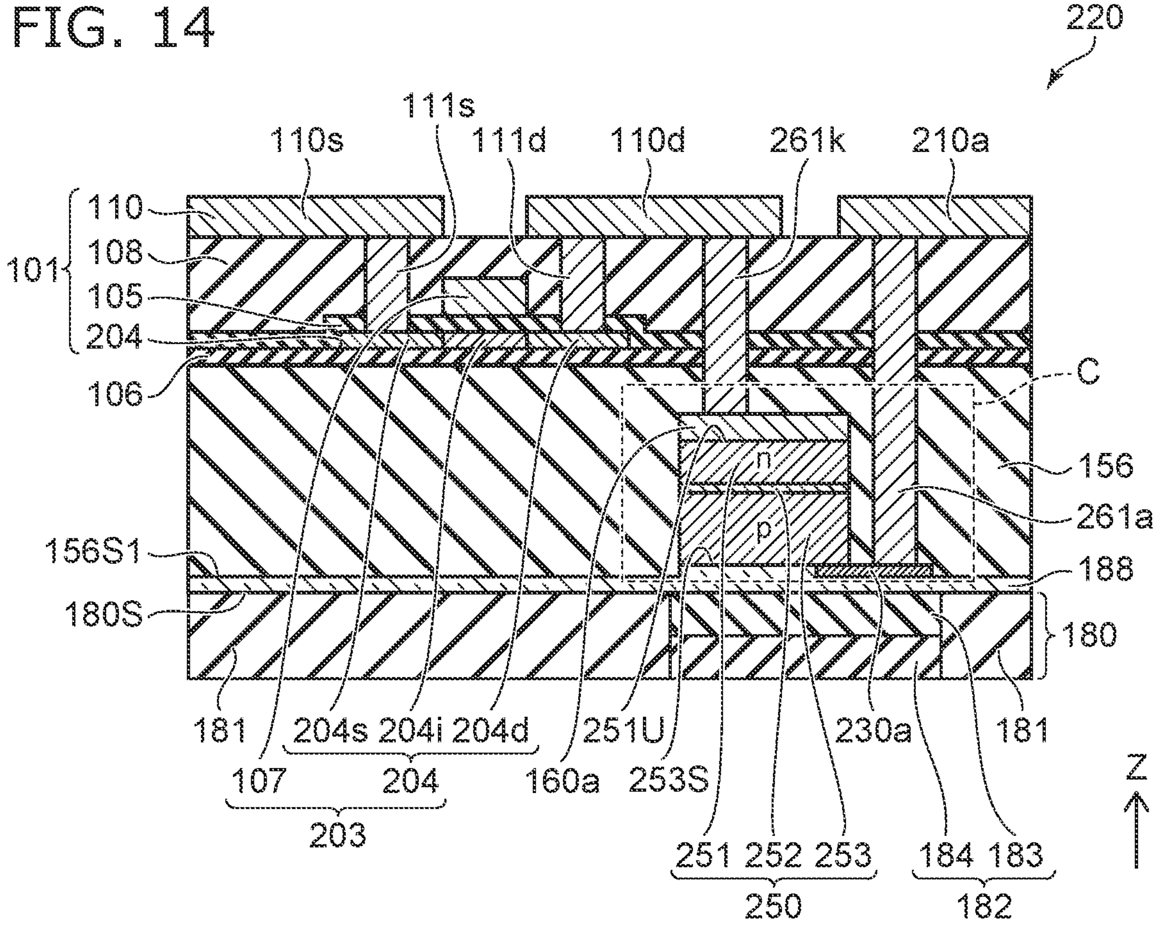
FIG. 14 is a schematic cross-sectional view illustrating a portion of an image display device according to a second embodiment.

FIG. 14 is a schematic cross-sectional view illustrating a portion of an image display device according to the embodiment.

In a subpixel 220 of the image display device of the embodiment as shown in FIG. 14, the configurations of a light-emitting element 250 and a transistor 203 are different from those of the other embodiment described above. Specifically, the subpixel 220 differs from that of the other embodiment described above in that a light-emitting surface 253S of the light-emitting element 250 is provided by a p-type semiconductor layer 253, and the transistor 203 has an n-channel. The subpixel 220 also differs from that of the other embodiment described above in that the p-type semiconductor layer 253 and a via 261*a* are connected by a connection plate 230*a*. The same components as those of the other embodiment are marked with the same reference numerals, and a detailed description is omitted as appropriate.

The image display device of the embodiment includes the subpixel 220. The subpixel 220 includes the light-emitting element 250, the light-shielding electrode 160*a*, the first inter-layer insulating film 156, the transistor (the circuit element) 203, the second inter-layer insulating film 108, a via (a first via) 261*k*, and the wiring layer 110.

The light-emitting element 250 is located on the color filter 180. The first inter-layer insulating film 156 that covers the side surface of the light-emitting element 250 also is located on the color filter 180. The surface of the light-emitting element 250 on the color filter 180 is the light-emitting surface 253S. The surface of the first inter-layer insulating film 156 on the color filter 180 is the first surface 156S1. The light-emitting surface 253S and the first surface 156S1 are connected to the color filter 180 via the transparent resin layer 188. The transparent resin layer 188 is provided to planarize the light-emitting surface 253S and the first surface 156S1 and to connect the color filter 180.

The connection plate (the second connection part) 230*a* is a plate-shaped member including two surfaces. One surface of the connection plate 230*a* is connected to a surface including the light-emitting surface 253S of the p-type semiconductor layer 253. The connection plate 230*a* is provided to protrude in one direction from surface including the light-emitting surface 253S over the color filter 180. One end of the via 261*a* is connected to the surface of the connection plate 230*a* connected to the surface including the light-emitting surface 253S. The surface of the connection plate 230*a* at the side opposite to the surface connected to the one end of the via 261*a* is covered with the transparent resin layer 188.

The light-emitting element 250 radiates light via the light-emitting surface 253S, the transparent resin layer 188, and the color filter 180. The light-emitting element 250 includes an upper surface 251U located at the side opposite to the light-emitting surface 253S. Similarly to the other embodiment described above, the light-emitting element 250 is a prismatic or cylindrical element.

The light-emitting element 250 includes the p-type semiconductor layer 253, a light-emitting layer 252, and an n-type semiconductor layer 251. The p-type semiconductor layer 253, the light-emitting layer 252, and the n-type semiconductor layer 251 are stacked in this order from the light-emitting surface 253S toward the upper surface 251U. According to the embodiment, the light-emitting surface 253S is provided by the p-type semiconductor layer 253. The upper surface 251U is the surface at the side opposite to the light-emitting surface 253S.

The light-emitting element 250 has a shape similar to that of the light-emitting element 150 of the other embodiment described above when projected onto the XY plane. An appropriate shape is selected according to the layout of the circuit elements, etc.

The light-emitting element 250 is a light-emitting diode similar to the light-emitting element 150 of the other embodiment described above. In other words, the wavelength of the light emitted by the light-emitting element 250 is, for example, a blue light emission of about 467 nm±30 nm or a bluish-violet light emission of about 410 nm±30 nm. The wavelength of the light emitted by the light-emitting element 250 is not limited to such values and can be an appropriate value.

The transistor 203 is located on the TFT underlying film 106. The transistor 203 is an n-channel TFT. The transistor 203 includes the TFT channel 204 and the gate 107. Similarly to the other embodiment described above, the transistor 203 is favorably formed by a LTPS process, etc. In the description of the embodiment, the circuit 101 includes the TFT channel 204, the insulating layer 105, the second inter-layer insulating film 108, the vias 111*s* and 111*d*, and the wiring layer 110.

The TFT channel 204 includes regions 204*s*, 204*i*, and 204*d*. The regions 204*s*, 204*i*, and 204*d* are located on the TFT underlying film 106. The regions 204*s* and 204*d* form n-type semiconductor regions by being doped with an impurity such as phosphorus (P) or the like and by being activated. The region 204*s* has an ohmic connection with the via 111*s*. The region 204*d* has an ohmic connection with the via 111*d*.

The gate 107 is located on the TFT channel 204 via the insulating layer 105. The insulating layer 105 insulates the TFT channel 204 and the gate 107.

In the transistor 203, a channel is formed in the region 204*i* when a higher voltage than that of the region 204*s* is applied to the gate 107. The current that flows between the regions 204*s* and 204*d* is controlled by the voltage of the gate 107 with respect to the region 204*s*. The TFT channel 204 and the gate 107 are formed using materials and formation methods similar to those of the TFT channel 104 and the gate 107 according to the other embodiment described above.

The wiring layer 110 includes the wiring parts 110*s*, 110*d*, and 210*a*. A portion of the wiring part 210*a* (the second wiring part) is located above the connection plate 230*a*. For example, another part of the wiring part 210*a* is connected to the power supply line 3 shown in FIG. 16 below.

The vias 111*s* and 111*d* extend through the second inter-layer insulating film 108. The via 111*s* is located between the wiring part 110*s* and the region 204*s*. The via 111*s* electrically connects the wiring part 110*s* and the region 204*s*. The via 111*d* is located between the wiring part 110*d* and the region 204*d*. The via 111*d* electrically connects the wiring part 110*d* and the region 204*d*. The vias 111*s* and 111*d* are formed using materials and formation methods similar to those of the other embodiment described above.

The via (the first via) 261*k* extends through the second inter-layer insulating film 108, the insulating layer 105, the TFT underlying film 106, and the first inter-layer insulating film 156 and reach the light-shielding electrode 160*a*. The via 261*k* is located between the wiring part (the first wiring part) 110*d* and the light-shielding electrode 160*a* and electrically connects the wiring part 110*d* and the light-shielding electrode 160*a*. Accordingly, the n-type semiconductor layer 251 is electrically connected to the region 204*d* forming the drain electrode of the transistor 203 via the light-shielding electrode 160*a*, the via 261*k*, the wiring part 110*d*, and the via 111*d*.

The via (the second via) 261*a* extends through the second inter-layer insulating film 108, the insulating layer 105, the TFT underlying film 106, and the first inter-layer insulating film 156 and reach the connection plate (the second connection part) 230*a*. The via 261*a* is located between the wiring part (the second wiring part) 210*a* and the connection plate 230*a* and electrically connects the wiring part 210*a* and the connection plate 230*a*. Accordingly, for example, the p-type semiconductor layer 253 is electrically connected to the power supply line 3 of the circuit of FIG. 16 via the connection plate 230*a*, the via 261*a*, and the wiring part 210*a*.

Figure 15:
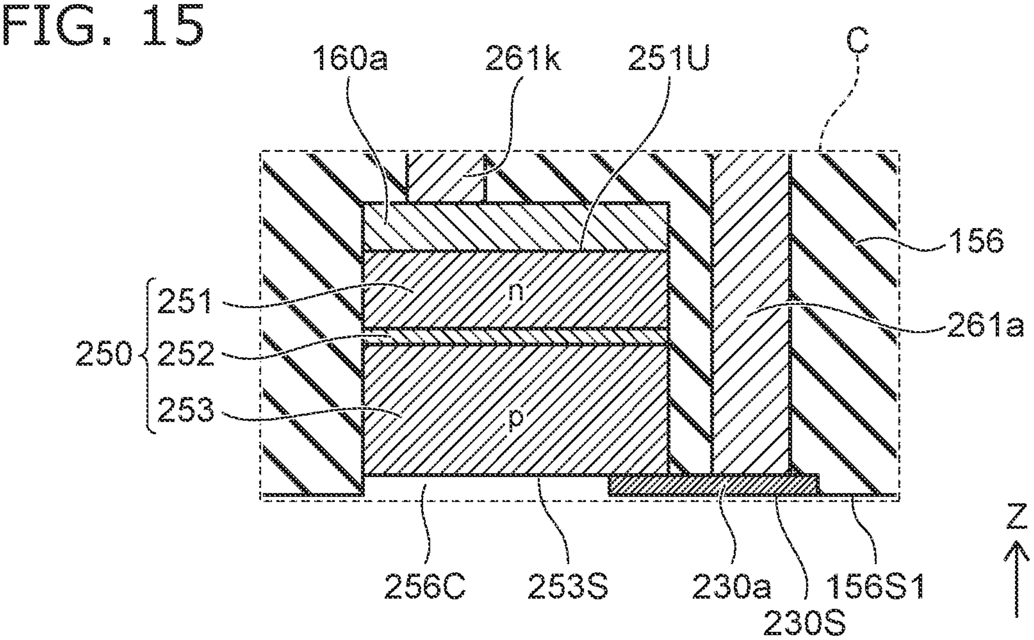
FIG. 15 is an enlarged schematic view of portion C of FIG. 14.

FIG. 15 is an enlarged schematic view of portion C of FIG. 14.

The Z-axis direction positional relationship of the light-emitting surface 253S and the first surface 156S1 of the first inter-layer insulating film 156 as well as the connectional relationship of the connection plate 230*a* and the surface including the light-emitting surface 253S are shown in detail in FIG. 15. Similarly to the other embodiment described above with reference to FIG. 2, the first surface 156S1 is the surface of the first inter-layer insulating film 156 at the light-emitting surface 253S side.

As shown in FIG. 15, the first inter-layer insulating film 156 includes the first surface 156S1. A recess 256C is formed by the first inter-layer insulating film 156, the connection plate 230*a*, and the light-emitting surface 253S. The recess 256C is surrounded with the connection plate 230*a* of the first inter-layer insulating film 156 and the light-emitting surface 253S and provided to be recessed from the first surface 156S1 in the positive direction of the Z-axis.

The connection plate 230*a* is connected to the light-emitting surface 253S at the surface connected to the one end of the via 261*a*. A surface 230S at the side opposite to the surface connected to the one end of the via 261*a* is a surface in substantially the same plane as the first surface 156S1.

The light-emitting surface 253S is positioned further in the positive direction of the Z-axis than the first surface 156S1 and the surface 230S of the connection plate 230*a* and is a plane that is substantially parallel to the first surface 156S1 and the surface 230S. The shift of the position of the light-emitting surface 253S from the position of the first surface 156S1 and the surface 230S is substantially equal to the length in the Z-axis direction of the connection plate 230*a*, i.e., the thickness of the connection plate 230*a*.

The transparent resin layer 188 shown in FIG. 14 is filled into the recess 256C, and the light-emitting surface 253S is connected to the color filter via the transparent resin layer 188 filled into the recess 256C.

Figure 16:
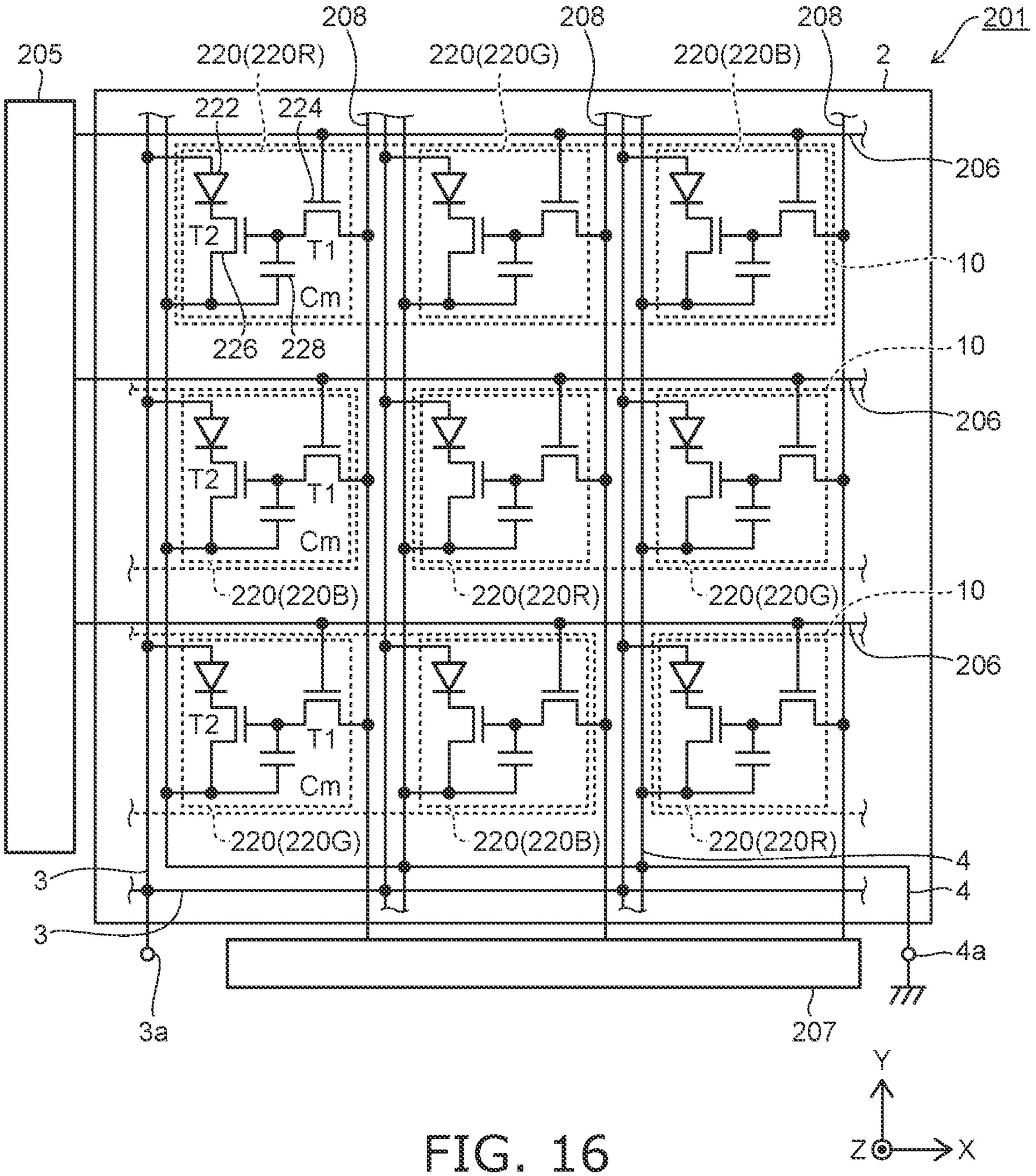
FIG. 16 is a schematic block diagram illustrating the image display device of the second embodiment.

FIG. 16 is a schematic block diagram illustrating the image display device of the embodiment.

As shown in FIG. 16, the image display device 201 of the embodiment includes the display region 2, a row selection circuit 205, and a signal voltage output circuit 207. In the display region 2, similarly to the other embodiment described above, for example, the subpixels 220 are arranged in a lattice shape in the XY plane.

Similarly to the other embodiment described above, the pixel 10 includes the multiple subpixels 220 that emit light of different colors. A subpixel 220R emits red light. A subpixel 220G emits green light. A subpixel 220B emits blue light. The light emission color and luminance of one pixel 10 are determined by the three types of the subpixels 220R, 220G, and 220B emitting light of the desired luminances.

One pixel 10 includes three subpixels 220R, 220G, and 220B; for example, the subpixels 220R, 220G, and 220B are arranged in a straight line along the X-axis as in the example. In the pixels 10, subpixels of the same color may be arranged in the same column, or subpixels of different colors may be arranged in each column as in the example.

The subpixel 220 includes a light-emitting element 222, a select transistor 224, a drive transistor 226, and a capacitor 228. In FIG. 16, the select transistor 224 may be displayed as T1, the drive transistor 226 may be displayed as T2, and the capacitor 228 may be displayed as Cm.

According to the embodiment, the light-emitting element 222 is located at the power supply line 3 side, and the drive transistor 226 that is connected in series to the light-emitting element 222 is located at the ground line 4 side. That is, the drive transistor 226 is connected to a lower potential side than the light-emitting element 222. The drive transistor 226 is an n-channel transistor.

The select transistor 224 is connected between a signal line 208 and the gate electrode of the drive transistor 226. The capacitor 228 is connected between the power supply line 3 and the gate electrode of the drive transistor 226.

To drive the drive transistor 226 that is an n-channel transistor, the row selection circuit 205 and the signal voltage output circuit 207 supply, to the signal line 208, a signal voltage that has a different polarity from that of the other embodiment described above.

According to the embodiment, because the polarity of the drive transistor 226 is an n-channel, the polarity of the signal voltage and the like are different from those of the other embodiment described above. Specifically, the row selection circuit 205 supplies a select signal to a scanning line 206 to sequentially select one row from the arrangement of the m rows of subpixels 220. The signal voltage output circuit 207 supplies a signal voltage having an analog voltage value necessary for the subpixels 220 of the selected row. The drive transistors 226 of the subpixels 220 of the selected row allow currents corresponding to the signal voltage to flow in the light-emitting elements 222. The light-emitting elements 222 emit light of luminances corresponding to the currents that flow.

A manufacturing method of the embodiment will now be described.

FIGS. 17A to 19B are schematic cross-sectional views illustrating a portion of the method for manufacturing the image display device of the embodiment.

The substrate 102 described with reference to FIG. 5A of the other embodiment described above is used in the example. The metal layer 1130 is formed on the substrate surface 102*a* of the substrate 102. In the following description, FIG. 17A and subsequent processes are applied after the process of FIG. 5A.

Figure 17A:
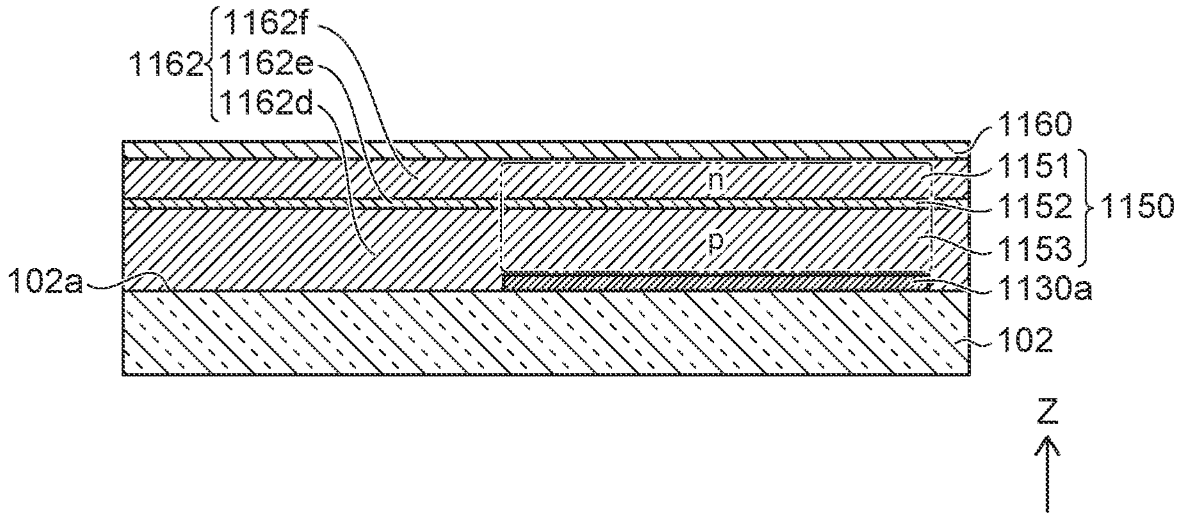
FIG. 17A is a schematic cross-sectional view illustrating a portion of a method for manufacturing the image display device of the second embodiment.

As shown in FIG. 17A, the semiconductor layer 1150 is formed over the monocrystallized metal seed layer 1130*a*. The semiconductor layer 1150 includes the p-type semiconductor layer 1153, the light-emitting layer 1152, and the n-type semiconductor layer 1151 formed in this order from the metal seed layer 1130*a* in the positive direction of the Z-axis. The semiconductor layer 1150 is formed over the metal seed layer 1130*a* as illustrated by the double dot-dash line of FIG. 17A. Similarly to the other embodiment described above, there are cases where the amorphous deposit 1162 including materials of the growth species such as Ga is deposited on the substrate surface 102*a* at which the metal seed layer 1130*a* does not exist. In the example, the deposit 1162 includes deposits 1162*d*, 1162*e*, and 1162*f* stacked in this order from the substrate surface 102*a* in the positive direction of the Z-axis. In the illustration, the deposit 1162*d* is deposited when forming the p-type semiconductor layer 1153; the deposit 1162*e* is deposited when forming the light-emitting layer 1152, and the deposit 1162*f* is deposited when forming the n-type semiconductor layer 1151; however, configuration is not limited thereto.

The metal layer 1160 is formed on the semiconductor layer 1150. In the example, the metal layer 1160 also is formed on the deposit 1162. More specifically, the metal layer 1160 is formed on the n-type semiconductor layer 1151 and on the deposit 1162*f*.

Figure 17B:
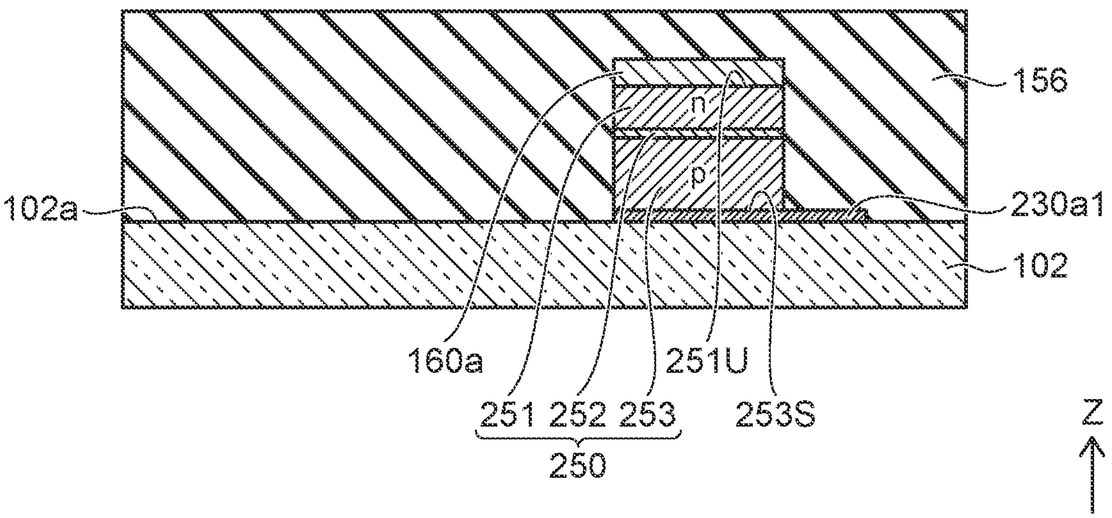
FIG. 17B is a schematic cross-sectional view illustrating a portion of the method for manufacturing the image display device of the second embodiment.

The light-shielding electrode 160*a*, the light-emitting element 250, and a connection plate 230*a*1 are formed as shown in FIG. 17B. The light-shielding electrode 160*a* is formed similarly to that of the other embodiment described above. The connection plate 230*a*1 is formed by etching the metal seed layer 1130*a* shown in FIG. 17A. The light-emitting element 250 is formed after forming the connection plate 230*a*1.

In the formation process of the connection plate 230*a*1, the connection plate 230*a*1 is formed to protrude in one direction from the light-emitting element 250 over the substrate surface 102*a*. When projected onto the XY plane, the outer perimeter of the connection plate 230*a*1 is set to include the outer perimeter of the light-emitting element 250 when the light-emitting element 250 is projected onto the connection plate 230*a*1. That is, the outer perimeter of the light-emitting element 250 is located within the outer perimeter of the connection plate 230*a*1. The protruding part of the connection plate 230*a*1 is formed to ensure a region for connecting one end of the via 261*a* shown in FIG. 19A below.

The connection plate 230*a*1 is patterned into the connection plate 230*a* shown in FIG. 14 in a subsequent process. The p-type semiconductor layer 253 of the light-emitting element 250 is connected to the via 261*a* by the connection plate 230*a* shown in FIG. 14; therefore, the light-emitting element 250 is shaped in a single prism or circular columnar shape without forming a connection part such as that of the other embodiment described above.

The first inter-layer insulating film 156 is formed after forming the light-shielding electrode 160*a*, the light-emitting element 250, and the connection plate 230*a*1. The first inter-layer insulating film 156 is formed to cover the substrate surface 102*a*, the connection plate 230*a*1, the light-emitting element 250, and the light-shielding electrode 160*a*.

Figure 18A:
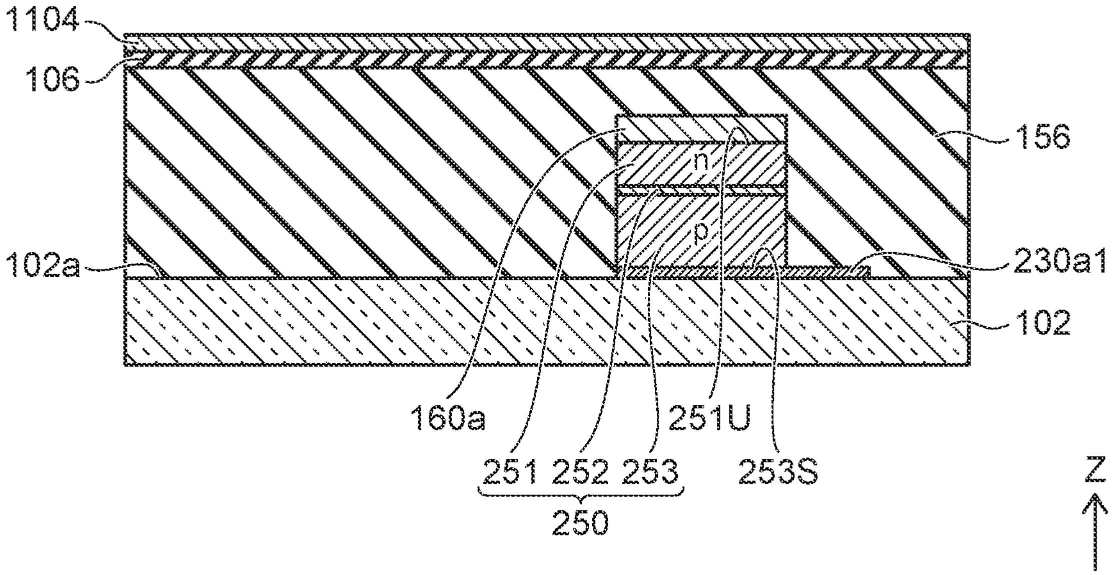
FIG. 18A is a schematic cross-sectional view illustrating a portion of the method for manufacturing the image display device of the second embodiment.

As shown in FIG. 18A, the TFT underlying film 106 is formed on the first inter-layer insulating film 156, and the Si layer 1104 is formed on the TFT underlying film 106 and polycrystallized.

Figure 18B:
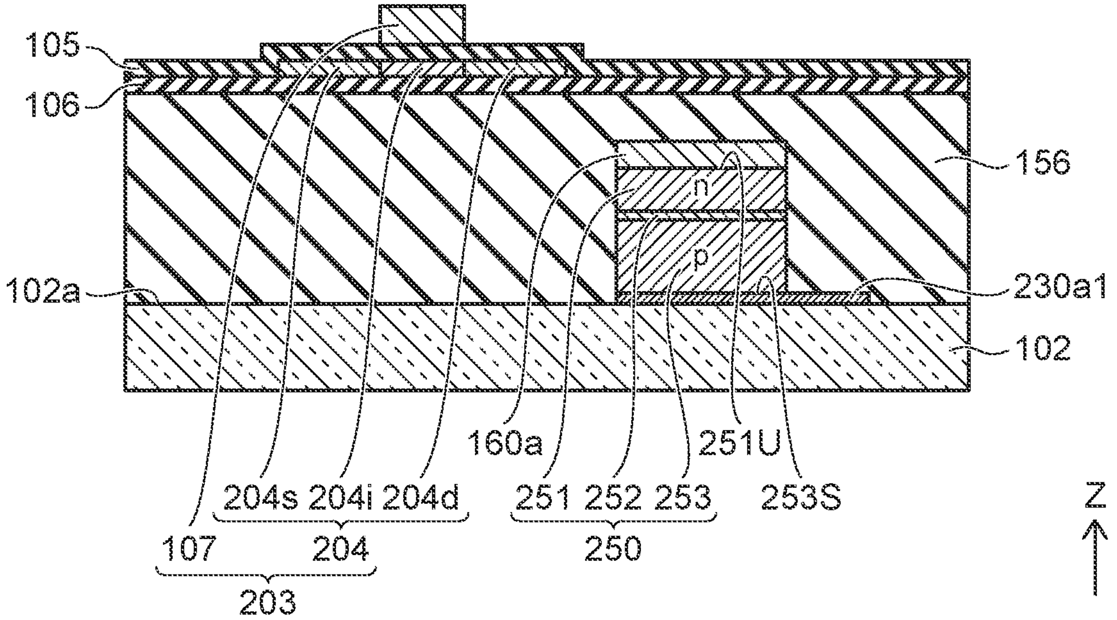
FIG. 18B is a schematic cross-sectional view illustrating a portion of the method for manufacturing the image display device of the second embodiment.

As shown in FIG. 18B, the polycrystallized Si layer 1104 shown in FIG. 18A is patterned into an island configuration to form the TFT channel 204. The insulating layer 105 is formed to cover the TFT underlying film 106 and the TFT channel 204. The insulating layer 105 functions as a gate insulating film. The gate 107 is formed on the TFT channel 204 with the insulating layer 105 interposed. The transistor (the circuit element) 203 is formed by selectively doping an impurity such as P or the like into the gate 107 and by thermal activation. The regions 204*s* and 204*d* are used as n-type active regions and function respectively as the source region and drain region of the transistor 203. The region 204*i* is used as a p-type active region and functions as a channel.

Figure 19A:
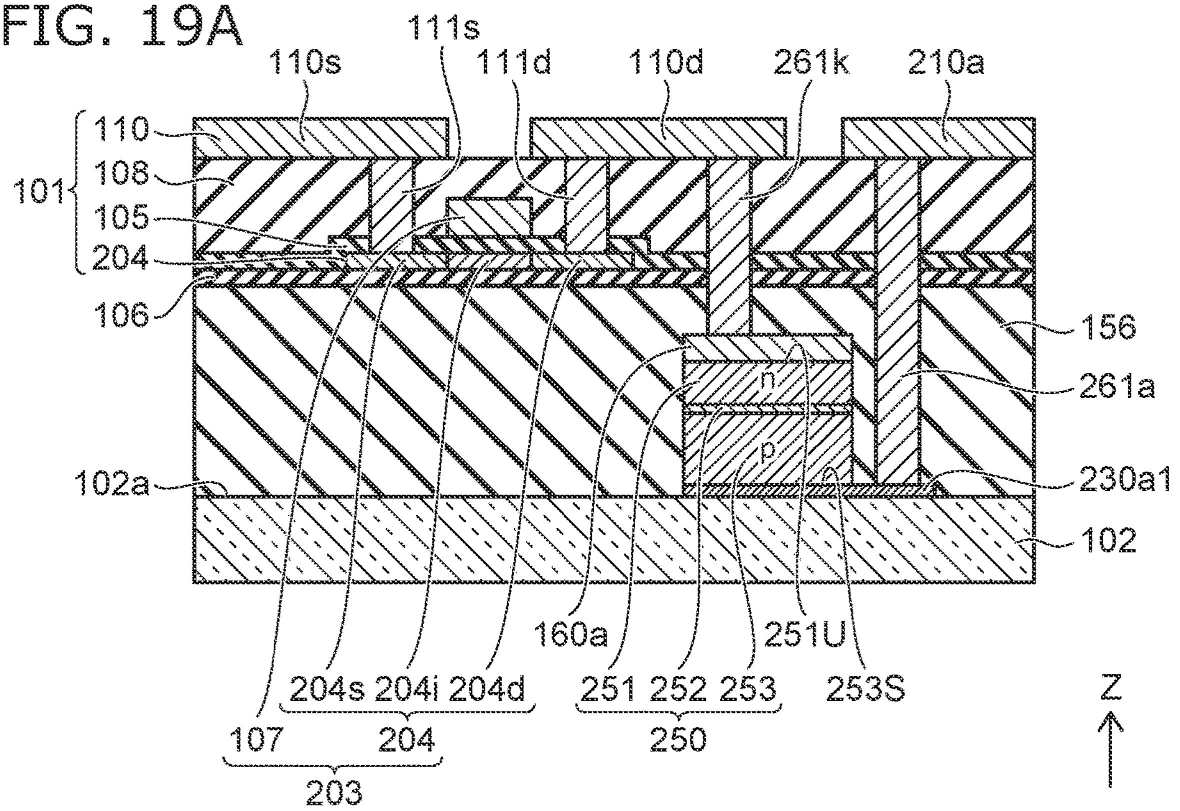
FIG. 19A is a schematic cross-sectional view illustrating a portion of the method for manufacturing the image display device of the second embodiment.

As shown in FIG. 19A, the second inter-layer insulating film 108 is formed to cover the insulating layer 105 and the transistor 203. The vias 111*s* and 111*d* are formed to extend through the second inter-layer insulating film 108 and the insulating layer 105. The via hole that is formed to extend through the second inter-layer insulating film 108, the insulating layer 105, the TFT underlying film 106, and the first inter-layer insulating film 156 and reach the light-shielding electrode 160*a* is filled with a conductive material to form the via 261*k*. The via 261*k* is electrically connected to the light-shielding electrode 160*a*. A via hole that is formed to extend through the second inter-layer insulating film 108, the insulating layer 105, the TFT underlying film 106, and the first inter-layer insulating film 156 and reach the connection plate 230*a*1 is filled with a conductive material to form the via 261*a*. The via 261*a* is electrically connected to the connection plate 230*a*1. The wiring parts 110*s*, 110*d*, and 210*a* of the wiring layer 110 are connected respectively to the vias 111*s*, 111*d*, 261*k*, and 261*a*.

Figure 19B:
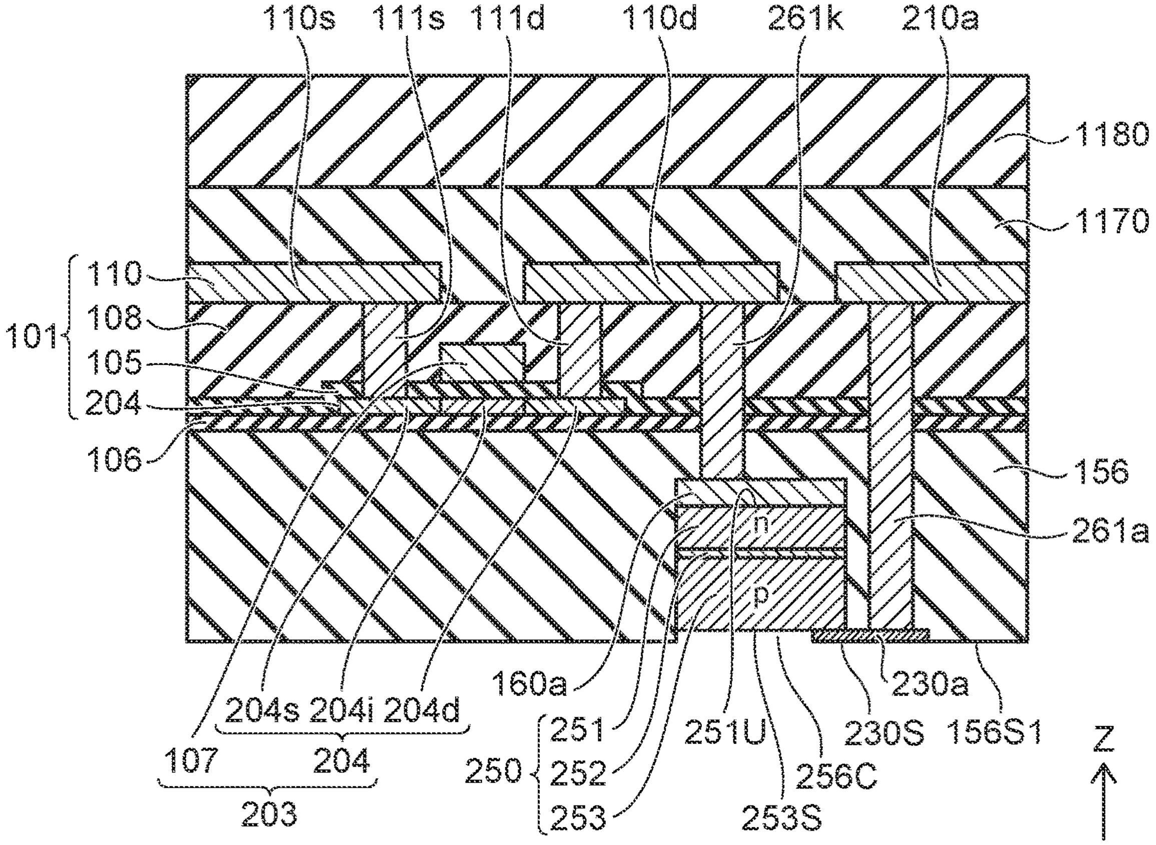
FIG. 19B is a schematic cross-sectional view illustrating a portion of the method for manufacturing the image display device of the second embodiment.

As shown in FIG. 19B, the adhesive layer 1170 is formed on the second inter-layer insulating film 108 and the wiring layer 110, and the reinforcing substrate 1180 is bonded to the adhesive layer 1170.

Subsequently, the substrate 102 is removed by wet etching, laser lift-off, etc. The connection plate (the second connection part) 230*a* is formed by patterning the connection plate (the first part) 230*a*1 shown in FIG. 19A to expose the light-emitting surface 253S. In the formation process of the connection plate 230*a*, the connection plate 230*a* is formed by etching so that the portion connected to the surface including the light-emitting surface 253S remains. The recess 256C is formed by forming the connection plate 230*a*.

Thereafter, a transparent resin layer is formed to cover the first surface 156S1, the light-emitting surface 253S, and the surface 230S of the connection plate 230*a*, and a color filter is formed with the transparent resin layer interposed. Thus, the subpixel 220 is formed.

Effects of the image display device of the embodiment will now be described.

Similarly to the other embodiment described above, the image display device of the embodiment has the effects of reducing the time of the transfer process for forming the light-emitting element 250 and reducing the number of processes. Also, the light-emitting surface 253S can be the p-type semiconductor layer 253 by setting the polarity of the TFT to be a p-channel. This is advantageous in that the degree of freedom of the circuit element arrangement and circuit design is increased, etc.

According to the embodiment, the connection plate 230*a* can be formed of a metal material and can have a high conductivity. Therefore, the p-type semiconductor layer 253 at the light-emitting surface 253S side can be connected to the via 261*a* with a low resistance.

Third Embodiment

Figure 20:
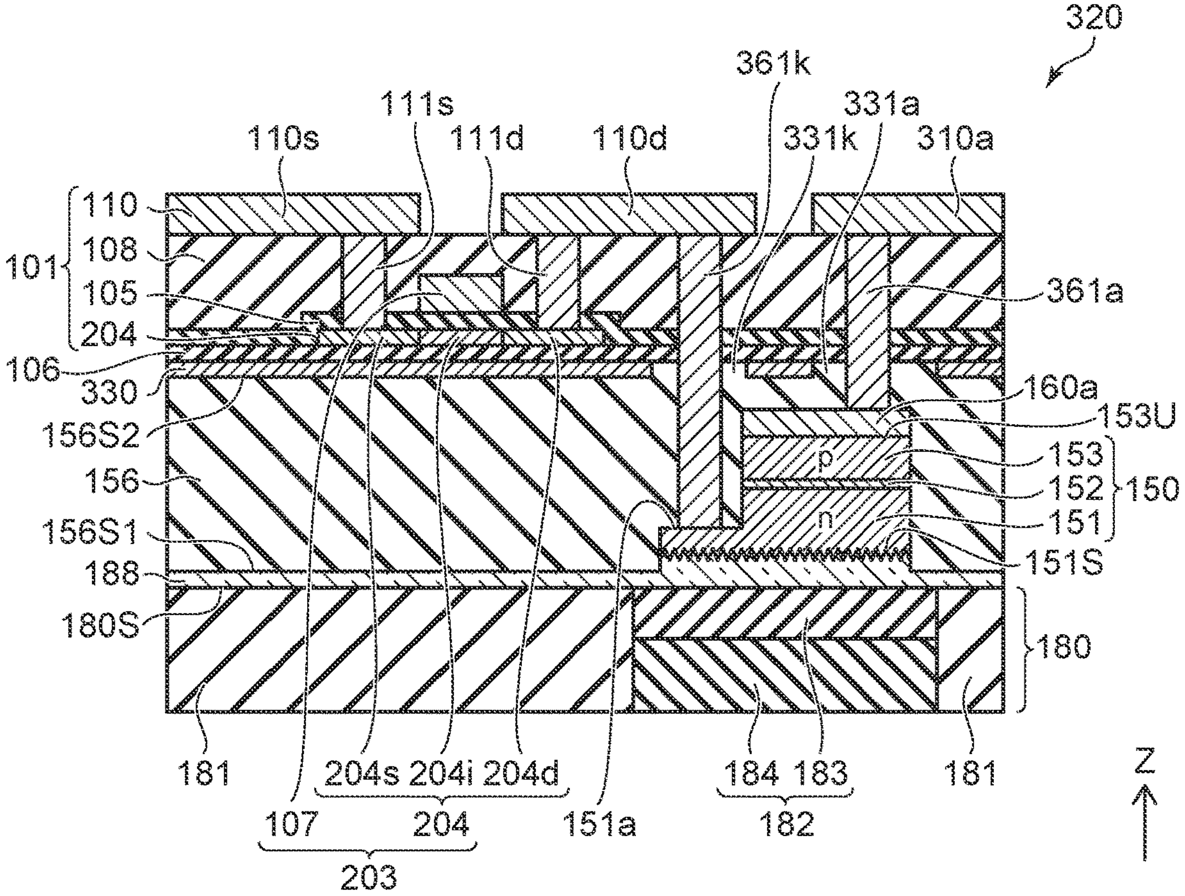
FIG. 20 is a schematic cross-sectional view illustrating a portion of an image display device according to a third embodiment.

FIG. 20 is a schematic cross-sectional view illustrating a portion of an image display device according to the embodiment.

The embodiment differs from the other embodiments described above in that the light-emitting element 150 in which the light-emitting surface 151S is provided by the n-type semiconductor layer 151 is driven by the n-channel transistor 203. The embodiment differs from the other embodiments described above in that a light-shielding layer 330 is located between the light-emitting element 150 and the transistor 203. The light-emitting element 150 of the embodiment differs from that of the other embodiments described above in that the light-emitting surface 151S is roughened. The same components as those of the other embodiments described above are marked with the same reference numerals, and a detailed description is omitted as appropriate.

As shown in FIG. 20, the image display device of the embodiment includes a subpixel 320. The subpixel 320 includes the light-emitting element 150, the light-shielding electrode 160*a*, the first inter-layer insulating film 156, the light-shielding layer 330, the transistor 203, the second inter-layer insulating film 108, a via (a first via) 361*a*, and the wiring layer 110. The subpixel 320 further includes the color filter 180.

According to the embodiment, the light-emitting element 250 is located on the color filter 180 and includes the roughened light-emitting surface 151S. The transparent resin layer 188 is located between the color filter 180 and the roughened light-emitting surface 151S. The transparent resin layer 188 also is located on the first surface 156S1 of the first inter-layer insulating film 156, and the light-emitting element 150 and the first inter-layer insulating film 156 are located on the color filter 180 with the transparent resin layer 188 interposed.

Similarly to the other embodiments described above, the light-emitting surface 151S is formed to be shifted from the position of the first surface 15651 in the positive direction of the Z-axis, and the transparent resin layer 188 forms a somewhat planarized plane for forming the color filter 180.

The light-emitting element 150 includes the n-type semiconductor layer 151, the light-emitting layer 152, and the p-type semiconductor layer 153 stacked in this order from the light-emitting surface 151S toward the upper surface 153U. The light-emitting surface 151S that is the n-type semiconductor layer 151 is located on the connection surface 180S. Accordingly, similarly to the first embodiment, the light-emitting element 150 radiates light in the negative direction of the Z-axis via the transparent resin layer 188 and the color conversion part 182 of the color filter 180.

The n-type semiconductor layer 151 includes the connection part 151*a*. The connection part 151*a* is provided to protrude in one direction from the n-type semiconductor layer 151 over the connection surface 180S. In the example, the connection part 151*a* is provided to protrude in a different direction from that of the first embodiment. The shape and configuration of the connection part 151*a* are similar to those of the first embodiment, and the shape and configuration of the light-emitting element 150 are similar to those of the first embodiment. One end of a via 361*k* is connected to the connection part 151*a*.

The light-shielding layer 330 is located between the first inter-layer insulating film 156 and the second inter-layer insulating film 108. The TFT underlying film 106 and the insulating layer 105 are located between the first inter-layer insulating film 156 and the second inter-layer insulating film 108, and more specifically, the light-shielding layer 330 is located between the first inter-layer insulating film 156 and the TFT underlying film 106. That is, the light-shielding layer 330 is provided over a second surface 156S2 at the side opposite to the first surface 156S1. The light-shielding layer 330 is located at the entire surface between the first inter-layer insulating film 156 and the TFT underlying film 106 other than a portion.

The light-shielding layer 330 is formed of a light-shielding material. For example, the light-shielding layer 330 is formed of a light-reflective metal material as in the example, and may not be conductive as long as the material is light-shielding. The light-shielding layer 330 includes through-holes 331*a* and 331*k*. The through-hole 331*a* is located at a position of the light-shielding layer 330 that allows the via 361*a* to pass when projected onto the XY plane. The diameter of the through-hole 331*a* is set to be greater than the diameter of the via 361*a* so that the light-shielding layer 330 does not contact the via 361*a* when the via 361*a* passes through the through-hole 331*a*. The through-hole 331*k* is located at a position of the light-shielding layer 330 that allows the via 361*k* to pass when projected onto the XY plane. The diameter of the through-hole 331*k* is set to be greater than the diameter of the via 361*k* so that the light-shielding layer 330 does not contact the via 361*k* when the via 361*k* passes through the through-hole 331*k*.

The via 361*a* extends through the second inter-layer insulating film 108, the insulating layer 105, the TFT underlying film 106, the light-shielding layer 330, and the first inter-layer insulating film 156 and reach the light-shielding electrode 160*a*. The via 361*k* extends through the second inter-layer insulating film 108, the insulating layer 105, the TFT underlying film 106, the light-shielding layer 330, and the first inter-layer insulating film 156 and reach the connection part 151*a*.

Although the light-shielding layer 330 is formed of a metal material in the description described above, the light-shielding layer 330 may be formed of a black resin that is not conductive. When the light-shielding layer 330 is formed of a black resin, a via can be formed together with the first inter-layer insulating film 156, etc., by forming a via hole and filling the via hole with a conductive material without pre-forming the through-holes 331*k* and 331*a* having larger diameters than the vias 361*k* and 361*a*.

The light-shielding layer 330 is provided to cover the TFT channel 204. When projected onto the XY plane, the light-shielding layer 330 is formed to include the outer perimeter of the TFT channel 204 when the TFT channel 204 is projected onto the light-shielding layer 330. That is, the outer perimeter of the TFT channel 204 is located inward of the light-shielding layer 330 when projected onto the XY plane. Due to the light-shielding layer 330, even when scattered light and the like is radiated upward from the light-emitting element 150 located below the TFT channel 204, the scattered light and the like is shielded by the light-shielding layer 330, and malfunction of the transistor 203 can be suppressed because the scattered light and the like substantially cannot reach the TFT channel.

Although it is desirable, from the perspective of being light-shielding, to provide the light-shielding layer 330 over the entire surface between the first inter-layer insulating film 156 and the second inter-layer insulating film 108 as in the example, the light-shielding layer 330 is not limited to being one physical member. For example, the light-shielding layer 330 may be divided into a part directly under the TFT channel 204 and a part directly above the light-emitting element 150. Although the light-shielding layer 330 is not connected to any potential in the example, the light-shielding layer 330 may be connected to a specific potential such as a ground potential, a power supply potential, etc. When the light-shielding layer 330 includes multiple separated parts, all of the parts may be set to a common potential, or each part may be connected to a different potential.

According to the embodiment, both the light-shielding electrode 160*a* and the light-shielding layer 330 function as light-shielding members for the circuit elements including the TFT channel 204. That is, according to the embodiment, malfunction of the circuit elements is sufficiently prevented because the light that reaches the circuit elements is suppressed by two light-shielding members.

The wiring layer 110 is located on the second inter-layer insulating film 108. The wiring layer 110 includes the wiring parts 110*s*, 110*d*, and 310*a*.

The via 111*s* is located between the wiring part 110*s* and the region 204*s* and electrically connects the wiring part 110*s* and the region 204*s*. The via 111*d* is located between the wiring part 110*d* and the region 204*d* and electrically connects the wiring part 110*d* and the region 204*d*.

The wiring part 110*s* is connected to the region 204*s* by the via 111*s*. The region 204*s* is a source region of the transistor 203. Accordingly, for example, the source region of the transistor 203 is electrically connected to the ground line 4 shown in FIG. 16 by the via 111*s* and the wiring part 110*s*.

The wiring part 110*d* is connected to the region 204*d* by the via 111*d*. The region 204*d* is a drain region of the transistor 203. One end of the wiring part 110*d* is located above the connection part 151*a*.

One end of the wiring part 310*a* is located above the light-emitting element 150 and the light-shielding electrode 160*a*. For example, the wiring part 310*a* is electrically connected to the power supply line 3 of FIG. 16.

The via 361*k* is located between the wiring part 110*d* and the connection part 151*a* and electrically connects the wiring part 110*d* and the connection part 151*a*. Accordingly, the drain region of the transistor 203 is electrically connected to the n-type semiconductor layer 151 by the via 111*d*, the wiring part 110*d*, the via 361*k*, and the connection part 151*a*.

The via 361*a* is located between the wiring part 310*a* and the light-shielding electrode 160*a* and electrically connects the wiring part 310*a* and the light-shielding electrode 160*a*. Accordingly, the p-type semiconductor layer 153 is electrically connected to the power supply line 3 via the light-shielding electrode 160*a*, the via 361*a*, and the wiring part 310*a*.

A method for manufacturing the image display device of the embodiment will now be described.

FIGS. 21A to 23 are schematic cross-sectional views illustrating a portion of the method for manufacturing the image display device of the embodiment.

Similarly to the first embodiment, the processes up to the process described with reference to FIG. 7A of the first embodiment described above are applied to the example. In the following description, the process of FIG. 21A and subsequent processes are applied after the process of FIG. 7A. However, as described above, the protruding direction of the connection part 151*a* according to the embodiment is different from that of FIG. 7A.

Figure 21A:
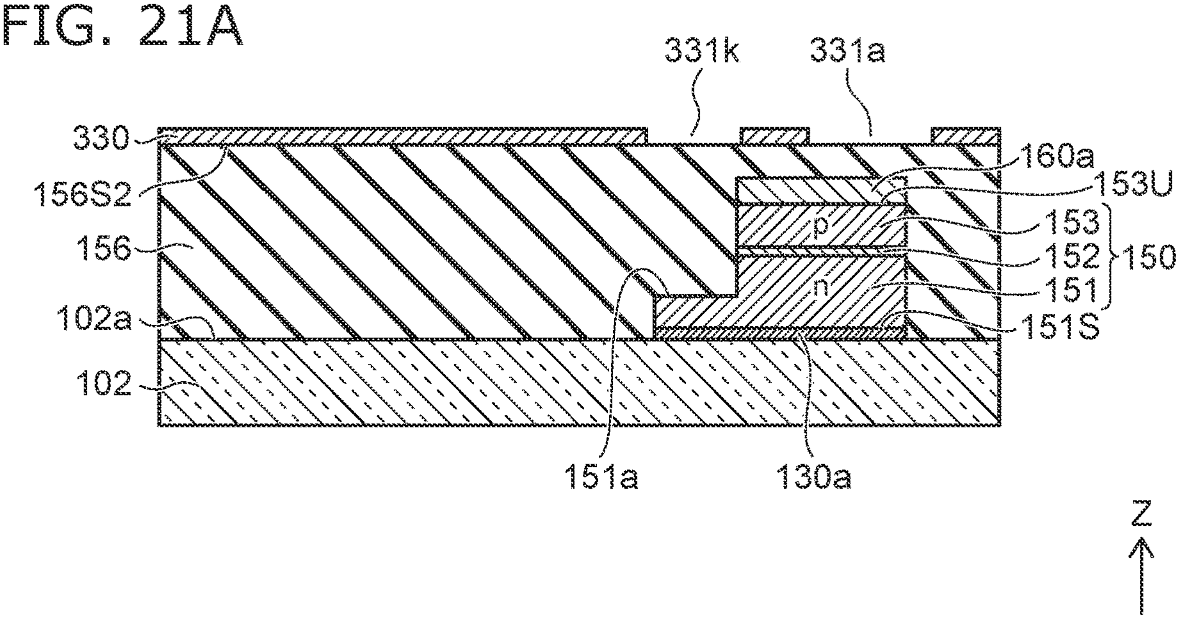
FIG. 21A is a schematic cross-sectional view illustrating a portion of a method for manufacturing the image display device of the third embodiment.

As shown in FIG. 21A, the light-shielding layer (the light-shielding member) 330 is formed over the second surface 156S2 of the first inter-layer insulating film 156. The through-holes 331*a* and 331*k* are formed to extend through the light-shielding layer 330 to expose the second surface 156S2.

Figure 21B:
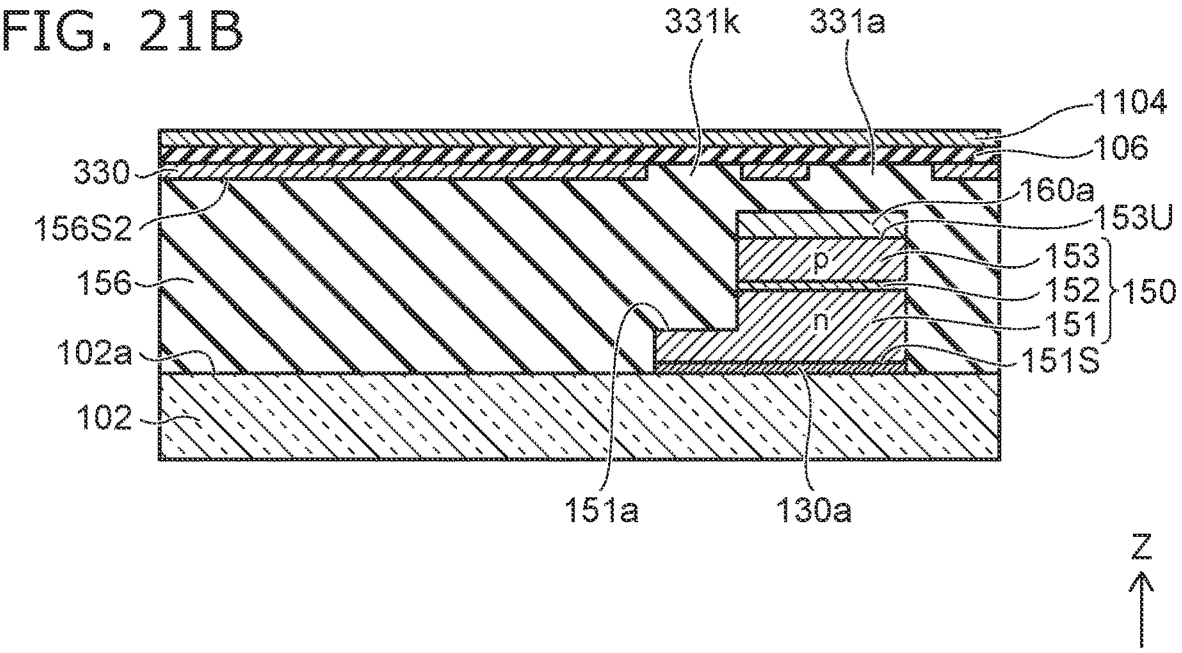
FIG. 21B is a schematic cross-sectional view illustrating a portion of the method for manufacturing the image display device of the third embodiment.

As shown in FIG. 21B, the TFT underlying film 106 is formed on the light-shielding layer 330 and the second surface 156S2, and the Si layer 1104 is formed on the TFT underlying film 106.

Figure 22A:
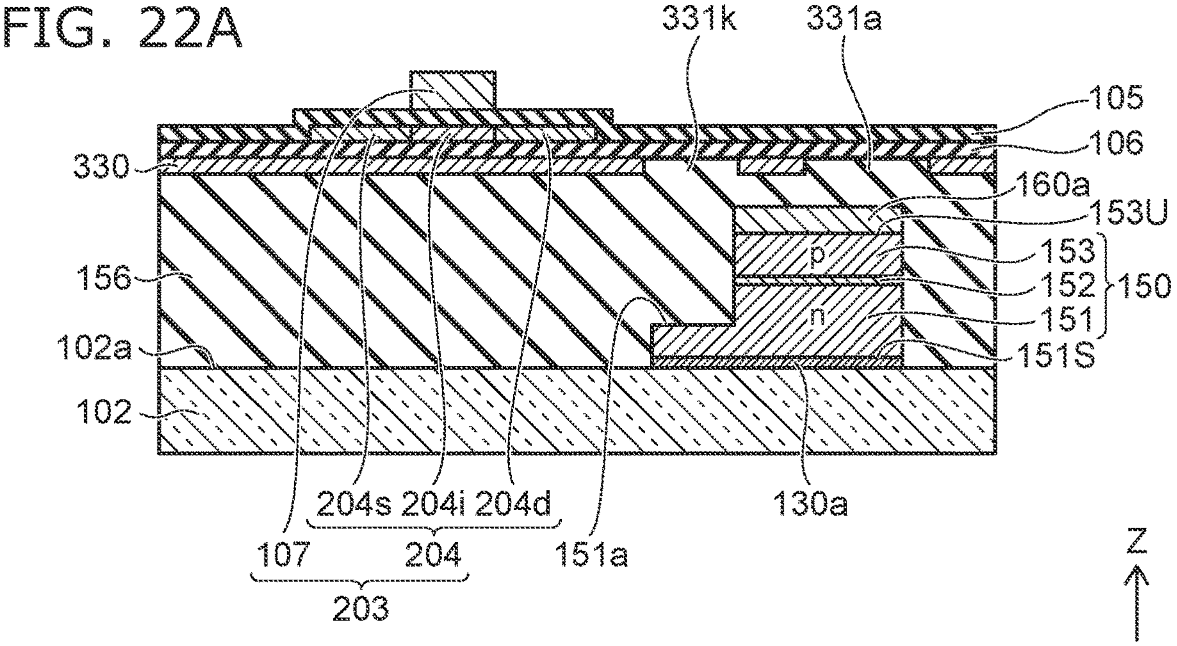
FIG. 22A is a schematic cross-sectional view illustrating a portion of the method for manufacturing the image display device of the third embodiment.

As shown in FIG. 22A, the transistor 203 is formed by patterning the Si layer 1104 to form the TFT channel 204, and by forming the insulating layer 105 and the gate 107. These processes can be performed similarly to the second embodiment by using a LTPS process.

Figure 22B:
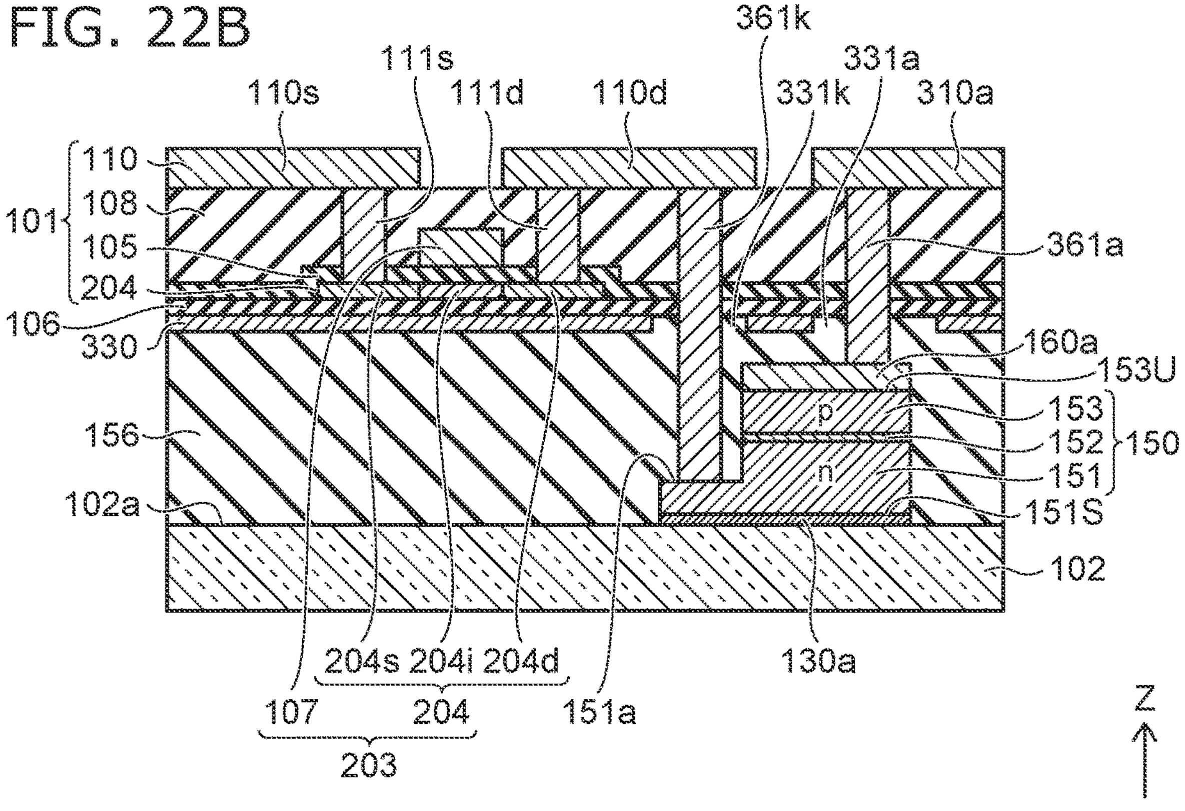
FIG. 22B is a schematic cross-sectional view illustrating a portion of the method for manufacturing the image display device of the third embodiment.

As shown in FIG. 22B, the second inter-layer insulating film 108 is formed to cover the insulating layer 105 and the gate 107, and the vias 111*s*, 111*d*, 361*k*, and 361*a* are formed. The wiring layer 110 is formed on the second inter-layer insulating film 108; the via 111*s* is connected to the wiring part 110*s*; the via 111*d* and the via 361*k* are connected to the wiring part 110*d*, and the via 361*a* is connected to the wiring part 310*a*. These processes are the same as those of the other embodiments described above.

Figure 23:
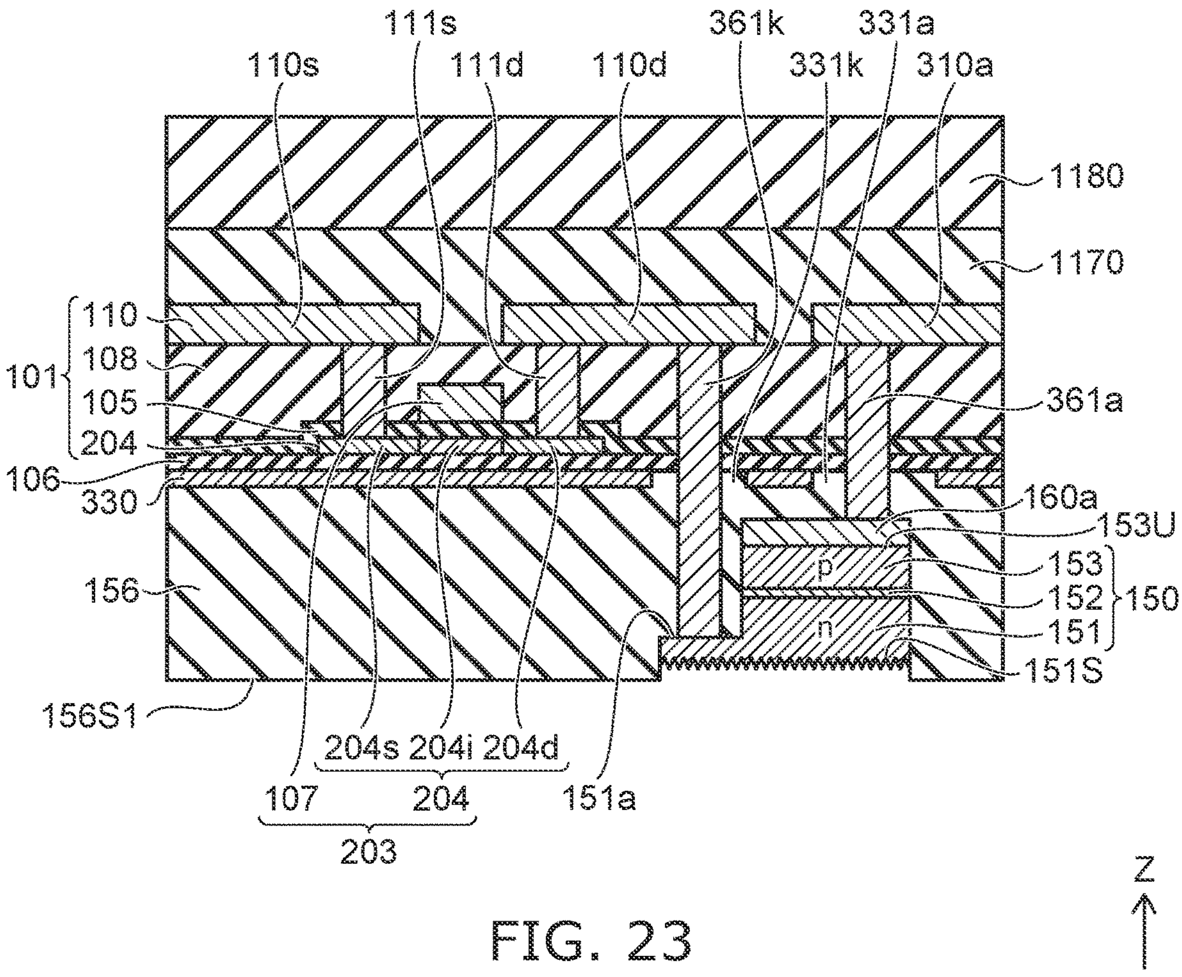
FIG. 23 is a schematic cross-sectional view illustrating a portion of the method for manufacturing the image display device of the third embodiment.

As shown in FIG. 23, the adhesive layer 1170 is coated onto the second inter-layer insulating film 108 and the wiring layer 110, and the reinforcing substrate 1180 is bonded by the adhesive layer 1170.

Subsequently, the substrate 102 and the seed plate 130*a* shown in FIG. 22B are removed sequentially or simultaneously by wet etching and/or laser lift-off.

The light-emitting surface 151S that is exposed after removing the substrate 102 and the seed plate 130*a* is roughened. For example, wet etching is used to roughen the light-emitting surface 151S.

Subsequently, the transparent resin layer is formed to cover the first surface 156S1 and the light-emitting surface 151S; a color filter is formed, and the subpixel is formed.

Effects of the image display device of the embodiment will now be described.

According to the method for manufacturing the image display device of the embodiment, other than the effects of reducing the time of the transfer process for forming the light-emitting element 150 and reducing the number of processes similarly to the other embodiments described above, the light-emitting surface 151S is the n-type semiconductor layer 151 that has a lower resistance than the p-type; therefore, the n-type semiconductor layer 151 can be formed to be thick enough that the light-emitting surface 151S can be roughened. By roughening the light-emitting surface 151S, the radiated light is diffused, and so the image display device of the embodiment can be used as a light source having a sufficient light emission area even for a small light-emitting element 150.

In the image display device 201 of the embodiment, the light-emitting element 150 in which the light-emitting surface 151S is the n-type semiconductor layer 151 can be driven by the n-channel transistor 203. Therefore, the degree of freedom of the circuit configuration can be increased, and the design efficiency can be increased.

In the image display device 201 of the embodiment, the light-shielding layer 330 is located between the first inter-layer insulating film 156 and the second inter-layer insulating film 108. That is, the light-shielding layer 330 is located between the light-emitting element 150 and the transistor 203. Therefore, even when scattered light and the like is radiated upward from the light-emitting element 150, the radiated light does not easily reach the TFT channel 204, and malfunction of the transistor 203 can be prevented.

The light-shielding layer 330 can be formed of a conductive material such as a metal, etc., and the light-shielding layer 330 can be connected to any potential. For example, the light-shielding layer 330 can assist noise suppression by providing a portion of the light-shielding layer 330 directly under switching elements such as the transistor 203, etc., and by connecting to a ground potential, a power supply potential, etc.

The light-shielding layer 330 is not limited to the application to the embodiment and can be commonly applied to the subpixels of the other embodiments described above and other embodiments described below. Effects similar to those described above can be obtained even when applied to the other embodiments.

The configuration and method for manufacturing a light-emitting element including a roughened light-emitting surface are described in the example above. A roughened light-emitting surface such as that of the embodiment is applicable to a light-emitting element that includes a connection part. Specifically, such a light-emitting surface is applicable to the light-emitting element 150 according to the first embodiment, and a roughened application is used as an example in the light-emitting element 150 according to the fourth embodiment described below. Such a light-emitting surface also is applicable to a semiconductor layer 650 of the sixth embodiment described below. The effects described above can be obtained by applying the roughening of the light-emitting surface to the components of such light-emitting elements.

Fourth Embodiment

Figure 24:
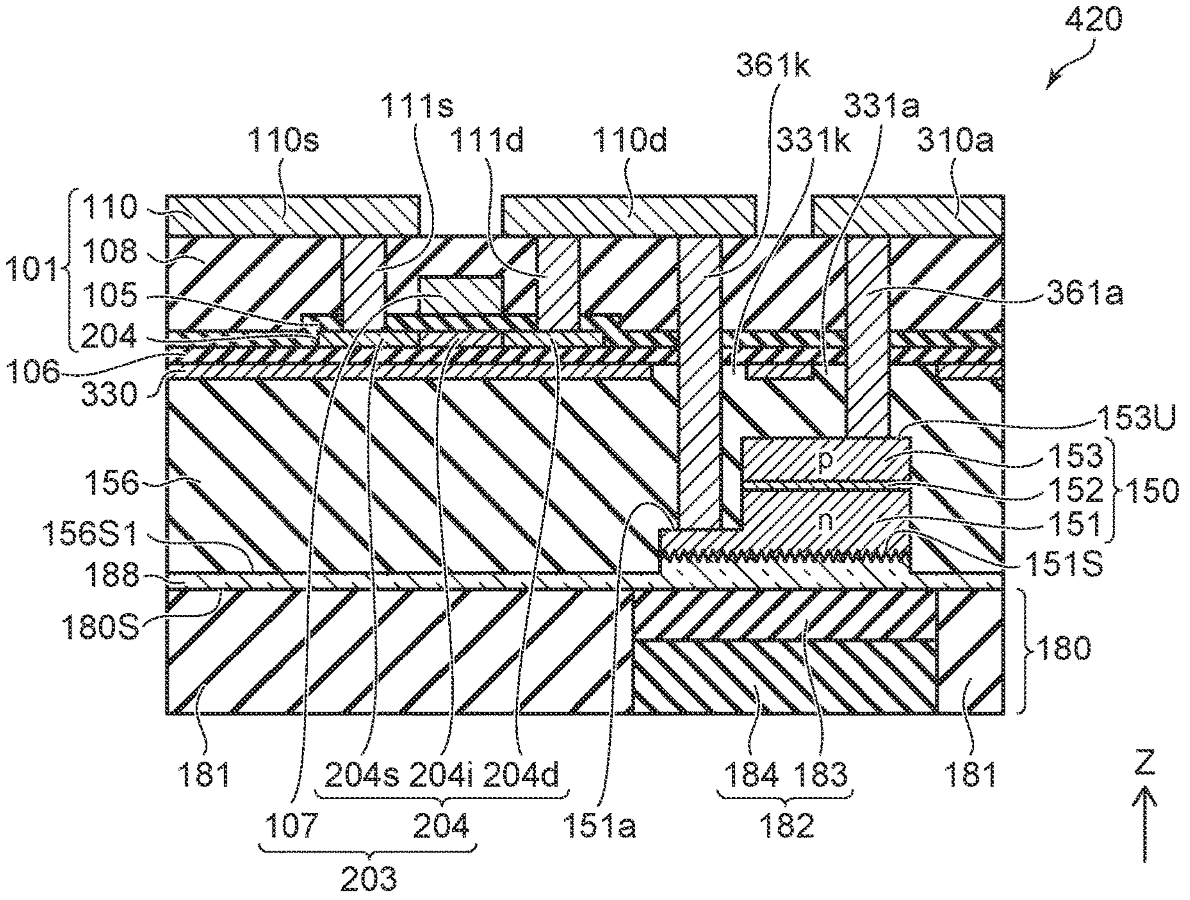
FIG. 24 is a schematic cross-sectional view illustrating a portion of an image display device according to a fourth embodiment.

FIG. 24 is a schematic cross-sectional view illustrating a portion of an image display device of the embodiment.

The embodiment differs from the third embodiment in that the light-shielding electrode 160*a* shown in FIG. 20 is not included; otherwise, the embodiment is the same as the third embodiment. The same components as those of the other embodiments described above are marked with the same reference numerals, and a detailed description is omitted as appropriate.

As shown in FIG. 24, the image display device of the embodiment includes a subpixel 420. The subpixel 420 includes the light-emitting element 150, the first inter-layer insulating film 156, the light-shielding layer 330, the transistor 203, the second inter-layer insulating film 108, the via 361*a*, and the wiring layer 110. The subpixel 420 further includes the color filter 180.

According to the embodiment, a light-shielding electrode is not located on the upper surface 153U of the light-emitting element 150. Therefore, the via 361*a* is located between the wiring part 310*a* and the upper surface 153U and electrically connects the wiring part 310*a* and the upper surface 153U.

The light-shielding layer 330 is located between the first inter-layer insulating film 156 and the second inter-layer insulating film 108 and is formed similarly to that of the third embodiment. In other words, the light-shielding layer 330 is provided to cover the TFT channel 204; more specifically, when projected onto the XY plane, the light-shielding layer 330 is set to include the entire outer perimeter of the TFT channel 204 when the TFT channel 204 is projected onto the light-shielding layer 330. That is, the outer perimeter of the TFT channel 204 is located within the outer perimeter of the light-shielding layer 330 when projected onto the XY plane. Therefore, the scattered light that is radiated upward from the light-emitting element 150 is shielded by the light-shielding layer 330, and malfunction of the transistor 203 including the TFT channel 204 due to light is prevented.

A method for manufacturing the image display device of the embodiment will now be described.

FIGS. 25A to 26B are schematic cross-sectional views illustrating a portion of the method for manufacturing the image display device of the embodiment.

Similarly to the first embodiment, the processes up to the process described with reference to FIG. 5A of the first embodiment described above are applied to the example. The description in hereinbelow, the process of FIG. 25A and subsequent processes are applied after the process of FIG. 5A.

Figure 25A:
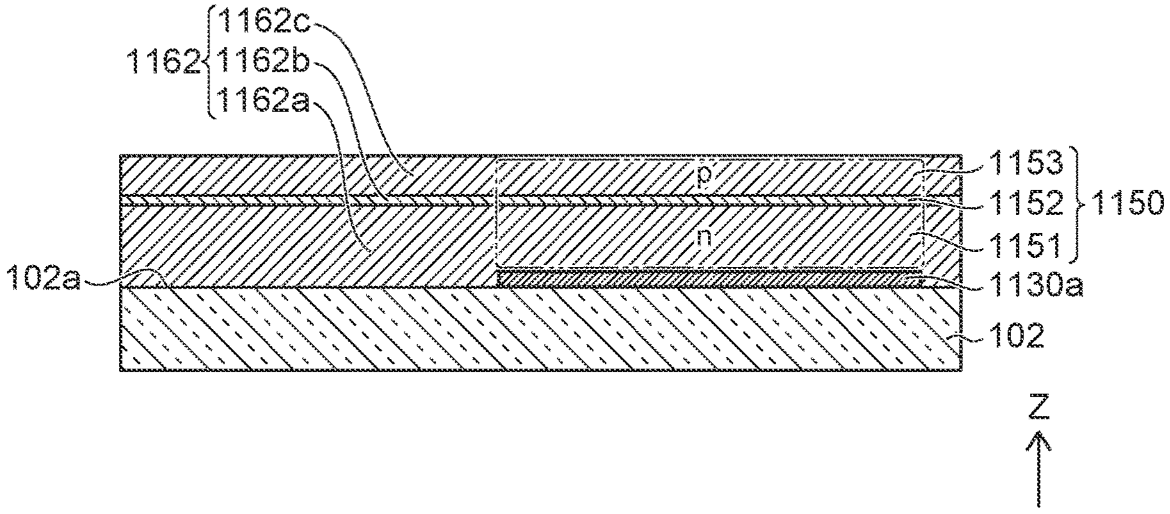
FIG. 25A is a schematic cross-sectional view illustrating a portion of a method for manufacturing the image display device of the fourth embodiment.

As shown in FIG. 25A, the semiconductor layer 1150 is formed over the monocrystallized metal seed layer 1130*a*. The semiconductor layer 1150 includes the n-type semiconductor layer 1151, the light-emitting layer 1152, and the p-type semiconductor layer 1153 formed in this order from the metal seed layer 1130*a* in the positive direction of the Z-axis.

To form the semiconductor layer 1150, technology similar to that of the other embodiments described above is used, and it is favorable to use low-temperature sputtering. Similarly to the other embodiments described above, the semiconductor layer 1150 is formed in the region of the double dot-dash line on the metal seed layer 1130*a*, and the amorphous deposit 1162 that includes materials of the growth species such as Ga is deposited in the other regions.

Figure 25B:
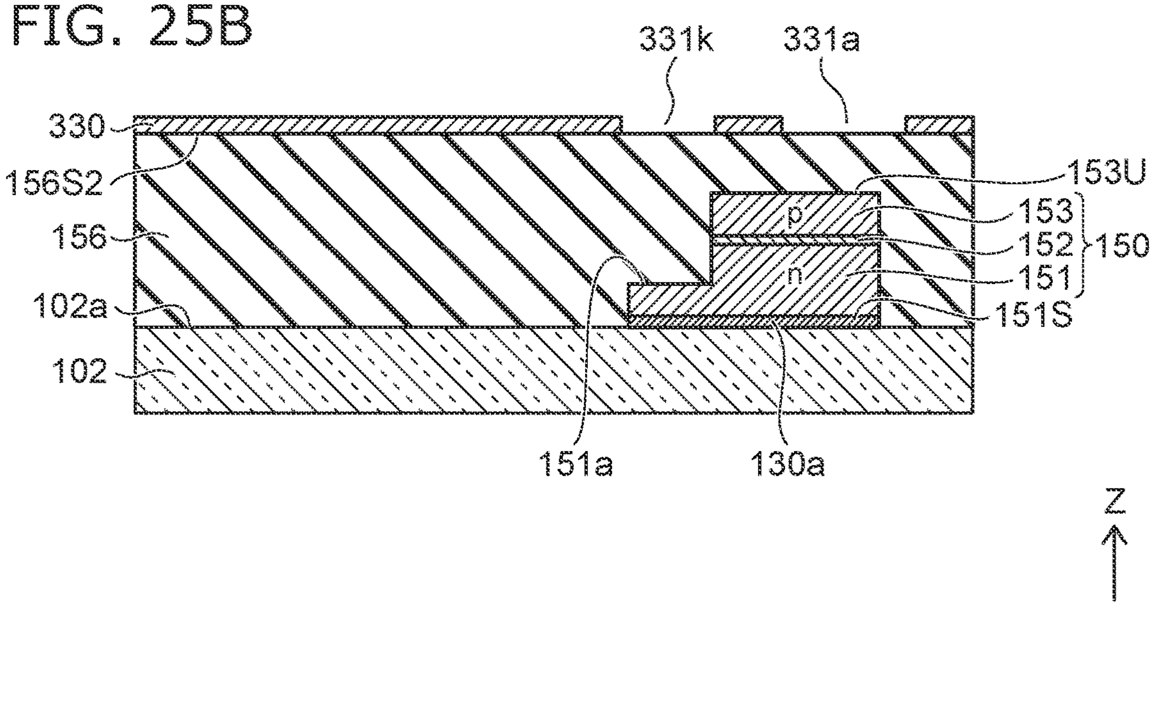
FIG. 25B is a schematic cross-sectional view illustrating a portion of the method for manufacturing the image display device of the fourth embodiment.

As shown in FIG. 25B, the light-shielding layer 330 is formed over the second surface 156S2 of the first inter-layer insulating film 156. The through-holes 331*a* and 331*k* are formed in the light-shielding layer 330, and the second surface 156S2 is exposed in the through-holes 331*a* and 331*k*.

Figure 26A:
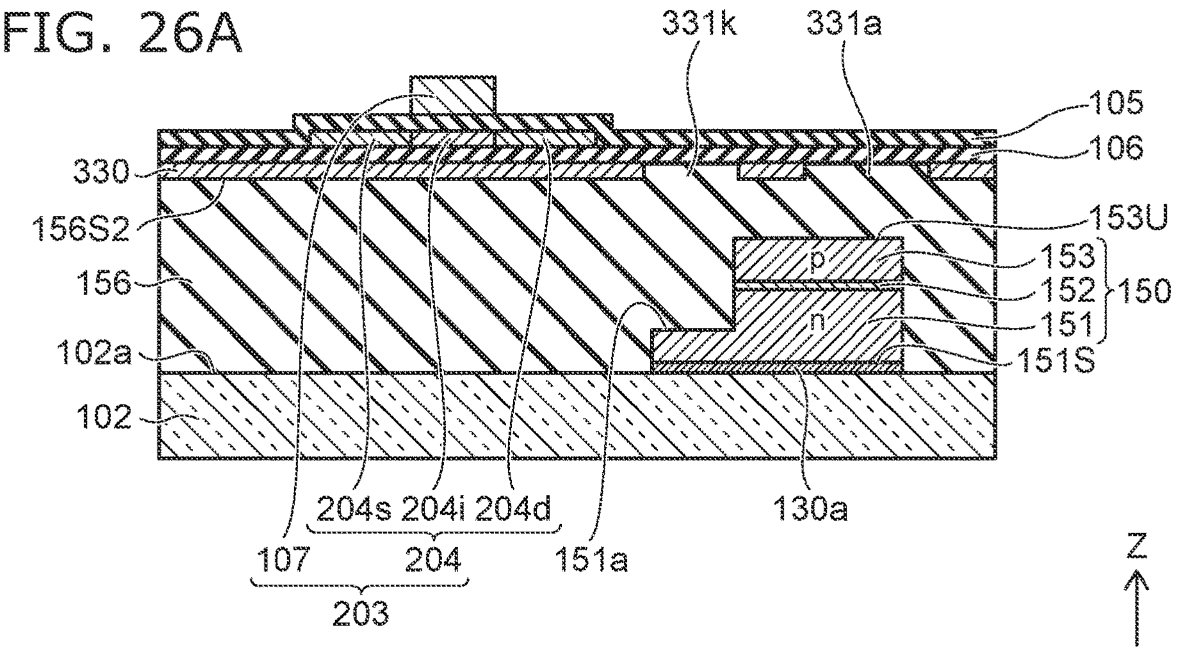
FIG. 26A is a schematic cross-sectional view illustrating a portion of a method for manufacturing the image display device of the fourth embodiment.

As shown in FIG. 26A, the TFT underlying film 106 is formed on the light-shielding layer 330 and the second surface 156S2, and the transistor 203 is formed on the TFT underlying film 106. The formation procedure of the transistor 203 is the same as those of the second and third embodiments.

Figure 26B:
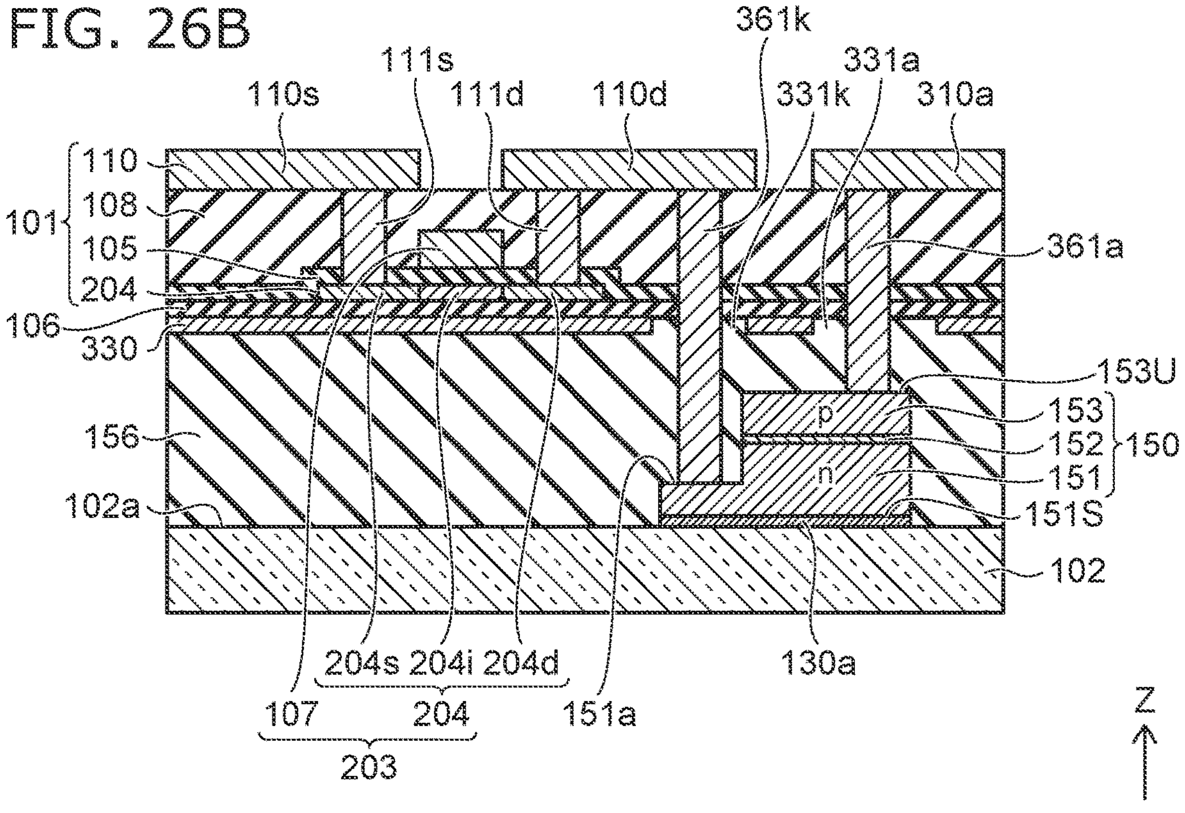
FIG. 26B is a schematic cross-sectional view illustrating a portion of the method for manufacturing the image display device of the fourth embodiment.

As shown in FIG. 26B, the second inter-layer insulating film 108 is formed to cover the insulating layer 105 and the gate 107; the vias 111*s*, 111*d*, 361*k*, and 361*a* are formed, and the wiring layer 110 is formed. In the formation process of the via 361*a*, a via hole that is formed to extend through the second inter-layer insulating film 108, the insulating layer 105, the TFT underlying film 106, the light-shielding layer 330, and the first inter-layer insulating film 156 and reach the upper surface 153U is filled with a conductive material to form the via 361*a*.

Subsequently, similarly to the third embodiment, the reinforcing substrate 1180 is bonded via the adhesive layer 1170 shown in FIG. 23, and the substrate 102 and the seed plate 130*a* shown in FIG. 26B are removed. The exposed light-emitting surface 151S is roughened, and a color filter is formed with the transparent resin layer 188 shown in FIG. 24 interposed.

Effects of the image display device of the embodiment will now be described.

Similarly to the other embodiments described above, the image display device of the embodiment has the effects of reducing the time of the transfer process for forming the light-emitting element 150 and reducing the number of processes. According to the embodiment, the formation process of a light-shielding electrode can be omitted because a light-shielding electrode is not formed on the upper surface 153U of the light-emitting element 150.

Fifth Embodiment

Figure 27:
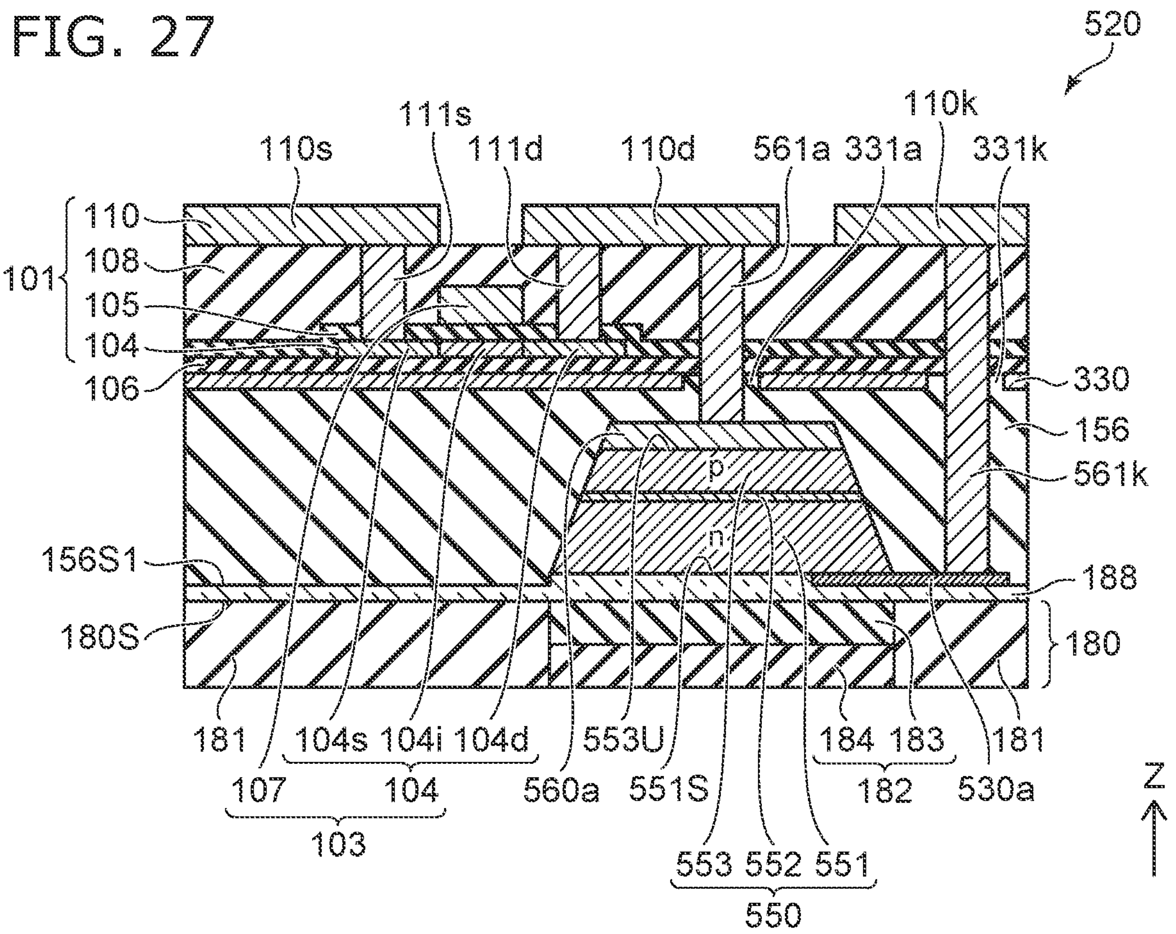
FIG. 27 is a schematic cross-sectional view illustrating a portion of an image display device according to a fifth embodiment.

FIG. 27 is a schematic cross-sectional view illustrating a portion of an image display device of the embodiment.

The configurations of a light-emitting element 550 and a light-shielding electrode 560*a* of the embodiment are different from those of the other embodiments. Otherwise, the components are the same as those of the other embodiments described above. The same component are marked with the same reference numerals, and a detailed description is omitted as appropriate.

As shown in FIG. 27, the light-emitting element 550 is located on the color filter 180. The first inter-layer insulating film 156 that covers the side surface of the light-emitting element 550 also is located on the color filter 180. The surface of the light-emitting element 550 on the color filter 180 is a light-emitting surface 551S. The position of the light-emitting surface 551S is shifted further than the position of the first surface 156S1 in the positive direction of the Z-axis. The transparent resin layer 188 is formed over the light-emitting surface 551S and the first surface 156S1, and the light-emitting element 550 and the first inter-layer insulating film 156 are located on the color filter 180 with the transparent resin layer 188 interposed.

A connection plate 530*a* is a plate-shaped member including two surfaces. One surface of the connection plate 530*a* is connected to a surface including the light-emitting surface 551S. The connection plate 530*a* is provided to protrude in one direction from the light-emitting surface 551S over the connection surface 180S of the color filter 180. The connection plate 530*a* is connected to one end of a via 561*k* at the surface connected to the surface including the light-emitting surface 551S. The transparent resin layer 188 is provided over the surface at the side opposite to the surface of the connection plate 530*a* to which the via 561*k* is connected.

The connection plate 530*a* has a function similar to the connection plate 230*a* according to the second embodiment shown in FIG. 14. In other words, the connection plate 530*a* is formed of a conductive material and electrically connects the light-emitting surface 551S and the via 561*k*.

The light-emitting element 550 includes the light-emitting surface 551S, and an upper surface 553U that is the surface at the side opposite to the light-emitting surface. The light-emitting element 550 includes an n-type semiconductor layer 551, a light-emitting layer 552, and a p-type semiconductor layer 553 stacked in this order from the light-emitting surface 551S toward the upper surface 553U. As described using FIG. 28 below, the light-emitting element 550 has a truncated pyramid or truncated circular conic shape formed so that the area when projected onto the XY plane gradually decreases from the light-emitting surface 551S toward the upper surface 553U. The light-shielding electrode 560*a* is located on the upper surface 553U of the light-emitting element 550 and has a truncated pyramid or truncated circular conic shape continuous from the top portion of the light-emitting element 550.

According to the embodiment, the light-shielding layer 330 is located between the TFT underlying film 106 and the first inter-layer insulating film 156. The light-shielding layer 330 is the same as that described using FIG. 20 according to the third embodiment. Accordingly, the light-shielding layer 330 is provided to cover the TFT channel 104, can shield the light radiated from the light-emitting element 550, and can prevent malfunction of the transistor 103 including the TFT channel 104.

The via 561*k* extends through the second inter-layer insulating film 108, the insulating layer 105, the TFT underlying film 106, the light-shielding layer 330, and the first inter-layer insulating film 156 and reach the connection plate 530*a*. The via 561*k* is located between the wiring part 110*k* and the connection plate 530*a* and electrically connects the wiring part 110*k* and the connection plate 530*a*. A via 561*a* extends through the second inter-layer insulating film 108, the insulating layer 105, the TFT underlying film 106, the light-shielding layer 330, and the first inter-layer insulating film 156 and reach the light-shielding electrode 560*a*. The via 561*a* is located between the wiring part 110*d* and the light-shielding electrode 560*a* and electrically connects the wiring part 110*d* and the light-shielding electrode 560*a*. The other components are the same as those of the second embodiment described above, and a detailed description is omitted.

Figure 28:
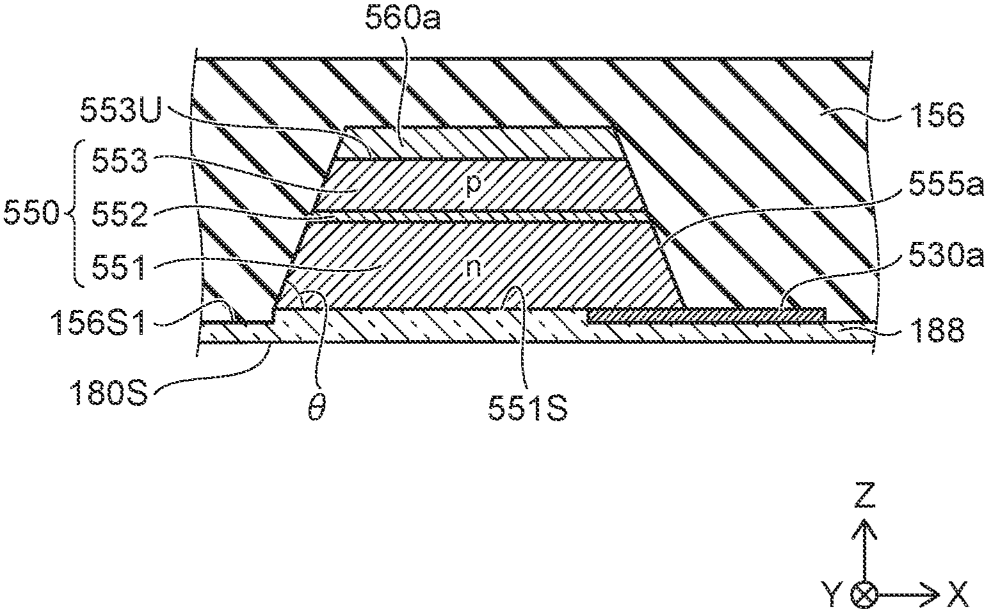
FIG. 28 is a schematic cross-sectional view illustrating a portion of the image display device of the fifth embodiment.

FIG. 28 is an enlarged view of the portion of the light-emitting element 550 of FIG. 27 and shows the relationship between the light-emitting surface 551S and a side surface 555*a* in detail.

As shown in FIG. 28, the light-emitting surface 551S is a plane that is substantially parallel to the XY plane. The first surface 156S1 of the first inter-layer insulating film 156 also is a plane that is substantially parallel to the XY plane. The light-emitting element 550 and the first inter-layer insulating film 156 are located on the connection surface 180S of the color filter with the transparent resin layer 188 interposed, and the light-emitting surface 551S and the first surface 156S1 are surfaces that are substantially parallel to the connection surface 180S. Similarly to the other embodiments described above, the position of the light-emitting surface 551S is shifted further than the position of the first surface 156S1 in the positive direction of the Z-axis.

Although the first inter-layer insulating film 156 is taken to be a transparent resin for simplification in the following description, even when the first inter-layer insulating film 156 is a white resin, the effects on the refractive index of the fine scattering particles inside the white resin are small, and such effects can be ignored.

The side surface 555*a* of the light-emitting element 550 is a surface between the upper surface 553U and the light-emitting surface 551S and is adjacent to the light-emitting surface 551S and the upper surface 553U. An interior angle θ of the angle between the side surface 555*a* and the light-emitting surface 551S is less than 90°. The interior angle θ is favorably about 70°. The interior angle θ is more favorably less than the critical angle of the side surface 555*a* determined based on the refractive index of the light-emitting element 550 and the refractive index of the first inter-layer insulating film 156. The light-emitting element 550 is covered with the first inter-layer insulating film 156, and the side surface 555*a* contacts the first inter-layer insulating film 156.

For example, a critical angle θc of the interior angle θ between the light-emitting surface 551S and the side surface 555*a* of the light-emitting element 550 is determined as follows.

The critical angle θc of the light emitted from the light-emitting element 550 into the first inter-layer insulating film 156 is determined using the following Formula (1) for a refractive index n0 of the light-emitting element 550 and a refractive index n1 of the first inter-layer insulating film 156.

$$\theta c = 90° - \sin^{-1}(n1/n0) \quad (1)$$

For example, it is known that the refractive index of a general transparent organic insulating material such as an acrylic resin or the like is about 1.4 to 1.5. Therefore, when the light-emitting element 550 is formed of GaN and the first inter-layer insulating film 156 is formed of a general transparent organic insulating material, it follows that the refractive index n0 of the light-emitting element 550 equals 2.5, and the refractive index n1 of the first inter-layer insulating film 156 equals 1.4. Substituting these values in Formula (1) gives critical angle θc=56°.

This indicates that when the interior angle θ between the light-emitting surface 551S and the side surface 555*a* is set to θc=56°, the light radiated from the light-emitting layer 552 that is parallel to the light-emitting surface 551S is totally reflected at the side surface 555*a*. This also indicates that the light radiated from the light-emitting layer 552 that has a component in the positive direction of the Z-axis also is totally reflected at the side surface 555*a*.

On the other hand, the light radiated from the light-emitting layer 552 that has a component in the negative direction of the Z-axis is emitted from the side surface 555*a* at an emergence angle corresponding to the refractive index at the side surface 555*a*. The light that is incident on the first inter-layer insulating film 156 is emitted from the first inter-layer insulating film 156 at an angle determined by the refractive index of the first inter-layer insulating film 156.

The light that is totally reflected at the side surface 555*a* is re-reflected by the light-shielding electrode 560*a*, and the re-reflected light that has a component in the negative direction of the Z-axis is emitted from the light-emitting surface 551S and the side surface 555*a*. The light that is parallel to the light-emitting surface 551S and the light that has a component in the positive direction of the Z-axis are totally reflected at the side surface 555*a*.

Thus, the light radiated from the light-emitting layer 552 that is parallel to the light-emitting surface 551S or has a component in the positive direction of the Z-axis is converted into light having a component in the negative direction of the Z-axis by the side surface 555*a* and the light-shielding electrode 160*a*. Accordingly, the ratio of the light from the light-emitting element 550 that is emitted toward the light-emitting surface 551S is increased, and the substantial luminous efficiency of the light-emitting element 550 is improved.

By setting $\theta<\theta c$, substantially all of the light having a component parallel to the light-emitting surface 551S can be totally reflected inside the light-emitting element 550. Because the critical angle $\theta c$ is about 56° when the refractive index of the first inter-layer insulating film 156 is set to $n=1.4$, it is more favorable to set the interior angle $\theta$ to be 45°, 30°, etc. The critical angle $\theta c$ decreases as the refractive index n of the material increases. However, even if the interior angle $\theta$ is set to about 70°, substantially all of the light having a component in the negative direction of the Z-axis can be converted into light having a component in the positive direction of the Z-axis; therefore, considering the manufacturing fluctuation, etc., for example, the interior angle $\theta$ may be set to be not more than 80°, etc.

A method for manufacturing the image display device of the embodiment will now be described.

The manufacturing processes of the light-emitting element 550 and the light-shielding electrode 560*a* according to the embodiment are different from those of the other embodiments; otherwise, the manufacturing processes of the other embodiments described above are applicable. The different portions of the manufacturing processes will now be described.

According to the embodiment, the following processes are performed to form the shape of the light-emitting element 550 shown in FIG. 27.

After the metal layer 1160 is formed, the semiconductor layer 1150 shown in FIG. 17A is patterned by etching into the shape of the light-emitting element 550 shown in FIG. 27. The etching is continuously performed from the metal layer 1160 to the semiconductor layer 1150. To shape the light-shielding electrode 560*a* and the light-emitting element 550, the etching rate is selected so that the side surface 555*a* shown in FIG. 28 has the interior angle $\theta$ with respect to the light-emitting surface 551S. For example, the etching is selected so that the etching rate is higher proximate to the upper surface 553U. It is favorable to set the etching rate to linearly increase from the light-emitting surface 551S side toward the upper surface 553U and the light-shielding electrode 560*a*.

Specifically, for example, a contrivance when exposing is performed so that the resist mask pattern in the dry etching gradually becomes thin toward the end portions. Accordingly, the resist gradually recedes from the thin portions in the dry etching, and the etching amount can be increased from the light-emitting surface 551S toward the upper surface 553U side. Thereby, the side surface 555*a* of the light-emitting element 550 is formed to form a constant angle with respect to the light-emitting surface 551S. Therefore, in the light-emitting element 550, the areas of the layers from the upper surface 553U when projected onto the XY plane increase in the order of the p-type semiconductor layer 553, the light-emitting layer 552, and the n-type semiconductor layer 551.

Subsequently, a subpixel 520 is formed similarly to the other embodiments.

Effects of the image display device of the embodiment will now be described.

The image display device of the embodiment has the following effects in addition to the effects of reducing the time of the transfer process for forming the light-emitting element 550 and reducing the number of processes similarly to the image display devices of the other embodiments described above.

In the image display device of the embodiment, the light-emitting element 550 is formed to include the side surface 555*a* having the interior angle $\theta$ with respect to the light-emitting surface 551S on which the light-emitting element 550 is located. The interior angle $\theta$ is less than 90° and is set based on the critical angle $\theta c$ determined by the refractive indexes of the materials of the light-emitting element 550 and the first inter-layer insulating film 156. The interior angle $\theta$ can convert the light radiated from the light-emitting layer 552 that is traveling sideward or upward in the light-emitting element 550 into light traveling toward the light-emitting surface 551S side, which can be emitted. The substantial luminous efficiency of the light-emitting element 550 is increased by setting the interior angle $\theta$ to be sufficiently small.

According to the embodiment, the light-emitting element 550 is a vertical element, and the via 561*k* is connected using the connection plate 530*a*. The connection is not limited thereto; similarly to the first embodiment, a connection part that is formed on the connection surface 180S may be included in the light-emitting element, and the via 561*k* may be connected via the connection part.

Sixth Embodiment

Figure 29:
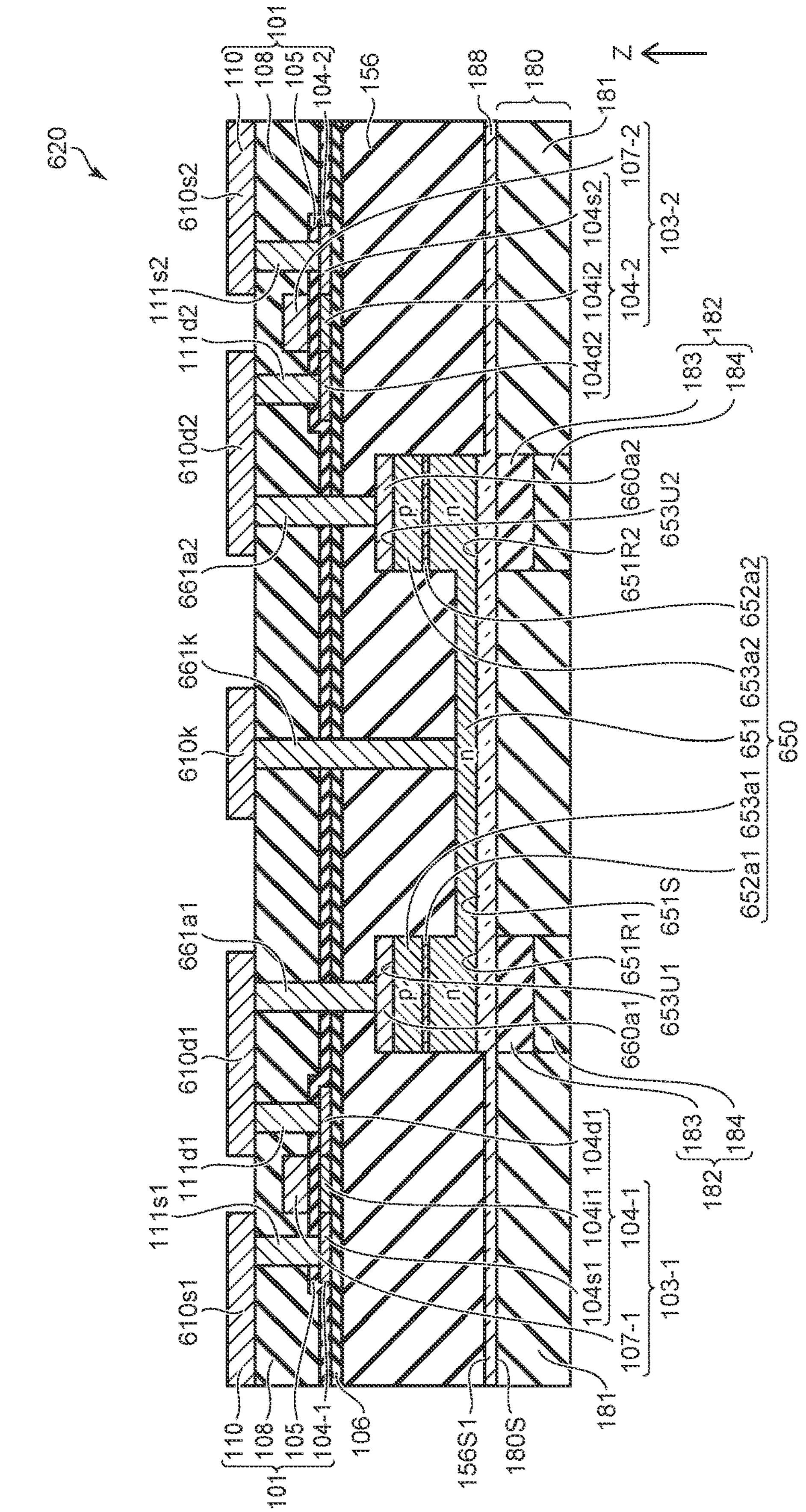
FIG. 29 is a schematic cross-sectional view illustrating a portion of an image display device according to a sixth embodiment.

FIG. 29 is a schematic cross-sectional view illustrating a portion of an image display device of the embodiment.

The embodiment differs from the other embodiments in that the image display device includes a subpixel group 620 including multiple light-emitting regions for one light-emitting surface. The same components are marked with the same reference numerals, and a detailed description is omitted as appropriate.

As shown in FIG. 29, the image display device of the embodiment includes the subpixel group 620. The subpixel group 620 includes the semiconductor layer 650, multiple light-shielding electrodes 660*a*1 and 660*a*2, the first inter-layer insulating film 156, multiple transistors 103-1 and 103-2, the second inter-layer insulating film 108, multiple vias (first vias) 661*a*1 and 661*a*2, and the wiring layer 110. The subpixel group 620 further includes the color filter 180. The semiconductor layer 650 is located on the connection surface 180S of the color filter 180.

According to the embodiment, holes are injected from one side of the semiconductor layer 650 via the wiring layer 110 and the vias 661*a*1 and 661*a*2 by switching the p-channel transistors 103-1 and 103-2 on. Electrons are injected from the other side of the semiconductor layer 650 via the wiring layer 110 and a via 661*k* by switching the p-channel transistors 103-1 and 103-2 on. Light-emitting layers 652*a*1 and 652*a*2 of the semiconductor layer 650 that are separated from each other emit light when the holes and the electrons are injected and the holes and the electrons combine. For example, the circuit configuration shown in FIG. 3 is applied to the drive circuit for driving the light-emitting layers 652*a*1 and 652*a*2. The example of the second embodiment in which the n-type semiconductor layer and p-type semiconductor layer of the semiconductor layer are interchanged also can be used as a configuration that drives the semiconductor layer with an n-channel transistor. In such a case, the circuit configuration of FIG. 16 is applied to the drive circuit.

The configuration of the subpixel group 620 will now be described in detail.

The semiconductor layer 650 includes a light-emitting surface 651S. The light-emitting surface 651S is located on the connection surface 180S of the color filter 180 with the transparent resin layer 188 interposed. The light-emitting surface 651S is a surface of an n-type semiconductor layer 651. The light-emitting surface 651S includes multiple light-emitting regions 651R1 and 651R2.

The semiconductor layer 650 includes the n-type semiconductor layer 651, the light-emitting layers 652*a*1 and 652*a*2, and p-type semiconductor layers 653*a*1 and 653*a*2. The light-emitting layer 652*a*1 is located on the n-type semiconductor layer 651. The light-emitting layer 652*a*1 is located on the n-type semiconductor layer 651 to be separated from the light-emitting layer 652*a*2. The p-type semiconductor layer 653*a*1 is located on the light-emitting layer 652*a*1. The p-type semiconductor layer 653*a*2 is located on the light-emitting layer 652*a*2 to be separated from the p-type semiconductor layer 653*a*1.

The p-type semiconductor layer 653*a*1 includes an upper surface 653U1 located at the side opposite to the surface at which the light-emitting layer 652*a*1 is located. The p-type semiconductor layer 653*a*2 includes an upper surface 653U2 located at the side opposite to the surface at which the light-emitting layer 652*a*2 is located.

The light-emitting region 651R1 substantially matches the region of the light-emitting surface 651S facing the upper surface 653U1. The light-emitting region 651R2 substantially matches the region of the light-emitting surface 651S facing the upper surface 653U2.

The light-shielding electrode 660*a*1 is located on the upper surface 653U1. The light-shielding electrode 660*a*2 is located on the upper surface 653U2. Similarly to the other embodiments described above, the light-shielding electrodes 660*a*1 and 660*a*2 reflect the light scattered upward from the semiconductor layer 650 and prevent malfunction of the transistors 103-1 and 103-2 due to the scattered light. The substantial luminous efficiency of the semiconductor layer 650 is increased by the light-shielding electrodes 660*a*1 and 660*a*2 reflecting the upward-scattered light toward the light-emitting surface 651S side.

The relationship between the semiconductor layer 650 and the light-emitting regions 651R1 and 651R2 will now be described.

Figure 30:
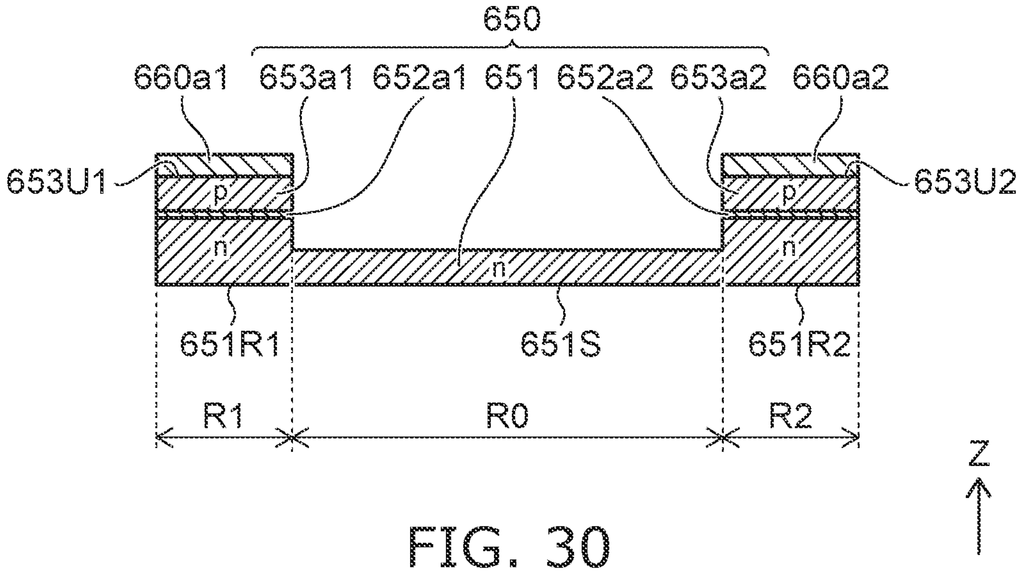
FIG. 30 is a schematic cross-sectional view illustrating a portion of the image display device of the sixth embodiment.

FIG. 30 is a schematic cross-sectional view illustrating a portion of the image display device of the embodiment.

FIG. 30 is a schematic view for describing the light-emitting regions 651R1 and 651R2 of the semiconductor layer 650.

As shown in FIG. 30, the light-emitting regions 651R1 and 651R2 are surfaces included in the light-emitting surface 651S. In FIG. 30, the portions of the semiconductor layer 650 that include the light-emitting regions 651R1 and 651R2 are respectively called light-emitting parts R1 and R2. The light-emitting part R1 includes the p-type semiconductor layer 653*a*1, the light-emitting layer 652*a*1, and a portion of the n-type semiconductor layer 651. The light-emitting part R2 includes the p-type semiconductor layer 653*a*2, the light-emitting layer 652*a*2, and a portion of the n-type semiconductor layer 651.

The semiconductor layer 650 includes a connection part R0. The connection part R0 is located between the light-emitting part R1 and the light-emitting part R2 and is a portion of the n-type semiconductor layer 651. One end of the via 661*k* shown in FIG. 29 is connected to the connection part R0 and provides a path of current to each of the light-emitting parts R1 and R2.

In the light-emitting part R1, the electrons that are supplied via the connection part R0 are supplied to the light-emitting layer 652*a*1. In the light-emitting part R1, the holes that are supplied via the light-shielding electrode 660*a*1 are supplied to the light-emitting layer 652*a*1. The electrons and the holes that are supplied to the light-emitting layer 652*a*1 combine and emit light. The light that is emitted by the light-emitting layer 652*a*1 passes through the portion of the n-type semiconductor layer 651 of the light-emitting part R1 and reaches the light-emitting surface 651S. Because the light travels straight substantially along the Z-axis direction through the light-emitting part R1, the portion of the light-emitting surface 651S that emits light is the light-emitting region 651R1. Accordingly, in the example, when projected onto the XY plane, the light-emitting region 651R1 substantially matches a region surrounded with the outer perimeter of the light-emitting layer 652*a*1 projected onto the light-emitting surface 651S.

The light-emitting part R2 also is similar to the light-emitting part R1. Specifically, the electrons that are supplied via the connection part R0 are supplied to the light-emitting layer 652*a*2 in the light-emitting part R2. The holes that are supplied via the light-shielding electrode 660*a*2 are supplied to the light-emitting layer 652*a*2 in the light-emitting part R2. The electrons and the holes that are supplied to the light-emitting layer 652*a*2 combine and emit light. The light that is emitted by the light-emitting layer 652*a*2 passes through the portion of the n-type semiconductor layer 651 of the light-emitting part R2 and reaches the light-emitting surface 651S. Because the light travels straight substantially along the Z-axis direction through the light-emitting part R2, the portion of the light-emitting surface 651S that emits light is the light-emitting region 651R2. Accordingly, in the example, when projected onto the XY plane, the light-emitting region 651R2 substantially matches the region surrounded with the outer perimeter of the light-emitting layer 652*a*2 projected onto the light-emitting surface 651S.

Thus, in the semiconductor layer 650, the n-type semiconductor layer 651 can be shared, and the multiple light-emitting regions 651R1 and 651R2 can be formed on the light-emitting surface 651S.

According to the embodiment, the semiconductor layer 650 can be formed by using a portion of the n-type semiconductor layer 651 as the connection part R0 for the multiple light-emitting layers 652*a*1 and 652*a*2 and the multiple p-type semiconductor layers 653*a*1 and 653*a*2 of the semiconductor layer 650. Accordingly, the semiconductor layer 650 can be formed similarly to the method for forming the light-emitting elements 150 and 250 according to the first and second embodiments and the like described above.

The description continues now by returning to FIG. 29.

The first inter-layer insulating film 156 (the first insulating film) is located on the color filter 180 with the transparent resin layer 188 interposed. The first inter-layer insulating film 156 is provided to cover the light-shielding electrodes **660*a*1 and 660*a*2, the n-type semiconductor layer 651, and the side surface of the semiconductor layer 650**.

The TFT underlying film 106 is formed over the first inter-layer insulating film 156. The TFT underlying film 106 is planarized, and the TFT channels 104-1 and 104-2, etc., are formed on the TFT underlying film 106.

The insulating layer 105 covers the TFT underlying film 106 and the TFT channels 104-1 and 104-2. A gate 107-1 is located on the TFT channel 104-1 with the insulating layer 105 interposed. A gate 107-2 is located on the TFT channel 104-2 with the insulating layer 105 interposed. The transistor 103-1 includes the TFT channel 104-1 and the gate 107-1. The transistor 103-2 includes the TFT channel 104-2 and the gate 107-2.

The second inter-layer insulating film (the second insulating film) 108 is provided to cover the insulating layer 105 and the gates 107-1 and 107-2.

The TFT channel 104-1 includes regions **104*s*1 and 104*d*1 doped to be of the p-type, and the regions 104*s*1 and 104*d*1 are the source region and drain region of the transistor 103-1. A region 104*i*1 is doped to be of the n-type and forms the channel of the transistor 103-1. Similarly, the TFT channel 104-2 includes regions 104*s*2 and 104*d*2 doped to be of the p-type, and the regions 104*s*2 and 104*d*2 are the source region and drain region of the transistor 103-2. A region 104*i*2 is doped to be of the n-type and forms the channel of the transistor 103-2. According to the embodiment, the circuit 101 includes the TFT channels 104-1 and 104-2, the insulating layer 105, the second inter-layer insulating film 108, vias 111*s*1, 111*d*1, 111*s*2, and 111*d*2, and the wiring layer 110**.

The wiring layer 110 is located on the second inter-layer insulating film 108. The wiring layer 110 includes wiring parts **610*s*1, 610*d*1, 610*k*, 610*d*2, and 610*s*2**.

The wiring part **610*k* is located above the n-type semiconductor layer 651. The via 661*k* is located between the wiring part 610*k* and the n-type semiconductor layer 651 and electrically connects the wiring part 610*k* and the n-type semiconductor layer 651. For example, the wiring part 610*k* is connected to the ground line 4 of the circuit of FIG. 3**.

The vias **111*d*1, 111*s*1, 111*d*2, and 111*s*2 extend through the second inter-layer insulating film 108, the insulating layer 105, and the TFT underlying film 106. The via 111*d*1 is located between the region 104*d*1 and the wiring part 610*d*1 and electrically connects the region 104*d*1 and the wiring part 610*d*1. The via 111*s*1 is located between the region 104*s*1 and the wiring part 610*s*1 and electrically connects the region 104*s*1 and the wiring part 610*s*1. The via 111*d*2 is located between the region 104*d*2 and the wiring part 610*d*2 and electrically connects the region 104*d*2 and the wiring part 610*d*2. The via 111*s*2 is located between the region 104*s*2 and the wiring part 610*s*2 and electrically connects the region 104*s*2 and the wiring part 610*s*2. For example, the wiring parts 610*s*1 and 610*s*2 are connected to the power supply line 3 of the circuit of FIG. 3**.

The wiring part **610*d*1 is located above the light-shielding electrode 660*a*1. The via 661*a*1 is located between the wiring part 610*d*1 and the light-shielding electrode 660*a*1 and electrically connects the wiring part 610*d*1 and the light-shielding electrode 660*a*1. Accordingly, the p-type semiconductor layer 653*a*1 is electrically connected to the drain region of the transistor 103-1 via the light-shielding electrode 660*a*1, the via 661*a*1, the wiring part 610*d*1, and the via 111*d*1**.

The wiring part **610*d*2 is located above the light-shielding electrode 660*a*2. The via 661*a*2 is located between the wiring part 610*d*2 and the light-shielding electrode 660*a*2 and electrically connects the wiring part 610*d*2 and the light-shielding electrode 660*a*2. Accordingly, the p-type semiconductor layer 653*a*2 is electrically connected to the drain region of the transistor 103-2 via the light-shielding electrode 660*a*2, the via 661*a*2, the wiring part 610*d*2, and the via 111*d*2**.

For example, the transistors 103-1 and 103-2 are drive transistors of adjacent subpixels and are sequentially driven. When the holes supplied from the transistor 103-1 are injected into the light-emitting layer **652*a*1 and the electrons supplied from the wiring part 610*k* are injected into the light-emitting layer 652*a*1, the light-emitting layer 652*a*1 emits light, and the light is radiated from the light-emitting region 651R1. When the holes supplied from the transistor 103-2 are injected into the light-emitting layer 652*a*2 and the electrons supplied from the wiring part 610*k* are injected into the light-emitting layer 652*a*2, the light-emitting layer 652*a*2 emits light, and the light is radiated from the light-emitting region 651**R2.

Effects of the image display device of the embodiment will now be described.

Similarly to the image display devices of the other embodiments described above, the image display device of the embodiment has the effects of reducing the time of the transfer process for forming the semiconductor layer 650 and reducing the number of processes. Also, because the connection part R0 can be shared by the multiple light-emitting parts R1 and R2, the number of the vias **661*k* provided in the connection part R0 can be reduced. The pitch of the light-emitting parts R1 and R2 included in the subpixel group 620** can be reduced by reducing the number of vias, and a small and high-definition image display device is possible. Although two light-emitting regions are described in the example, the number of light-emitting regions formed in the light-emitting surface is not limited to two, and can be any number of three or more.

Seventh Embodiment

The image display device described above can be used as an image display module having the appropriate number of pixels in, for example, a computer display, a television, a portable terminal such as a smartphone, car navigation, etc.

Figure 31:
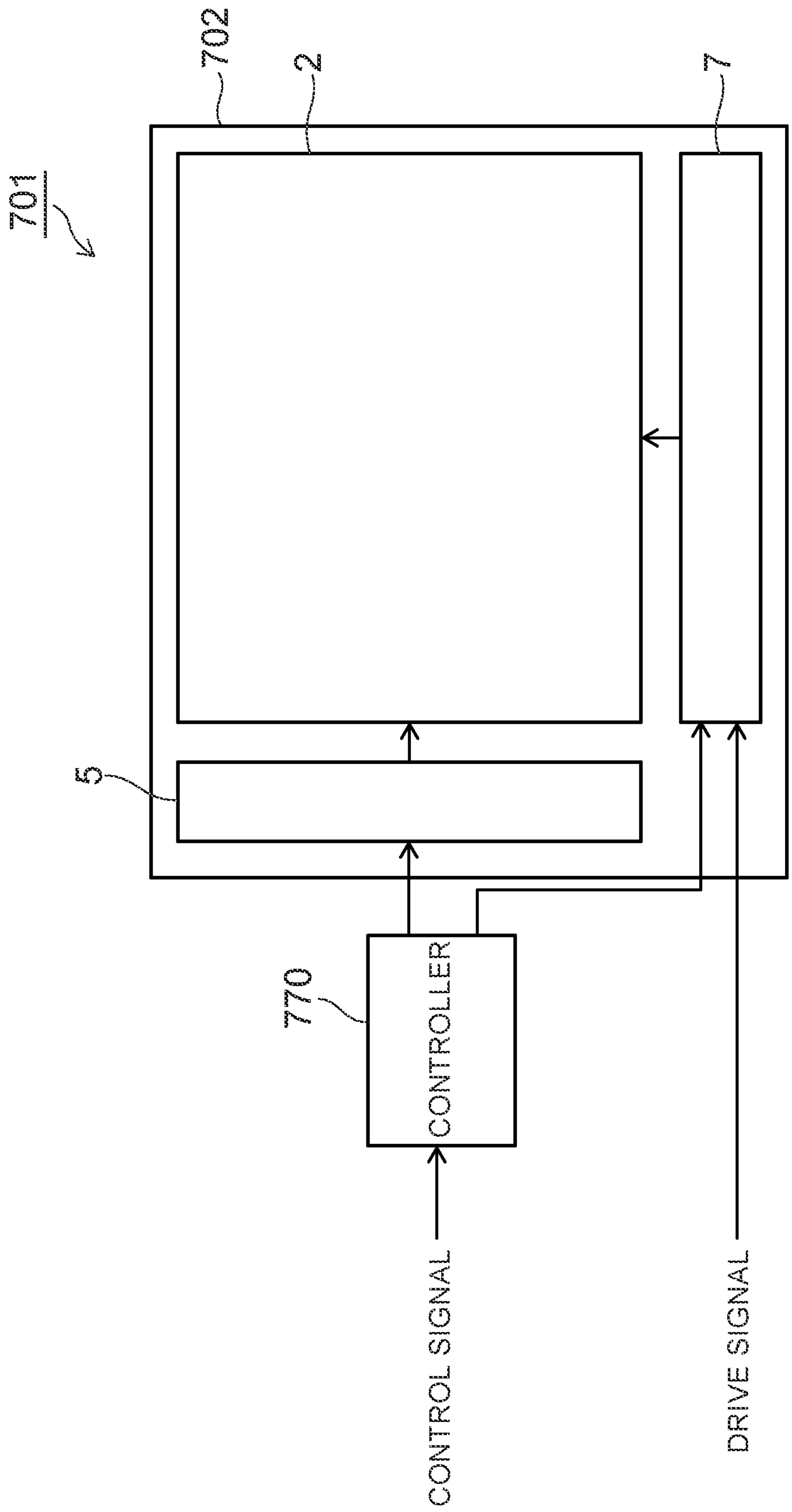
FIG. 31 is a block diagram illustrating the image display device according to the seventh embodiment.

FIG. 31 is a block diagram illustrating an image display device according to the embodiment.

FIG. 31 shows the major parts of the configuration of a computer display.

As shown in FIG. 31, the image display device 701 includes an image display module 702. The image display module 702 is, for example, an image display device that includes the configuration according to the first embodiment described above. The image display module 702 includes the display region 2 in which multiple subpixels including the subpixels 20 are arranged, the row selection circuit 5, and the signal voltage output circuit 7.

The image display device 701 further includes a controller 770. The controller 770 receives input of control signals to be separated and generated by not-illustrated interface circuitry, and controls the driving and the drive sequence of the subpixels in the row selection circuit 5 and the signal voltage output circuit 7.

Modification

The image display device described above can be used as an image display module having the appropriate number of pixels in, for example, a computer display, a television, a portable terminal such as a smartphone, car navigation, etc.

Figure 32:
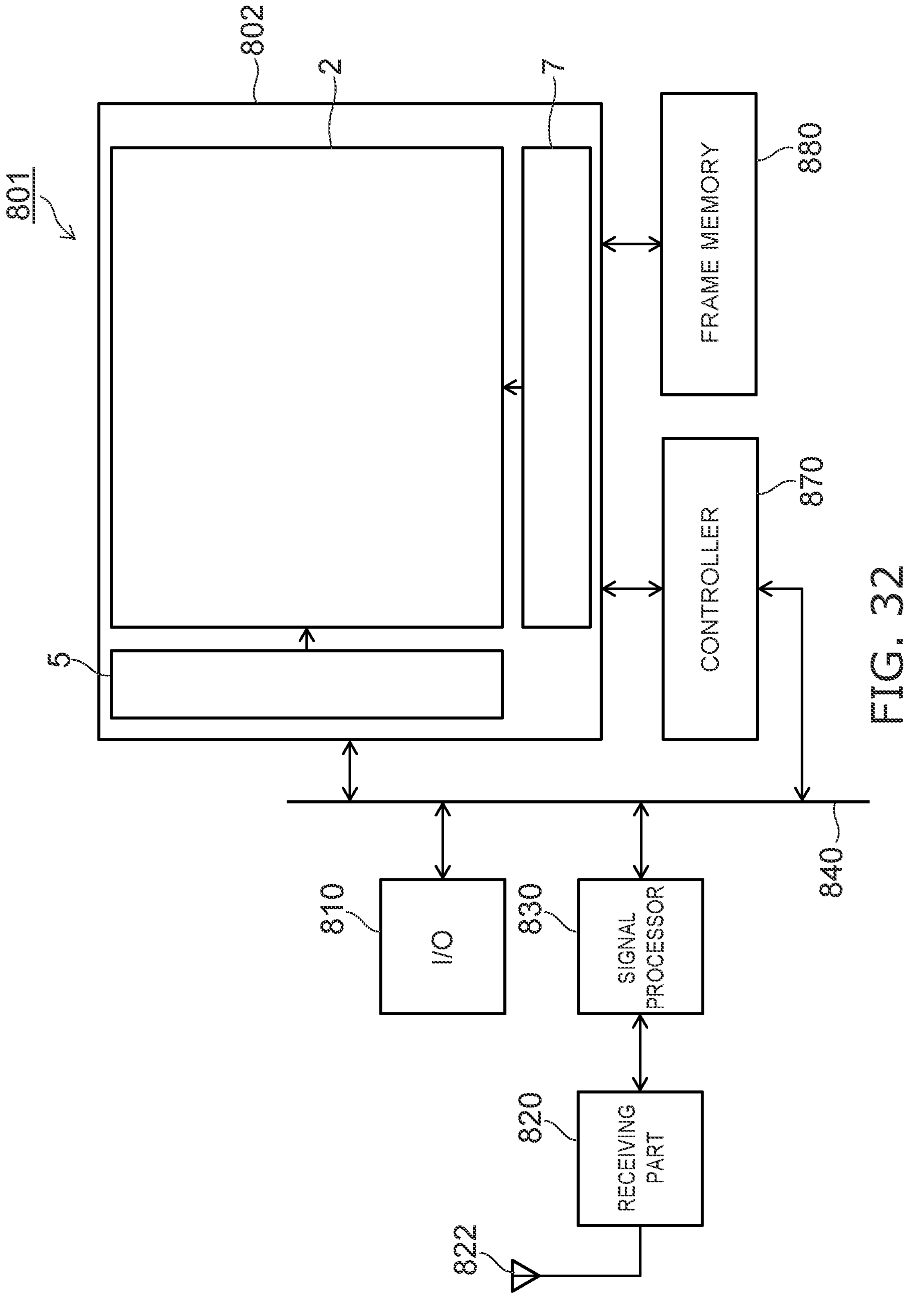
FIG. 32 is a block diagram illustrating an image display device according to a modification of the seventh embodiment.

FIG. 32 is a block diagram illustrating an image display device according to a modification of the embodiment.

FIG. 32 shows the configuration of a high-definition thin television.

As shown in FIG. 32, the image display device 801 includes an image display module 802. The image display module 802 is, for example, the image display device 1 that includes the configuration according to the first embodiment described above. The image display device 801 includes a controller 870 and a frame memory 880. The controller 870 controls the drive sequence of the subpixels of the display region 2 based on a control signal supplied by a bus 840. The frame memory 880 stores one frame of display data and is used for smooth processing such as video image reproduction, etc.

The image display device 801 includes an I/O circuit 810. The I/O circuit 810 is labeled as simply "I/O" in FIG. 32. The I/O circuit 810 provides interface circuitry for connecting with an external terminal, a device, etc. The I/O circuit 810 includes, for example, an audio interface, a USB interface that connects an external hard disk device, etc.

The image display device 801 includes a receiving part 820 and a signal processor 830. An antenna 822 is connected to the receiving part 820, and the necessary signal is separated and generated from the radio wave received by the antenna 822. The signal processor 830 includes a DSP (Digital Signal Processor), a CPU (Central Processing Unit), etc., and the signal that is separated and generated by the receiving part 820 is separated and generated into image data, voice data, etc., by the signal processor 830.

Other image display devices also can be made by using the receiving part 820 and the signal processor 830 as a high-frequency communication module for the transmission and reception of a mobile telephone, for WiFi, a GPS receiver, etc. For example, the image display device that includes an image display module having the appropriate screen size and resolution can be used as a personal digital assistant such as a smartphone, a car navigation system, etc.

The image display module according to the embodiment is not limited to the configuration of the image display device according to the first embodiment; modifications of the first embodiment and other embodiments may be used. The image display modules according to the embodiment and its modifications are configured to include many subpixels as shown in FIG. 3, FIG. 12, and FIG. 16.

According to the embodiments described above, a method for manufacturing an image display device and an image display device can be realized in which a transfer process of a light-emitting element is shortened, and the yield is increased.

Although several embodiments of the invention are described hereinabove, these embodiments have been presented by way of example only, and are not intended to limit the scope of the inventions. These novel embodiments may be embodied in a variety of other forms, and various omissions, substitutions, and changes may be made without departing from the spirit of the inventions. Such embodiments and their modifications are within the scope and spirit of the inventions, and are within the scope of the inventions described in the claims and their equivalents. Also, the embodiments described above can be implemented in combination with each other.

What is claimed is:

1. A method for manufacturing an image display device, the method comprising:

forming, on a substrate, a layer comprising a first part made of a single-crystal metal;

forming a semiconductor layer on the first part, the semiconductor layer comprising a light-emitting layer;

forming a light-emitting element by patterning the semiconductor layer, the light-emitting element comprising:

a light-emitting surface on the first part, and an upper surface at a side opposite to the light-emitting surface;

forming a first insulating film that covers the substrate, the layer that comprises the first part, and the light-emitting element;

forming a circuit element on the first insulating film;

forming a light-shielding member between the circuit element and the light-emitting element;

forming a second insulating film covering the first insulating film and the circuit element;

forming a first via extending through the first and second insulating films;

forming a second via extending through the first and second insulating films;

forming a wiring layer on the second insulating film;

removing the substrate; and removing at least a portion of the first part on the light-emitting surface, which comprises forming a second connection part by removing a portion of the first part, the second connection part being connected to a surface that includes the light-emitting surface, wherein:

the first via is located between the wiring layer and the upper surface and electrically connecting the wiring layer and the upper surface, and the second via is located between the wiring layer and the second connection part and electrically connects the wiring layer and the second connection part.

2. The method according to claim 1, wherein:

the forming of the layer including the first part includes:

forming a metal layer on the substrate; and forming the first part by performing annealing treatment of the metal layer, an outer perimeter of the light-emitting element is located within an outer perimeter of the first part when viewed in plan.

3. The method according to claim 2, wherein:

the forming of the layer that includes the first part comprises, before the annealing treatment of the metal layer, patterning the metal layer.

4. The method according to claim 1, wherein:

the forming of the light-shielding member comprises forming a light-shielding electrode on the upper surface, and the first via is electrically connected to the upper surface via the light-shielding electrode.

5. The method according to claim 1, wherein:

the forming of the light-shielding member comprises forming a light-shielding layer on the first insulating film before the forming of the circuit element.

6. The method according to claim 1, further comprising:

forming a second via extending through the first and second insulating films, wherein:

the light-emitting element comprises a first connection part located along the light-emitting surface, the second via is located between the wiring layer and the first connection part and electrically connects the wiring layer and the first connection part.

7. The method according to claim 1, further comprising:

after removing the at least a portion of the first part on the light-emitting surface, roughening the exposed light-emitting surface.

8. The method according to claim 1, wherein:

the semiconductor layer comprises a gallium nitride compound semiconductor.

9. The method according to claim 1, further comprising:

after the removing of the substrate, forming a wavelength conversion member on the light-emitting surface.

* * * * *